(12) United States Patent
Baretz

(10) Patent No.: US 11,569,427 B1
(45) Date of Patent: *Jan. 31, 2023

(54) ACHROMATIC DEVICES WITH THERMAL RADIATION SOURCES

(71) Applicant: Bruce H. Baretz, Montclair, NJ (US)

(72) Inventor: Bruce H. Baretz, Montclair, NJ (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/947,319

(22) Filed: Sep. 19, 2022

Related U.S. Application Data

(60) Continuation-in-part of application No. 16/974,362, filed on Dec. 19, 2020, now Pat. No. 11,495,719, and a division of application No. 16/699,788, filed on Dec. 2, 2019, now Pat. No. 10,950,773.

(51) Int. Cl.
| | |
|---|---|
| H01L 33/64 | (2010.01) |
| H01L 33/32 | (2010.01) |
| C09K 11/08 | (2006.01) |
| C09K 11/77 | (2006.01) |
| H01L 33/50 | (2010.01) |

(52) U.S. Cl.
CPC ........ *H01L 33/648* (2013.01); *C09K 11/0883* (2013.01); *C09K 11/7774* (2013.01); *H01L 33/32* (2013.01); *H01L 33/502* (2013.01)

(58) Field of Classification Search
None
See application file for complete search history.

(56) References Cited

U.S. PATENT DOCUMENTS

| | | | |
|---|---|---|---|
| 10,950,773 B1* | 3/2021 | Baretz | C09K 11/0883 |
| 2004/0016938 A1 | 1/2004 | Baretz et al. | |
| 2005/0230691 A1* | 10/2005 | Amiotti | H01L 33/44 |
| | | | 257/E33.059 |
| 2006/0049416 A1 | 3/2006 | Baretz et al. | |
| 2008/0224597 A1 | 9/2008 | Baretz et al. | |
| 2008/0224598 A1 | 9/2008 | Baretz et al. | |
| 2012/0314402 A1 | 12/2012 | Baretz et al. | |
| 2013/0120968 A1 | 5/2013 | Baretz et al. | |
| 2013/0207132 A1 | 8/2013 | Baretz et al. | |
| 2014/0159582 A1 | 6/2014 | Santhanam et al. | |
| 2015/0014711 A1* | 1/2015 | Bergenek | H01L 33/56 |
| | | | 257/88 |
| 2015/0270449 A1* | 9/2015 | Park | H01L 33/504 |
| | | | 257/98 |

(Continued)

*Primary Examiner* — Alexander G Ghyka

(57) ABSTRACT

A light emitting assembly comprising at least one of each of a solid state device and a thermal radiation source, couplable with a power supply constructed and arranged to power the solid state device and the thermal radiation source, to emit from the solid state device a first, relatively shorter wavelength radiation, and to emit from the thermal radiation source non-visible infrared radiation, and a down-converting luminophoric medium arranged in receiving relationship to said first, relatively shorter wavelength radiation, and the infrared radiation, and which in exposure to said first, relatively shorter wavelength radiation, and infrared radiation, is excited to responsively emit second, relatively longer wavelength radiation. In a specific embodiment, monochromatic blue light output from a light-emitting diode is down-converted to white light by packaging the diode and the thermal radiation device with fluorescent or phosphorescent organic and/or inorganic fluorescers and phosphors in an enclosure.

20 Claims, 11 Drawing Sheets

(56) References Cited

U.S. PATENT DOCUMENTS

| | | |
|---|---|---|
| 2015/0311401 A1 | 10/2015 | Santhanam et al. |
| 2016/0268543 A1* | 9/2016 | Ni .......................... B05D 3/06 |
| 2017/0080251 A1* | 3/2017 | Yehezkel ................ H04M 1/17 |
| 2017/0294551 A1 | 10/2017 | Santhanam et al. |
| 2019/0363224 A1 | 11/2019 | Baretz |
| 2020/0119234 A1 | 4/2020 | Baretz |
| 2021/0193883 A1 | 6/2021 | Baretz |
| 2021/0367114 A1 | 8/2021 | Baretz |
| 2022/0013702 A1* | 1/2022 | Baretz ................... H01L 33/648 |
| 2022/0029064 A1 | 1/2022 | Baretz |
| 2022/0085256 A1 | 3/2022 | Baretz |

* cited by examiner

Table 1. Spectral "Power" Radiometric Terms and Integrated Forms in "Power".

| Spectral Radiometric term | Units of Measurement | Radiometric Term after Integration | Units of Measurement |
|---|---|---|---|
| Spectral Radiance | $L_{e,\Omega,\nu}$ [W·sr$^{-1}$·m$^{-2}$·Hz$^{-1}$] | Radiance | $L_{e,w}$ [W·m$^{-2}$sr$^{-1}$] |
| Spectral Intensity | $I_{e,\Omega,\nu}$ [W·sr$^{-1}$Hz$^{-1}$] | Radiant Intensity | $I_{e,\Omega}$ [W·sr$^{-1}$] |
| Spectral Exitance | $M_{e,\nu}$ [W·m$^{-2}$Hz$^{-1}$] | Exitance (Emittance) | $M_e$ [W·m$^{-2}$] |
| Spectral Flux | $f_{e,\nu}$ [W·Hz$^{-1}$] | Radiant Flux | $f_e$ [Watts] |

FIG. 3

Table 2. "Energy" Radiometric Terms.

| Radiometric term | Units of Measurement |
|---|---|
| Energy | $Q_e$ [Joules] |
| Energy Density | $W_e = \mu_e$ [Joules m$^{-3}$]. |

FIG. 4

Table 3. Planck's Law in Terms of Frequency and Angular Frequency. Common Forms.

| Radiometric term | Units of Measurement | Planck's Law $f(\nu)$ | Planck's Law $f(\omega)$ |
|---|---|---|---|
| Spectral Radiance | $L_{e,\Omega,\nu}$ [W·sr$^{-1}$·m$^{-2}$·Hz$^{-1}$] | $\dfrac{2h\nu^3}{c^2}\left[\dfrac{1}{e^{h\nu/kT}-1}\right]$ | $\dfrac{2\hbar\omega^3}{(2\pi)^3 c^2}\left[\dfrac{1}{e^{\hbar\omega/kT}-1}\right]$ |
| Spectral Intensity | $I_{e,\Omega,\nu}$ [W·sr$^{-1}$Hz$^{-1}$] | Not derived | Not derived |
| Spectral Existance | $M_{e,\nu}$ [W·m$^{-2}$Hz$^{-1}$] | $\dfrac{2\pi h\nu^3}{c^2}\left[\dfrac{1}{e^{h\nu/kT}-1}\right]$ | $\dfrac{\hbar\omega^3}{(2\pi)^2 c^2}\left[\dfrac{1}{e^{\hbar\omega/kT}-1}\right]$ |
| Spectral Flux | $f_{e,\nu}$ [W·Hz$^{-1}$] | Not derived | Not derived |
| Energy Density | $w_e = \mu_e$ [Joules m$^{-3}$] | $\dfrac{8\pi h\nu^3}{c^3}\left[\dfrac{1}{e^{h\nu/kT}-1}\right]$ | $\dfrac{\hbar\omega^3}{(\pi^2)c^2}\left[\dfrac{1}{e^{\hbar\omega/kT}-1}\right]$ |

FIG. 5

Table 4. Entropy Flow analogous terms to Radiometric Energy (Flow) Terms.

| Radiometric term | Unit of Measurement | Entropy Flow Term | Units of Measurement |
|---|---|---|---|
| Spectral Radiance | $L_{e,\Omega,\nu}$ [J·sr$^{-1}$·m$^{-2}$] | Entropy Analogue ($L_S, \Omega, \nu$) | [J·K$^{-1}$SR$^{-1}$·m$^{-2}$] |
| Radiance | $L_{e,w}$ [W·m$^{-2}$sr$^{-1}$] | Entropy Analogue ($L_S, \Omega$) | [W·K$^{-1}$SR$^{-1}$·m$^{-2}$] |
| Existance | $M_e$ [W·m$^{-2}$] | Entropy Analogs ($M_S$) | [W·K$^{-1}$m$^{-2}$] |
| Radiant Flux | $f_e$ [Watts] or ($\dot{E}$) | Entropy Analogue ($\dot{S}$) | [W·K$^{-1}$] |

FIG. 6

Table 5. Vibrational energies of YAG Crystals.

| Vibration | IR Type | $cm^{-1}$ | μ | meV | Kcal/mol |
|---|---|---|---|---|---|
| -O-H vib. | Short-wave | 3,421 | 2.9 | 424 | 9.78 |
| COO- stretch | Long wave | 1,635 | 6.1 | 202 | 4.67 |
| COO- stretch | Long wave | 1,458 | 6.9 | 181 | 4.17 |
| NO3 | Long Wave | 1,385 | 7.2 | 172 | 3.96 |
| -O-H | Long wave | 1,083 | 9.2 | 134 | 3.09 |
| -O-H | Long wave | 1,046 | 9.6 | 130 | 2.99 |
| Al-O | VLWIR | 789 | 12.6 | 98 | 2.56 |
| Al-O | VLWIR | 692 | 14.5 | 86 | 1.98 |
| Y-O | VLWIR | 724 | 13.8 | 90 | 2.07 |
| Y-O | VLWIR | 478 | 20.9 | 59 | 1.37 |

FIG. 7

Table 6. Translational, rotational and vibrational entropies of gases for encapsulation in an enclosure.

| Gas | $S_{Total}$ | $S_t$ | $S_r$ | $S_v$ | $\sum S_0^{STP}$ |
|---|---|---|---|---|---|
| Hydrogen | 251 | 238 | 13 | 0 | 132 |
| Argon | 193 | 193 | 0 | 0 | 155 |
| Nitrogen | 193 | 152 | 41 | 0 | 192 |
| Carbon Dioxide | 274 | 216 | 55 | 3 | 214 |
| Carbon Monoxide | 280 | 280 | 47 | 0.0025 | 198 |

From: Kennedy I, Geering H, Rose M, Crossan A. A Simple Method to Estimate Entropy and Free Energy of Atmospheric Gases from Their Action. Entropy (Basel). 2019 May 1;21(5):454. doi: 10.3390/e21050454. PMID: 33267168; PMCID: PMC7514943.

FIG. 8

Table 7. Translational entropy of gases in atmosphere at sea level.

| Gas | $CF_3Cl>$ | $NH_3>$ | $CO>$ | $H_2>$ | $CO_2>$ | $Ar>$ | $O_2>$ | $N_2$ |
|---|---|---|---|---|---|---|---|---|
| $S_t$ | 353> | 322> | 279> | 238> | 215> | 193> | 165> | 152 |

From: Kennedy I, Geering H, Rose M, Crossan A. A Simple Method to Estimate Entropy and Free Energy of Atmospheric Gases from Their Action. Entropy (Basel). 2019 May 1;21(5):454. doi: 10.3390/e21050454. PMID: 33267168; PMCID: PMC7514943.

FIG. 9

Table 8. Comparison of Standard Molar Entropy and Thermal Diffusivity for Encapsulated Gases.

| Gas | S° (Standard molar entropy) J mol$^{-1}$ K$^{-1}$ | Molar heat capacity J mol$^{-1}$ K$^{-1}$ | Thermal Conductivity milliWatts per m per K | Thermal Diffusivity mm$^2$ per s (@ 300 K) | Thermal Effusivity W.$^2$√S/m$^2$ per K |
|---|---|---|---|---|---|
| Air | - - - | - - - | 25 | 19 | 6 |
| Carbon Monoxide | - - - | - - - | 23 | 18 | 6 |
| Helium | 126.2 | 12.5 | 151 | 164 | 12 |
| Hydrogen | 130.7 | 20.4 | 182-186 | 160 | 15 |
| Deuterium | 145.0 | 29.2 | 130-140 | 110 | 13 |
| Neon | 146.3 | 20.8 | 49 | 52 | 7 |
| Nitrogen | 153.3 | 20.6 | 26 | 20 | 6 |
| Argon | 154.8 | 12.5 | 18 | 20 | 4 |
| Oxygen | 161.1 | 21.9 | 27 | 23 | 5 |
| Krypton | 164.1 | 20.8 | 9 | 100 | 1 |
| Xenon | 169.7 | 20.8 | 7 | 6 | 2 |
| Ammonia | - - - | - - - | 24 | 15 | 6 |

FIG. 10

Table 9. Infrared Light Sources.

| Vibration | IR Type | $\mu_{max}$ | Kcal/mol | IR Diode |
|---|---|---|---|---|
| Not Specified | 10,204 cm$^{-1}$ | 0.98 | 29.17 | Everlight IR-333A |
| Not Specified | 7,142 cm$^{-1}$ | 1.40 | 20.14 | L10660-01 |
| -O-H vib. | Short-wave | 2.90 | 9.78 | LED30Su |
| COO- stretch | Long wave | 6.10 | 4.67 | OPLED70S |
| COO- stretch | Long wave | 6.90 | 4.17 | OPLED70S |
| NO$_3$ | Long wave | 7.20 | 3.96 | OPLED70S |

FIG. 11

ACHROMATIC DEVICES WITH THERMAL RADIATION SOURCES

CROSS REFERENCE TO RELATED APPLICATIONS

This application is a continuation in part of U.S. Nonprovisional application Ser. No. 16/974,362, filed on 19 Dec. 2020 Dec. 19, 3030), itself a divisional of U.S. Nonprovisional application Ser. No. 16/699,788, filed 2 Dec. 2019 (Dec. 2, 2019), issued as U.S. Pat. No. 10,950,773 on 16 Mar. 2021 (Mar. 16, 2021), which is incorporated herein in its entirety.

TECHNICAL FIELD

This invention relates to solid state light emitting devices coupled with thermal emitters and more particularly to such devices which produce white light with greater brightness than absent the thermal emitter, despite energy lost due to the Stokes shift.

BACKGROUND OF THE INVENTION

Devices based on converting radiation energy into electrical or chemical energy suffer when the spectrum of the incident radiation does not overlap the spectral absorptivity of the absorbing species. When there is perfect overlap, all incident radiation can theoretically be absorbed and can be used: this is called the resonance effect. As an example of resonance, consider in electron spin resonance (ESR), an unpaired electron can move between the two energy levels by either absorbing or emitting a photon of energy hv, such that the resonance condition, $h\nu=\Delta E$, is obeyed. When there is perfect resonance between the applied magnetic field and the incident radiation, a strong signal is obtained reflecting a strong transition. It is generally believed that the impact of radiation on matter can only be accompanied with absorption of the radiation by matter necessitating the annihilation of the initial, radiation itself.

When there is less than perfect spectral "electronic" overlap, frequently heat is generated, the temperature rises, and passive or active cooling may be required. Recent attempts at improving photovoltaic panels, and taking advantage of the resonance effect, use vertically stacked cells, such that each layer—using different materials in each layer—is designed to capture cumulatively and sequentially all the wavelengths of solar radiation incident on the panel. In the absence of resonance, solar radiation has been used for years for rooftop heating of water, ultimately for inside use. Perhaps except for purposeful heating, such as for indoor water consumption. it is generally the case that the production of heat is unwanted in most photo-devices. Generally, heat is unwanted; useful work is wanted. This is a thermodynamic view of thermal processes.

For the use of light-emitting diodes, the input is electrical, and the output is radiation: it operates in a manner opposite that of a photovoltaic device. Core to the instant invention is to manage and manipulate the entropy of radiation and its proclivity for not conserving photon numbers, normally considered only applicable to emission of thermal radiation, but even with luminescent emission, it is observed. Parenthetically, all matter generates and emits electromagnetic waves (i.e., radiation, or light) based on the temperature of the matter, regardless of whether the same matter can luminesce.

For light-emitting diodes, the efficiency of converting electrical energy into photonic energy can be accomplished—depending on the materials used and their bandgaps—by either impacting 1) the average energy of each electro-magnetic wave (the exiting photonic energy) and, or 2) the number of modes of each wave. Using the terminology of particles, by impacting 1) the average energy of all photons and, or 2) the number of photons.

Chemical Potential is a term that is derived from thermodynamics Chemical Potential is the free energy added to a system with the addition of each particle, for example, Gibbs free energy per number. A concise introduction to thermodynamics is beyond the scope of this disclosure but one summarized by others is provided as a short introduction:

"The first law of thermodynamics states that energy can neither be created nor destroyed—it can only change in form. However, the second law is the most discussed. Although difficult to define uniquely, it generally relates to the spontaneity of processes in systems not at equilibrium. In 1865, Rudolph Clausius first formulated this law in relation to the flow of heat, which cannot occur spontaneously from a cold body to a hot body. Since, it has been reformulated in terms of entropy, which is accepted as increasing in the universe over time. Entropy producing processes are spontaneous, but the rate at which they occur is not specified. The third law states that the entropy of a system will approach a minimum value as that system approaches absolute zero temperature. From the scientific point of view, the universe solely comprises matter and energy, two items declared to be interchangeable by Einstein. All systems are thus complexes of energy and matter, whose delineation depends on an observer, with arbitrary boundaries open to transfers of energy and matter.

Natural systems are characterized by nested scales of action, with that of smaller systems existing inside a hierarchy of larger systems, the properties of each scale contributing to the function of larger systems. A closed system is defined as one with no matter transfer across its boundaries, and an isolated system with no transfer of either energy or matter. However, both these definitions can only be considered as approximations. In fact, all ecosystems are open, the earthly systems essentially comprising living systems of the biosphere, acting in concert with the three abiotic systems, the lithosphere, the hydrosphere, and the atmosphere (representing solids, liquids, and gases) comprising overall the ecosphere." (Rose, Crosssan, & Kennedy, 2008) It is emphasized that depending upon the definition one uses, and there really are only three that appear valid, entropy is applicable for spontaneous processes and those that are not at thermodynamic equilibrium, although all require thermal equilibrium at some point. Consider, for example, those that are referred to as irreversible processes.

The three laws (which may be axioms from which other thermodynamic concepts follow) underlying the original theory of thermodynamics for mechanical systems can be expressed:

Zeroth Law of Thermodynamics. If two thermodynamic systems are in thermal equilibrium with a third, they are in thermal equilibrium with each other.

First Law of Thermodynamics. If a system experiences an adiabatic process, the work done on the system depends only on its initial and final states.

Second Law of Thermodynamics. It is impossible by any means to transfer energy from a heat reservoir to a mechanical system, subject to the condition that every other system involved is to be left ultimately in its initial state. In the alternative, An alternative definition a statement of the Second Law of Thermodynamics, implies that mechanical "engines can only run in an environment that has not yet reached its maximum entropy". [The Edge of Thermodynamics: Driven Steady States in Physics and Biology, thesis of Robert Alvin Marsland III, 2017.]

The heat sink is taken to be the external surroundings, the environment in which the system under study is being examined. There is the usual assumption that the heat sink is so large compared to the system under study that for non-adiabatic processes, the energy that flows into and out of the heat sink, in the form of heat, is so minor compared to the energy content of the heat sink that there is no temperature change in the heat sink itself. From this concept of temperature, entropy is obtained by integration (as shown in later paragraphs). An alternative formulation of thermodynamics, however, imagines that for an adiabatic change of state of a system A, the energy change of the heat sink is a measure of the entropy difference between the initial and final states of A. [R. Giles, "Mathematical Foundation of Thermodynamics", Pergamon Press, New York, 1964. page 16.]. The latter formulation defines entropy as something real and which can be analysed independent of temperature. The subtle message is that thermodynamic properties are dependent on how a human observer sets up and evaluates properties which define a state of the system under study and the external surroundings influencing or being influenced by the state itself. The state of a physical system is one that can be completely defined by the properties that can be measured by a physical observer and typically includes among others the parameters of volume, pressure, internal energy, and entropy. In this sense, it is the thermodynamic state that is important and can be determined and not the system itself. For two systems prepared in the same manner, there is no difference in the parameters, the state variables, that define the state. For two systems prepared in a different manner, there is a difference in the thermodynamic state unless the measurement of the state variables, the parameters, cannot be discerned as being different. It is generally believed that an electronic excited state prepared in different manners (for example, a phosphor excited by a photon or by a chemical reaction) lose their unique state variables by equilibrating to a common state of lowest vibrationally and rotational internal energy and that any subsequent thermodynamic activation free energies are not influenced by the differential means of excitation.

The thermodynamic Detailed Balance is used to increase photon numbers and thereby to increase the efficiency of light emitting diode lamps without the need for cooling. The system uses gas with reasonable thermal diffusivity or thermal effusivity to transfer heat produced at thermal sources and or sources of primary radiation to sources of secondary radiation. At the source of secondary radiation, gas is used to retain the heat at this source and to protect or enhance the source and its emission yields, respectively. A continuing radiation flux equates to an continuing heat bath.

The principle of Detailed Balance means that for a process at equilibrium and observed on a macroscopic level, the forward rate of each step (absorption of radiation) is equal to the reverse rate of that step (emission of radiation). Detailed Balance at the source of secondary radiation is the issue contended with here. A thermodynamic system at equilibrium, is one where it is not changing with time and the temperature, and concentration, are uniform throughout the system, unless otherwise perturbed and in which reaction to said perturbation, a new equilibrium is obtained. Thus, one can look at Detailed Balance from the perspective of kinetics to reach equilibriums. A fluctuation temporarily disturbs the system which returns back to some equilibrium state once over.

A system that is at a steady state is one in which one of the concentrations is not substantively changing and thus an approximation can be applied to the kinetics of the system. (Alberty, 2004) For the instant invention, thermodynamic equilibrium, local equilibrium associated from fluctuations from equilibrium, non-equilibrium thermodynamics, and also kinetics, are important to the instant invention. The instant invention is directed towards General Illumination.

Notwithstanding the above, the principal focus is on Detailed Balance from the perspective of entropy for a photophysical process that converts incident radiation (the primary radiation) to exiting radiation (the secondary radiation from the phosphor) such that the change in entropy for the process is minimal With each new photon added to a radiation field, there is an increase in entropy; with each exiting photon, there is a decrease in entropy from the radiation field. Implied by this consideration is that a Detailed Balance mismatch between incident radiation entropy and exiting radiation entropy signifies an inefficiency of a steady state photophysical process employed for General Illumination. This is usually expressed in the manner that the energy of the incident Primary Radiation which is absorbed is much greater than the energy of the exiting secondary radiation, which is emitted, the difference to which is transmitted to the surroundings in the form of entropy such that there is a total (system and surrounding) balance in entropy at equilibrium. For a steady state the overall entropic process leads to an increase in entropy for each General Illumination cycle, but the rate of entropy increase does not change over time. Quantum Yields are based on actinometry.

Modern implementations of General Illumination have been an important industry since before the Industrial Revolution offering great employment and essential innovation for over, at least, one century, inuring to the benefit of society who can enjoy the pursuit of work and leisure even when the sun is down. (Bright, 1949) The importance of this commercial pursuit is unlikely to change even with the now profitable migration towards achromatic, near-perpetual solid-state lighting (ANSL), near-perpetual in the sense of the devices long-term operational stability, in term of decades, as opposed to the built-in obsolescence of incandescent lamps.

More specifically and presently, prior to the instant invention, ANSL lamps constructed with light emitting diodes (LEDs) for General Illumination converts a portion of primary radiation, of a certain energy and entropy, emitted by the diodes, to secondary radiation, of a different energy and entropy, emitted by the phosphors, which, when combined with reflected (scattered) primary radiation, appears to the human observer as white light illuminance (as well as luminance) and allows for the process of vision (conversion of energy into useful and desired work). In the most typical implementation, prior to the instant invention and among several others, the primary radiation is observed by humans as blue and the secondary radiation, absent combination with the reflected (scattered) blue radiation, is observed as yellow. This wide-ranging process used for General Illumination is called Down-Conversion and it is used to prepare LED-based ANSL as well as, if so desired and suitably constructed, chromatic analogues. The instant invention calls the emission from the phosphor secondary emission or secondary radiation, which may be fluorescence.

This Down-Conversion approach puts a commercial premium on the availability of LED dies that appear, absent any radiation mixing process, blue. It is for this reason that the development of blue LED dies, otherwise of little technical nor societal value, enjoyed significant commercial success (because of its utility when perfected) and scientific notice (because of the long-term difficulty to, in fact, perfect). A similarly related lighting technology can be designed using LED dies higher in primary radiative energy than that which appears to the observer as blue (e.g., violet or ultra-violet). So momentous was the development of blue LED dies that a Nobel prize was awarded to the principal physicists who persevered and brought the material requirements they studied to a fully functioning device, The primary radiation that originates from LEDs is electro-initiated luminescence (i.e.; electroluminescence) meaning that an electrical current (ampere) of a suitable force (volts) is used to populate excited states of the corresponding energy (electron-volts or Joules); these states subsequently and spontaneously produce primary radiation (an electromagnetic field) of the same or different magnitude in energy (expressed in frequency, or wavelength, or wavenumbers) compared with the energy for initial population of the relevant electronic states. The secondary radiation so produced is photo-initiated luminescence (i.e., photoluminescence); the body that luminesces is called a luminophore and more often a phosphor (without regard to any changes in spin multiplicity of the transition).

Luminescent emission is spontaneous, and, under certain but limited conditions, stimulated emission predominates. Consequently, ANSL contains two forms of radiation mixed together (electro-luminescence and photoluminescence); further the combination is from one that is absorbed and one that is scattered. Note that absorbed radiation, if fully absorbed as in a blackbody, has an absorptivity of one (1) and scattered radiation, if fully scattered such as in a white body, has an absorptivity of zero (0).

Radiation's interaction with matter, wherever it may be and however it might be studied, is essentially one of absorption, scattering and transport. The Feynman model for refractive index, ingenuous that it is, but which shall not be further explain, is an example of radiation interaction with matter for the purpose of transport. The edge of the ANSL device is the environmental interface through which energy escapes to perform work elsewhere.

The photo-initiated process in Down-Conversion is called trivial energy transfer which also transfers through space, without the assistance of intervening matter, entropy; other means of energy transfer, such as Förster Resonance Energy, to effect subsequent luminescence, are available. It is noted that energy transfer generally and without further specification, and more importantly, entropy transfer, is essentially the instant invention's focus in pursuit of these arts: General Illumination.

To the knowledge of the inventor, the entropy of Förster Resonance has heretofore not been reported, however since a specific orientation is required, no doubt the process involves a decrease in entropy to obtain the orientation, requiring an increase in entropy somewhere else. One normally thinks of Förster Resonance Energy Transfer as being isoelectronic (of the same energy). Traditionally, Förster Resonance Energy Transfer has not been used as a quantitative alternative to trivial energy transfer, from the excited state of the primary emitter to populate the secondary emitter, as used in Down-Conversion, to make ANSL. (Itskos, Othonos, Choulis, & Illiopoulos, 2015)

Thermodynamics of engineering devices, such as heat engines, is an old discipline, that remains a powerful and incontrovertible science, from which the energy output and energy efficiency of engines cannot escape, even today. Subsequently, the study of thermodynamics to chemical processes further elucidated this science to reveal its universal applicability (as brilliantly discussed by William B Jensen in "George Downing Liveing and the Early History of Chemical Thermodynamics") beyond mechanical devices. (Jensen, 2013) While thermodynamics cannot explain all chemical and physical phenomena, which resulted in the perhaps reluctant development of quantum mechanics and its powerful elucidation when applied to chemical—quantum chemical (QC)—processes, it, thermodynamics, yielded initial evidence of conservation laws of nature that cannot be violated. This was and remains its very essence. Just as the expansion of thermodynamics into the chemical sciences was instrumental in expanding our understanding of its macroscopic relevance to efficiencies, conservation and probabilities, the same expansion of quantum mechanics to quantum chemistry played a fundamental role in our understanding microscopic and atomic (or molecular or solid-state) possibilities.

Photochemical processes, those initiated by radiation, regardless of the source and the radiation's characteristics, have been well studied over the last century with a particular focus on quantum mechanical selection rules and observed spectroscopy for electronic transitions between possible states as well as a plethora of kinetic examinations because these excited state processes occur in time spans relatively short compared to ground state endothermic reactions. Whereas the study of the thermodynamics of photochemical processes is not as often considered with the quantum mechanical discovery of transition selection rules, it is ironic that quantum mechanics itself evolved from the thermodynamic study of photonic radiation, that class called thermal radiation.

Whereas photosynthesis on the planet earth, fuelled by thermal radiation from the sun, has long been studied from a thermodynamic perspective, more recently the study of photovoltaic devices—solar cells—has reconsidered the limits of efficiency from a thermodynamic perspective even as its quantum chemical study remains an important component of device design and process understanding and manipulation. Of course, like photosynthesis, the incident radiation that initiates the photovoltaic process in solar cells is of thermal radiation, from the sun, although photovoltaic devices are obviously of commercial benefit even with radiation from unnatural sources. (Ye, et al., 2017)

Both with photosynthesis and photovoltaics and solar cells, the source of primary radiation is external to the device and the same source carries with it the curious benefits of maximal thermal radiation, and the entropy associated therewith, after which energy conversion or energy transfers, as well as entropy transfer, to matter, takes place. The entropy of thermal radiation has been studied for a long period of time, as shall hereinafter be reminded, and the efficiency of energy conversion and energy transfer from thermal radiation-initiated processes, no doubt, both are influenced by thermodynamic entropy.

Energy with entropy is linked herein and it is acknowledged that there is a mismatch in the energy emitted versus the energy absorbed at the source of secondary radiation, the phosphor. It has been assumed that this reduction in energy at the phosphor results in an increase in heat at the phosphor. However, General Illumination is a function not of energy, but radiometric power conveyed in the colloquially context of intensity. In the field of radiometric thermodynamics, however, one's principal focus is on energy density and entropy density as they are influenced by underlying intensities necessary to offer General Illumination at practical and practicable levels.

The current interest in the utilization of thermal radiation (Greffet, Bouchon, Brucoli, & Marquier, 2018) in engineered devices (Tsakmakidis, Boyd, Yablonovitch, & Zhang, 2016) emanates from the fact that the primary radiation is economically available: from the Sun. However thermal radiation is also associated with heat and is recognized as a source of energy inefficiencies, that may be initiated by and or spontaneously dissipated by radiation (as well as other means). Accompanying, thermal radiation has some peculiar properties different from other forms of radiation that maybe useful in the manipulation of as an incident beam and to maximize energy efficiency and to overcome the conventional theoretical limits heretofore observed for photovoltaic or other optoelectronic devices. (Soares, Ferro, Costa, & Monteiro, 2015) For example, as described elsewhere, "tuning the color of the blackbody radiation in nanoparticles by harvesting the low energy photons into the visible spectral region was found to be possible by adjusting the excitation power, paving the way to further developments of these nanoparticles for lighting and photovoltaic applications". (Soares, Ferro, Costa, & Monteiro, 2015) At this stage, unfortunately, this referenced device was operated between 12 K and ambient, not a viable implementation for commercial purposes. Notice the focus on power as the influencing step.

By way of another example, among the interesting applications is the use of nanoantennae to dramatically enhance the rate of spontaneous emission (or dramatic reduction in radiative lifetime) from organic luminescent dyes by several orders of magnitude. This is a rather herculean achievement, (Tsakmakidis, Boyd, Yablonovitch, & Zhang, 2016) in that there is no change in spin multiplicity causing this effect (i.e.; changes in a processes' spin multiplicity, a quantum mechanical process, are known to dramatically change radiative lifetimes).

Hereinbefore, luminescence has been defined in the context of generating secondary radiation (often fluorescence) after an electronic transition to a higher electronic state populated because of absorption of incident primary radiation. Thermal radiation, on the other hand, has been loosely defined as originating from the Sun or as a means of dissipating heat from a heat source, like the Sun.

Nevertheless, thermal radiation and luminescence are intricately linked although they only appear to be somewhat similar if not completely different phenomena, and both are observed concurrently in suitable systems. Following Greffet et. al.: (Greffet, Bouchon, Brucoli, & Marquier, 2018)

"We now turn to the modelling of electroluminescence and photoluminescence using the local form of Kirchhoff law. While the usual picture associated to these processes involves the radiative recombination of an electron-hole pair, it is important to recognize that thermal emission at the same frequency is also related to the same microscopic process. The difference between thermal radiation, on one hand, and electroluminescence and photoluminescence, on the other hand, stems from the process promoting electrons to the conduction band. After thermalization, the band states are occupied according to a Fermi-Dirac distribution both in the conduction and in the valence band. Yet, each band has its own chemical potential called quasi-Fermi level to account for the modification of carrier density. This is possible because the thermalization takes place in typically 1 ps whereas radiative electron-hole recombination takes place in typically 1 ns. These two quasi-Fermi level situations is the typical regime of electroluminescence for light-emitting diodes. Knowing the occupation of the conduction and valence bands, it is possible to compute the recombination processes and therefore to derive the emitted power. This procedure has been outlined in detail by Würfel [P. Würfel, The Chemical Potential of Radiation, J. Phys. C15, 3967 (1982)] for a homogeneous medium. He introduced a generalized form of Kirchhoff law to model electroluminescence by a slab of semiconductor." (Greffet, Bouchon, Brucoli, & Marquier, 2018)

This approach is also used when dealing with dye molecules where two bands can also be defined with fast internal relaxation processes and slower radiative recombination. This case is called the photo-molecular view; that with photoexcitation of semiconductors (as opposed to electro-excitation) is often called the photoelectric view.

Before moving on, it is important to share with further elaboration the specifics alluded to in the insightful treatment of Greffet et. al. herein called Greffet's rule. Therein it reminds that the two terms of emission are luminescence and thermal radiation but that these two processes of emission, for particular frequency, come from the same populated final electronic excited states just prior to the emissions themselves. The only difference in these emissions emanate from how the final electronic excited states came about to be populated in the first place: as at ambient and or without incident radiation, only an inexplicably minor amount of matter will find itself in the final electronic excited states from which emission takes place. The difference is that luminescence is preceded by excitation from the ground state under the influence of electrical current of appropriate energy (electroluminescence) or a radiation flux of suitable energy (photoluminescence). The alternative route is through heat of appropriate temperature and the heat flux, in other words, energy density, associated therewith.

Since Down-Conversion in ANSL concerns itself principally from the process of photoluminescence yielding the secondary radiation emission, usually fluorescence, it is not necessary to further dwell on the electroluminescence that generates the primary radiation (which is subsequently incident upon matter or scattered by matter) and is the source of heat due to the inefficiencies inherent in electroluminescence. The instant invention is based in at least one part on the extraordinary concept that Greffet's rule applies not only to the GaN light-emitting diode in a LED lamp but also to the phosphor normally with a Stokes shift in Down-Conversion. That is to say, the difference between luminescence and thermal radiation of spectral peaks is associated with the route of "promoting electrons" either to the valence band (in a semiconductor device) or to the higher molecular orbital (in a molecular device), after which the resulting emission stems from the depopulation of the same electrons back to the ambient state from which it was initially populated. In other words, the route of population matters, and it seems (in a peculiar manner) to be recalled as the subsequent emission takes place, the entropy of the exiting radiation carries with it the information on the route of excitation. [The thermodynamic conditions at time equal zero (t=0) includes the thermodynamic measure of all t=0 parameters including that of the radiation not yet incident upon the matter. See thermodynamic entropy in E. T. Jaynes, "Gibbs vs. Boltzmann Entropies", American Journal of Physics, 33 (5), 391-398. 19651. This information may not be easily decipherable, but it is no doubt encoded within the final radiation itself as it crosses the boundary from the system to the surroundings. This may be a controversial conclusion for those that argue once a photon is absorbed its source cannot be discerned; nevertheless, entropy transfer to matter from radiation forms the cornerstone of quantum mechanics and the Detailed Balance.

Perhaps an incident source of excitation has some control over the routes of de-excitation such that not all sources of excitation are the same and how the excited states are generated does indeed matter. To some extent, this argumentation of the instant invention is reflective of the different effects of chiral radiation on achiral matter, so that the above discernment is not totally revolutionary and without precedence. On the other hand, the role of radiation with high entropy versus radiation with low entropy is rarely considered, even by experts, as having different fundamental outcomes, especially in the context of Down-Conversion for ANSL. Thermal radiation emission has fundamentally different properties than luminescence; more specifically, in the case of the former, the obvious indifference to the conservation of numbers whereas in the case of the latter, the almost strict adherence to the conservation of numbers, except for very special unique cases which still complies with the law of conservation of energy (e.g., singlet fission of pentacene).

For the instant invention, however, there may be a variety of ways to simultaneously populate the desired electronic excited states of a phosphor, that upon depopulation yield the desired emission frequencies and that these ways may be realized simultaneously, at least in a thermodynamic timeframe.

This thermodynamic understanding of photochemical processes, as discussed in the few preceding paragraphs, was noted, many years ago, by Ross whose words also bring important insight and at the time of its writings uniquely perceptive, warranting wide-spread examination and teachings, and are of paramount importance to the instant invention:

"There are two ways of viewing the excitations caused by the absorption of light: Excitations may be considered as producing an increase in the population of electrons in a set of states of fixed number, with a corresponding decrease in the population of electrons in another set of states of fixed number.

"Alternatively, the identical process may be viewed as an increase in the number of an excited state molecular species and a concomitant decrease in the number of a ground state molecular species. These two points of view may be called the photoelectric and the molecular photochemical views, respectively, and the distinction between the two becomes meaningful when one considers' the coupling between the light-absorbing molecules, and the larger system of which they are a part. If this system operates through electron migration, then the photoelectric view is the more natural, while if the result light-absorption is molecular rearrangement, then the molecular photochemical view may prevail.

"It is important to remember that the distinction is one of point of view only, as influenced by the fate of the excitation, and makes no difference in the thermodynamics of the light-absorption. The formalism for the photoelectric case has been extensively developed for use in semiconductor systems. In the presence of complete thermal equilibrium, the chemical potential of all the electrons is equal to the Fermi level, which usually lies midway in energy between the ground band and the excited state band. The electrons within the E band and within the G band each have a chemical potential which is similarly defined, and which is called a quasi-Fermi level. As electrons are transferred from G to E under the influence of light, the quasi-Fermi level of G drops below the equilibrium Fermi level, and the quasi-Fermi level of E increases correspondingly.

"The alternative point of view is to consider changes in the partial molar free energy of the light-absorbing molecules in their ground state and in their excited state. The action of light usually depletes the population of the ground state molecules only very slightly, altering the chemical activity of these species to a negligible extent; in this case the potential difference arising between the bands is due almost entirely to the greatly increased population of molecules in the excited state." (Ross R. T., 1967) Ross' statements were made in 1967, more than a decade before the incorporation of chemical potential into a generalized Planck's formula (Planck's equation) referenced hereinbefore due to Würfel.

The important comment above distinguishes the processes based on the process for promoting (exciting) electrons, and not the subsequent spontaneous depopulation: in the case of a photovoltaic device, depopulation by creating an electric field; in the molecular device, by creating a radiation (electromagnetic) field. Of course, at normal ambient temperatures, the population of those excited states by thermal promotion and emitting at the frequency of interest is minimal. This is even true for a perfect black body or for matter simulating same in a less than perfectly reflecting isothermal cavity. In Ross, the statistical mechanics view of entropy, describing the states of the light-absorbing matter emerges. (Ross R. T., 1967) See Penocchio, E., Rao, R., Esposito, M., "Nonequilibrium thermodynamics of light-induced reactions", The Journal of Chemical Physics vol. 155 issue 11 (2021) pp: 114101 for a more recent teaching on the thermodynamics of radiation induced processes whereby the radiation flux is incident upon an absorbing species (our phosphor) which is also in equilibrium with a thermal bath (a heat bath) of a specified unchanging temperature. If the incident radiation emanates from a lamp, the radiation is considered to approximate thermal radiation, especially so if the lamp is powered by incandescence. Nonequilibrium thermodynamics generally considers the rate at which properties of state change; in other words, fluxes, as opposed to forces, energy or power. The primary radiation of the lamp is presumed to have a broad distribution of wavelengths.

The process of Down-Conversion for General Illumination of ANSL essentially converts some primary radiation of a frequency range $\upsilon_1$ to a more useful frequency range $\upsilon_2$. As noted by Greffet, et. al., electro-luminescence (the opposite of photovoltaic or photoelectric) or photoluminescence, on one hand, and thermal radiation at the same frequency, on the other, is related to the very same microscopic process. Nevertheless, there is little discussion of the thermodynamics of traditional photoluminescence when the incident radiation is not thermal radiation; on Earth, when the incident radiation is not from the Sun. In the alternative, the study of photosynthesis on Earth, powered by the Sun, and photovoltaic solar cells, also powered by the Sun, have long benefited from, even if only intermittently, from thermodynamic considerations, which famously is reported to be rediscovered again and again.

Interestingly, with the post-Industrial Revolution's impact in global warming, reaching an extremum not hereinbefore anticipated, climatic studies of the Earth are also beneficiaries of thermodynamic analyses, commented herein to show motivation for the instant invention.

Entropy, as a property of state (pressure, temperature, and volume) and irrespective of the path undertaken by a system of molecules to arrive at that condition, is therefore an important feature of atmospheric gases. Indeed, its capacity to explain how thermal radiation may be absorbed and partitioned into different degrees of freedom of motion may explain the warming potential of greenhouse gases. (Kennedy, Geering, Rose, & Crossan, 2019) Action, a physical property, is related to the vector and angular momentum, with similar dimensions of mass by velocity by inertial radius [mvr], but is a distinct scalar quantity independent of direction. Like entropy, it is an extensive or cumulative property, but with physical dimensions of the integral of energy with time, or of the instantaneous angular momentum with respect to angular motion; classically, Action is considered as the integral of momentum with distance. (Kennedy, Geering, Rose, & Crossan, 2019)

As a variable property of conservative systems, Action has been considered to take stationary values, a result sometimes referred to as the principle of least action, mentioned hereinbefore in this instant invention. (Kennedy, Geering, Rose, & Crossan, 2019) While the thermodynamic Action is an important consideration for the transport of entropy through a vapor medium, the definition of Action and the Principle of Least Action from which it derives is best defined by Rose et. al., other than the requirement to note that Action provides a unifying principle for Clausius' thermal and Boltzmann's statistical interpretations of entropy. (Rose, Crosssan, & Kennedy, 2008)

Standard molar entropy is an extensive property of matter (in this case gases), which means that the greater the quantity the greater the sum of the molar entropies. [Mass and volume are examples of extensive properties. An intensive property is a property of matter that depends only on the type of matter in a sample and not on the amount. Among the intensive properties are those mentioned hereinafter in this instant invention: chemical potential, specific heat, thermal conductivity. Other intensive properties are colour, temperature, and viscosity.]

That the source of the primary radiation in ANSL is within the device (not external as is the Sun, as in the case for solar-powered radiation devices) is not a limiting constraint on such lighting systems as the primary radiation may be positioned external to the device, if so desired. The phosphor in the Down-Conversion system absorbs incoming shortwave radiation from a p-n junction and converts it into other energy forms through various irreversible processes and then reradiates longwave radiation back into space. Under a steady state, the amount of energy emitted by the ANSL system in the form of longwave radiation (which includes heat distributed by convection or conduction in the ultimate form of thermal radiation) is balanced by the absorbed shortwave radiation energy. However, the emitted longwave radiation has much higher entropy than the absorbed shortwave counterpart because the radiation temperature of the former is lower (although not much) than that of the latter. Please note in this case that the temperature being referenced is not ambient but radiation temperature, which shall be more fully described hereinafter. Whereas energy, momentum and mass balance have a cohesive understanding of, and measurement thereof, entropy has a more amorphous fundamental property and there are many definitions thereof. This makes a cohesive understanding of entropy flux impact on the Earth system in climate studies and Down-Conversion in General Illumination more difficult to discern.

The interest therefore on thermal radiation is to use it, regardless of how it is initially presented and or concurrently generated, to increase the amount of radiation that is emitted within the desired frequency range, by simultaneously populating—by incident luminescent (primary) radiation and incident thermal radiation or incident heat—the required states that leads to the two-state situation. If one defines the Quantum Yield of secondary radiation (the achromatic radiation) as that which is emitted, in photon numbers, versus that primary radiation (from the source of primary radiation only) which is absorbed, in photon numbers, then the Quantum Yield of Down-Converted secondary radiation of the desired frequencies, can exceed a conventional theoretical limit of 100% as a consequence of the contribution of the incident thermal radiation or incident heat. More important that the Quantum Yield exceeding the theoretical limit of 100% is that the operating system approach a thermodynamically limit of 100%.

For those devices where the Quantum Yield is less than 100% efficient, the simultaneous population of the required states by 1) primary radiation and 2) thermal radiation or heat may increase the efficiency while still adhering to the conservation laws of thermodynamics (first and second laws). The essential challenge of radiation induced processes is how much work can be obtained after the absorption of light.

This is fundamentally different than an analysis of Quantum Yields which are frequently measured under idealized conditions and are presumed to be independent of radiation intensity. In the alternative, a thermodynamic treatment and a consideration of Gibbs free energy incorporates radiation intensity, even if indirectly it is incorporated into the temperature of the incident radiation. There is no fundamental reason why photo-conversion processes should not be covered by the thermodynamic laws of nature and these laws reflect in the macroscopic the overall efficiencies and its exchange with its environment, even if each microscopic examination, including consideration of rates and quantum mechanical rules for allowed and forbidden processes, appear to be well defined.

As implied hereinbefore, the measured efficiency of General Illumination devices normally concentrates on energy or energy-related specifications such as energy flux, energy density or power, as well as radiometric or chromatic analogues thereof, which shall be more fully defined hereinafter. Contrastingly, the importance of entropy of radiation in photolytic processes, (such as that which powers Down-Conversion), or entropy transfer, is not often considered and has not previously inspired prior inventions, before the instant invention, for the benefit of ANSL for General Illumination.

Entropy radiation (or the entropy of radiation) is the amount of entropy which passes in unit time through a unit area in a definite direction and every ray (pencil) passing through a medium, in a point, has its own monochromatic temperature. Therefore, except for a system in equilibrium between matter and the radiation field, at any point in a medium there is an infinite number of temperatures, independent of the temperature of the medium itself. On the other hand, for the equilibrium case, there is only one temperature which is common to the medium and all the rays of different frequencies that cross it in every direction. (Agudelo & Cortes, 2010) The notion of radiation temperature, except at equilibrium, is one fraught with discord, as the distinguished Mr. Mauzerall highlighted in the context of photosynthesis. (Mauzerall D., 2013) However, there is no doubt that radiation, an electromagnetic wave, carries both energy and entropy, regardless of whether a temperature can be attendant therewith. {The association of radiation temperature from which radiation entropy stems, emanates from the well-known thermodynamic differential change in entropy to change in energy, the so-called thermodynamic temperature.}

Notwithstanding the above, one can see the appeal of considering entropy of radiation when considering photo-conversion on Earth, initiated by thermal radiation from the sun and the temperature at which the process details takes place on the Earth (or the interface of Earth's radiation entropy fluxes at the top of the atmosphere) as two temperatures can be identified: that of the blackbody-simulating Sun and that in which the photo-process takes place. One recalls that the maximum work which can be obtained from an engine (an energy converter) operating between two temperatures and the maximum efficiency of the idealized Carnot Cycle associated therewith, is:

$$W = \oint (dQ-dU) = \oint (TdS-dU) = \oint TdS - \oint dU = \oint TdS - 0 = \oint TdS \quad (1)$$

$$W = \oint TdS = \{(T_h-T_c)(S_B-S_A)\} \quad (2)$$

$$\eta = \frac{W}{Q_H} = \frac{(Q_H - Q_C)}{Q_H} = 1 - T_c/T_h \quad (3)$$

with $\eta$ being efficiency, W=work performed, $T_h$ being the hot temperature, $T_c$ being the cold temperature, and $S_A$ and $S_B$ being the entropy at point A and point B in a Carnot Cycle, respectively.

In the summarizing words and interesting perspective of Lavergne, in this regard, who reflects on photosynthesis as a Carnot Cycle. (Lavergne, 2006) {That a similarly distinguished scholar Parson has argued, Mauzerall notes, that photosynthesis cannot be modelled as a Carnot Cycle has no bearing on the instant invention: our introduction of the Carnot Cycle is simply to note that there are many ways to evaluate, define or model entropy and not all yield the same results, not surprising considering the diversity of applications that the Second Law of Thermodynamics is used to evaluate. Further, the desire to use a Carnot cycle begs the question as to what temperatures are proper to use for a photo-conversion process.} (Mauzerall D., 2013)

Lavergne, using a photoelectrochemical cell analogy with solar radiation (thermal radiation) being the primary radiation-initiating the process, noted that while the temperature of the blackbody Sun can be reasonably inferred, the effective temperature of the radiation which initiates the photo-process (upon arrival at Earth), while "Fictitious", is $T_R$ and the temperature at which the process operates is (T). In the case of chlorophyll a, LaVergne notes that the incident radiation based on absorption spectrum would have a required incident energy of 1.8 eV, whereas with an incident flux of 1 photon absorbed per chlorophyll a per second, the free energy available to perform work is only 1.36 eV, a 25% loss. As LaVergne comments, "This loss does not concern the internal energy, which is 1.80 eV in each excited pigment. It concerns the free energy, due to the negative contribution of the entropic term". Increasing the intensity ten-fold would only increase the available free energy by 60 mV. In this model, LaVergne notes that the radiation temperature is 1180 K (calculated using the statistical mechanics definition of entropy, from the ratio of excited states to ground states) which is that of a blackbody that would radiate the same density of 680 nm photons as found in sunlight on the Earth, clearly a fictitious number. (Mauzerall D., 2013) Further, the hot bath temperature, $T_h$, should not be meant the temperature of the Sun either. (Lavergne, 2006)

Using an attenuation factor, and the temperature of the Sun, LaVergne obtains a free energy for the same system now at 1.44 eV. The important point is that the free energy available to perform work in a photochemical process is not the same as the energy of the excited state from which the photoreaction proceeds. See W. M Haddad in Thermodynamics: The Unique Universal Science (Entropy, 17 Nov. 2017] for interesting explanation of free energy available from low-entropy solar radiation incident on Earth.

One can see that in the solar-initiated thermodynamic treatment, the work available from absorption of radiation, is sensitive to the temperature of radiation used and that is strictly only calculable for a blackbody. This may be a serious restriction, or it may not be, in that, as explained hereinafter, unless a cavity radiator is perfectly reflecting, that cavity body tends to emulate a blackbody cavity radiator. (There is a graybody concept that is used to define less than perfect blackbody radiators, but it is not used herein in the description of the instant invention.) Another restriction to this line of reasoning may emanate from the thought that blackbody radiation temperature is of a consequence of an equilibrium (between thermal radiation and matter that is not perfectly reflecting) whereas photo-conversion is clearly an irreversible process, even if steady state from a kinetic perspective. On the other hand, thermal radiation modelling seems to be compatible with non-equilibrium thermodynamics Finally, some of Dr. Einstein's distinguished understandings of electromagnetic waves and photon particles—the thermodynamics of radiation—were conceived modelling perfectly reflecting cavities but using equations derived from perfectly absorbing cavities.

One can approximate radiation temperature if the primary incident radiation is mono-chromatic, but this is normally not the case in ANSL using Down-Conversion which is dependent on a rather broad primary emission from a blue LED. ANSL using Down-Conversion needs to deliver General Illumination at very high intensity for it to be useful as intended. Thus, the radiation temperature of the incident primary radiation will be considerably higher than ambient (the hot temperature).

The statistical mechanic definition of entropy is what aligns the chemistry molecular details, associated with the second law of thermodynamics, with that of the Carnot Cycle for mechanical heat engines. In other words, it is the link between macroscopic behaviour and microscopic (atomic and or molecular) processes. The link between ray optics (a macroscopic process) and wave optics (a microscopic process) will be noted.

The Kirchhoff statistical mechanics evaluation of molecular entropy is what associates the second law of thermodynamics for the interaction of light with matter. The essential element is that the population of excited state species to ground state species (any molecule with two states and separated in energy by hv) is dependent solely on radiation intensity and is the same for any species, regardless of molecular details, at a given radiation intensity.

Further and most interesting, the population associated with the incident radiation and a given intensity (a radiation temperature) is the same as the Boltzmann distribution associated with a thermal temperature. The fundamental relationship that makes this happen is, where G is the absorption coefficient of the absorbing species with two states $k_f$ is the rate of fluorescence from the excited state of the species that had absorbed the primary radiation while in its ground state: (Lavergne, 2006)

$$\frac{\sigma}{k_f} = 8\pi\left(\frac{v_0^2}{c}\right) \quad (4)$$

That is to say, the better the emitter (faster the fluorescent (luminescent or radiative) rate constant), the better the absorber (via cross-section) as their ratio is a constant at a given excitation and emission frequency. The requirement for this to be completely accurate is that there is no non-radiative decay that competes with the fluorescence (the emission in the form of any radiative process). This is an important point that will be exploited in the instant invention. If one looks at excitation and emission as two separate and distinct steps without any memory of the first when considering the second, the above equation would not be considered, by many, to be applicable.

Mauzerall's thermodynamic consideration of excited state processes includes the following: "A simple view of the situation is to say that once the photon is absorbed and the excited state formed, it has no memory whatsoever of the source of the photon: this is an irreversible process in complex molecules . . . . This also follows from the simple view of loss of memory on absorption." (Mauzerall D., 2013) This is the Mauzerall Principle: photolysis is an irreversible, not a thermodynamic, process. The instant invention is not dependent on whether the view of Mauzerall is correct or whether Detailed Balance is strictly adhered to in the claimed implementation, but the entropic content of paired particles may forever link these particles regardless of the distance they travel from each other. One may increase the efficiency of ANSL if the Detailed Balance is adhered to or whether the emission therefrom exceeds a balance of the absorption.

Now let us explain why the above equation of LaVergne $$\frac{\sigma}{k_f} = 8\pi\left(\frac{v_0^2}{c}\right) \quad (5)$$

is applicable to the source of secondary radiation regardless of the source of primary radiation or even if the excited state population is caused by heat. One radiation source can be thermal radiation produced by a blackbody: the other produced by an electroluminescent device (one can easily choose a photonic lamp) The rate of fluorescence can be measured, and this is the same regardless of how the population of excited states is obtained. The rate of fluorescence is entropic-independent. The absorption cross-section, whether it be of radiation from a lamp, radiation from luminescence or radiation of the thermal type, all leads to quantum jumps: either from one electronic state to another or through stepwise quantum jumps, each of a smaller magnitude correlating with vibrational energies. The absorption cross-section is a function of the permittivity of the material (which is the same regardless of how the incident frequency is generated) and the electric field of the incident radiation (also independent of how the frequency of radiation is generated).

As Lavergne (Lavergne, 2006) notes, the Boltzmann factor that defines the loss of free energy available to perform work with absorption of light of a suitable radiation temperature (or with complementary excitation from phonons of an appropriate temperature) is $$\frac{[P^*]}{[P]} = e^{-\left(\frac{hv}{k_B T_R}\right)} \quad (6)$$

and that $$RT\ln\frac{[P^*]}{[P]}$$

is the free energy loss or entropy gain associated with the excitation. At low radiation intensity (radiation temperature) the population of [P*] is small and the free energy loss is greatest. When the radiation intensity is high (high radiation temperature), the entropy of the transition is near zero and the free energy available to perform work is the greatest. This is completely a thermodynamic argumentation. However, when [P*] becomes very high, both thermodynamics and kinetics determine the fate of the underlying assumption that there is no non-radiative decay that competes with $k_f$.

As is well-known for thermal reactions, it is the free energy of the process (either Gibbs free energy or Helmholtz free energy) that defines whether an irreversible process can proceed spontaneously. One of the tell-tale signs of this is whether the reaction is endothermic or exothermic; whether heat must be provided to allow for the thermal conversion to take place; the heat being a representation of entropy.

There is no rationalization for excluding an evaluation of free energy to ascertain whether free energy and entropy impacts processes stimulated by the incidence of radiation, photo-conversion. Returning to Laverne for further guidance: (Lavergne, 2006)

"The essential point is that work/free energy is not just the sum of internal molecular energy, but requires collective, 'macroscopic' interactions—pressure is perhaps the most familiar example." (Lavergne, 2006)

If one considers a photo-conversion initiated from solar thermal radiation, which has the maximum entropy of any possible incident radiation, then the photo-conversion may appear to violate the second law of thermodynamics if the subsequent process, for example, fluorescence, does not have greater entropy than that which is incident in the first place (unless entropy is generated somewhere else in the system). Since it is not possible for fluorescence to have as high a radiation entropy as any incident solar radiation, as for any given spectrum thermal radiation has the highest possible spectral entropy, then therefore there must be some entropy generated elsewhere (in the unlikely case that the fluorescence spectrum is identical to that of thermal radiation, thein the process would be isentropic.) A solar powered laser then, if one is possible, would have to generate entropy somewhere else in the system and pass along same to the surroundings.

Notwithstanding the above, as far back as 1907, the entropy of a luminescent emission line of an atom was calculated (the Balmer series line for atomic hydrogen, normally symbolized as $H_1$—generated from molecular hydrogen $H_2$ in a discharge tube—at 486.136 nanometre), by the distinguished scientist Mr. Wien, after earlier discussions of entropy of radiation by others.

All radiation transports entropy in the same manner that it carries energy with the exception that radiation can be designed to approach zero entropy, whereas radiation, if it exists, must have some energy, even as its intensity approaches zero. Radiation transports information: if there is no information to be discerned (measured), there is no radiation.

Having introduced the concept of radiation entropy, with suitable construction of an ANSL, the entropy of the luminescence (the secondary radiation), in Down-Conversion, is greater than the entropy of the incident primary radiation (i.e., the electro-luminescence) as spontaneously emitted radiation is spread over all directions and thus the number of radiation modes increase. Scattered (primary) radiation also experiences an increase in entropy compared with the incident (primary) radiation but not as much an increase as that realized with luminescence. Consequently, by its very nature, Down-Conversion of radiation increases entropy of radiation. There is a difference in the thermodynamic evaluation of radiation and matter. The second law requires that the capacity of an isolated system for work must decline over time. Notwithstanding, both radiation and matter are embodied with entropy.

To be clear, the entropy of the excited state of matter, the body already in an electronic state ready to, and that will, luminesce, in fact decreases with spontaneous emission, whereas the entropy of the then produced radiation field increases. With depopulation of the number of excited states and increasing the number of ground states, the diversity of states of the luminophore decreases. Thus, the reason the entropy of the excited-state matter, once formed, decreases with the emission of a radiation field. In a stationary state (defined hereinafter), the absolute value of the entropy gain of the radiation field is seven to eight orders of magnitude greater than the absolute value of the entropy decrease of the excited-state matter. Therefore, it is difficult to optically cool matter even though the radiation field carries away significant entropy. In the application of optical cooling, the incident radiation is normally of the luminescence type, indeed that which is referenced to be stimulated emission (i.e., that of a laser) and the secondary emission is normally of the anti-Stokes type which will be hereinafter mentioned. (Ye, et al., 2017) In Down-Conversion for General Illumination using ANSL, the incident radiation is normally spontaneous emission, and the secondary emission is normally of the Stokes type, which shall hereinafter also be mentioned.

The additional entropy gains to the subsequently created radiation field due to luminescence is, in part, related to the direction of the emitted radiation which has famously been attributed to be governed solely by chance (whereas the direction of scattered radiation is, according to classical mechanics, a function of the direction of incident radiation).

The scattering used in Down-Conversion is of diffuse reflection, not specular reflection, to maximize illuminance at the expense of luminance at any one point of observation. By way of definition, diffuse reflection is the reflection of light from a surface such that a ray incident on the surface is scattered at many angles rather than at just one angle as in the case of specular reflection. Lambertian reflectance is desirable for General Illumination so that Lambert's cosine law (also called Lambert's emission law or cosine emission law) is operable and the luminance observed is as independent as possible of the viewing angle from the normal to the emitting surface, if not for the fact that the light-emitting diode (LED) die emission itself is highly directional. [In the end, ANSL based on Down-Conversion initiated by an electrical current passed through a LED, often use tertiary scattering contrivances to obscure the directional emission from the LED die, itself]

Spontaneous thermodynamic processes are those whereby the total entropy increases. Nevertheless, spontaneous chemical reactions, whereby the entropy for the reaction itself decreases, are well known, of course, but the decrease must be offset somewhere else with a greater entropy gain. As one interesting and relevant example, the entropy decrease in the formation of glucose in radiation-initiated photosynthesis is offset by a greater increase in thermal radiation entropy for radiation emitted by the leaf (after absorption of sunlight) and not used for glucose production. (Yourgrau & Merwe, 1968) [That the entropy of the reaction decreases is interesting at first blush in that one is converting a gas to a solid (carbon dioxide to glucose). In photosynthesis, the free energy generated in the electrons of the photosystems is conserved by the subsequent conversion of relatively high entropy substances such as carbon dioxide and water to lower entropy substances such as sugars and oils. (Rose, Crosssan, & Kennedy, 2008) The standard molar entropy of solids is generally lower than that of gases or vapor; in this specific case, as well, six (6) gas molecules are converted to one solid molecule; both the phase change and the molar change led to a reduction of entropy in the reaction.] This is a reminder that in a radiation-initiated spontaneous processes, the entropy of exiting radiation must be considered. In the case of photosynthesis, the process uses thermal radiation, from the sun, as opposed to luminescence from matter. Recall the comments of Wu & Liu as it relates to entropy balance in radiation from the Sun to Earth and back.

Notwithstanding the benefit of a spontaneous (also called irreversible) process in thermodynamic machines, a process that increases entropy is one in which inefficiencies are fundamentally introduced. When viewed from a universal perspective, there is always an increase in entropy accompanying a defined process not at equilibrium and hence there are always inefficiencies introduced by performing that process, most apparent when the process is performed repeatedly. This is the essence of mechanical thermodynamics. The more times a process is repeated, the more apparent are the inefficiencies even if each microscopic process, that defines in total an engineering solution, provides work near unit efficiency. This perspective cannot be too often repeated and emphasizes the inefficiencies created in the macroscopic world of engineering devices.

For a system at equilibrium, of course, despite the fluctuations from equilibrium that may occur, there is no change in entropy as the change is dependent solely on the entropy of the initial and final states, they are the same in an equilibrium. However, for a spontaneous irreversible process that is clearly not an equilibrium system, an increase in total entropy is inevitable. As an example, a non-equilibrium system which transfers heat or energy with its outer environment, the heat bath, the change in entropy ($D_{E_{nt}}$) with time t, $$\frac{D_{E_{nt}}}{\Delta t} \quad (7)$$

is a sum of the local increase in entropy within the system and the increase in entropy across the system boundary!

A non-equilibrium system at steady state can keep a low entropy by discarding high entropy fluxes across the system boundary, as noted even if entropy also flows into the non-equilibrium system, provided the exiting entropy flux is greater than the incident entropy flux. (Kleidon & Lorenz, 2004) In the case of photo-processes, the incident radiation can be from any type, including luminescence and thermal radiation, although the entropy content of each will no doubt be different.

The aforementioned Principle of Detailed Balance (Miller, Zhu, & Fan, 2017), when considering matter's interaction with a radiation field, is a current focus in the field of solar energy conversion, (Markvart, From steam engine to solar cells: can thermodynamics guide the development of future generations of photovoltaics?, 2016); (Markvart, Counting Sunrays: From Optics to the Thermodynamics of Light., 2010) from which the instant invention derives motivation but is distinct from:

"For example, a solar absorber absorbs light from the sun. The Detailed Balance then dictates that the solar absorber must therefore radiate back to the sun. Such a radiation back to the sun is an intrinsic loss mechanism." (Zhu & Fan, 2014)

The principle of Detailed Balance is a fundamental property of the interaction between matter and a radiation field: there is both absorption and emission of radiation and they are related: as previously shown, a good absorber is a good emitter. (Markvart, From steam engine to solar cells: can thermodynamics guide the development of future generations of photovoltaics?, 2016) Detailed Balance does not require absorption of thermal radiation; it is applicable to any source of primary radiation. {See Markvart in "The thermodynamics of optical etendue", J. Opt. A: Pure Appl. Opt. 10 (2008), wherein is derived that the chemical potential $\mu_{out}$ is composed of two components, one associated with the emitted light and one due to work being carried out by the medium. The formalism of Markvart allows an extension of the absorption/emission process to media where the elevated temperature of the photogenerated electron—hole pairs produces useful work.}

There are three historic representations of this Detailed Balance: expressions of Mr. Kirchoff, Dr. Planck and Dr. Einstein. These have been summarized with great clarity, but it is imperative to note, for the purposes of complete precision, that the rate referenced is per unit area and not the more usual per unit time:

"Paraphrased in terms of (the number of) photons rather than their (individual) energies, Kirchhoff surmised that the ratio of the rate at which photons are emitted by a unit area to the absorbing power "a" is equal to a universal function of only the temperature of the substance and the wavelength or frequency of emission", in other words, in terms of photon flux density. Dr. Planck, many decades later, "elaborated on Kirchhoff's ideas by noting that radiation can only be absorbed or generated in a volume element of a body rather than on the surface". (Markvart, From steam engine to solar cells: can thermodynamics guide the development of future generations of photovoltaics?, 2016)

More than a decade later, Dr. Einstein "extended the photon balance of Dr. Planck" and showed that Planck's Law required stimulated emission in addition to spontaneous emission in balance with absorption. This treatment of Dr. Einstein was initially attributed only to atoms but was subsequently extended to molecules by the distinguished Mr. Kennard and the eminent Mr. Stepanov, as shall hereinafter be commented.

The primary interest of the instant invention is the Detailed Balance as it applies to entropy. This approach has been the subject of many discussions for over one hundred years but to which no consensus exists. Employment of entropic Detailed Balance, to impact energy efficiencies in terms of photon numbers, is another main purpose of this instant invention and heretofore not realized as being applicable to General Illumination using ANSL although it has been debated in the context of incident radiation from the Sun, a source of thermal radiation.

The entropy generated with the production of the secondary radiation is the fundamental source of entropy gain in Down-Conversion as practiced in General Illumination using ANSL and, as earlier noted, this is offset with a decrease of the entropy of the excited-state of the phosphor itself, a decrease that would be greater not for the possible entropy gained from the almost ubiquitous Stokes shift (discussed in more detail later), if one is indeed present. (Stokes, 1852) This is true of all luminescence with a Stokes shift. [Indeed, the presence of Stokes shift was obliquely commented on by Dr. A. Einstein, in 1905, as an indication, for reasons that may be vague, of radiation displaying particle and or wave characteristics depending on the measurement technique chosen to categorize or otherwise, quantitate radiation. (Kuhn T. S., 1978)

For the instant invention, our interest is on the entropy of radiation although radiation displays both particle and wave characteristics (depending on the measurement by experiment). The important point for the purpose of the instant invention is that the Stokes shift at the source of secondary radiation, often has been invoked as a source of heat and consequently as a cause of inefficiency, in Down-Conversion, is in fact where the entropy of the matter, the luminophore, is decreased because of the transfer of entropy to the secondary radiation field to which it, the luminophore, emits. Parenthetically, if it is contrarily true that with ANSL using Down-Conversion a Stokes shift is a source of heat, then remotely positioning the luminophore, as is often promoted, will clearly not eliminate the heat from being generated at the source of secondary illumination.

To depict more fully, one must adopt the quantum mechanical view of matter in its excited state, descriptions that invoke those processes such as the Born-Oppenheimer Approximation, Franck-Condon transitions and Kasha's Rule. In the above description of entropy transport because of the Stokes shift, one focuses not on possible radiation-less decay from the lowest vibrational level of the electronic excited state to the ground electronic state. This radiationless decay occurs at a slower rate: considerably slower than the vibrational relaxation that defines the Stokes shift itself. Radiation-less decay from the lowest vibrational level of an excited electronic state, if it occurs, may be a significant source of inefficiency and it is characterized by a Quantum Yield of secondary luminescence being less than 100%. Of course, it is and has been clear that implementing Down-Conversion for General Illumination is best when the Quantum Yield of secondary luminescence is at least 100%, if not greater. Indeed, there is no fundamental law that precludes the Quantum Yield of luminescence from being greater than 100% (e.g., singlet fission); only that the conservation laws be followed.

On the other hand, if there is a fast rate of radiationless decay, $k_{nr}$, that is competitive with secondary luminescence (fluorescence; $k_f$) at the source of the secondary emission upon which primary radiation is incident upon, then the fundamental equation would not apply. In the alternative:

$$\frac{\sigma}{k_f + k_{nr}} \neq 8\pi\left(\frac{v_0^2}{c}\right) \tag{8}$$

if $k_{nr} \gg k_f$. (9):

Even for those secondary phosphors with no radiationless decay from the lowest vibrational level of the electronic excited states to the ground electronic state, i.e.; for those luminescent systems with a Quantum Yield of 100%, it is often stated in the scientific literature that the Stokes' shift is an inherent loss of energy, that heat is thus generated at the site of the secondary emitter, regardless how far away the principal radiation is generated, and that is what makes Down-Conversion less efficient than those achromatic LED lamps that need not employ the Stokes shift.

An often-stated quantum mechanical description of this radiationless decay is summarized in a recent review of thermal stable phosphors (Tian, 2014) and follows the model produced in the tome by the distinguished Arthur C. Cope Awardee and Wm. P. Schweitzer Professor of Chemistry at Columbia University in the City of New York, Nicholas J. Turro, Modern Molecular Photochemistry of Organic Molecules. (Turro, Ramamurthy, & Scaiano, 1965) Although the principal basis for the instant invention is thermodynamic consideration of entropy as hereinbefore briefed, also demonstrated is the adherence to the same Turro-paradigm that offers a quantum mechanical explanation for the instant invention.

The Quantum Yield of luminescence at ambient may be 100% but may not be so at higher temperatures as experienced and when in contact with or near a light-emitting diode die operating with the electrical input current used in an ANSL for General Illumination. Even if the Quantum Yield of luminescence from the source of the secondary radiation field is near but slightly less than 100%, under high incident radiation field flux, some inefficiencies remain competing with secondary emission. In contrast to the Stokes shift, the inefficiencies referred to in the preceding sentence occurs after the associated shift has taken place and the excited state from which emission is to take place is (said to be) at the lowest vibrational level of the electronic excited state.

To the knowledge of this inventor, regarding Down-Conversion in ANSL, while the difference in energy associated with the Stokes shift is often articulated as manifesting heat at the location of the secondary emitter, there is no time-resolved proof that this indeed does occur—the entropy associated therewith can be dissipated in other ways. This point is emphasized in the instant invention as there is considerable prior art on Down-Conversion that is universally based on the Stokes shift being a source of heat and consequently a secondary emitter is unavoidably a source of heat, at any intensity of incident radiation, even if the luminescence from the secondary emitter occurs with complete efficiency.

Entropy is conventionally described with the letter "S" which is herein adopted as well. The general consideration is (where "ex states" means excited states)

$$S_{incident(primary)} \pm S_{spectral\ shift} + S_{population\ ex\ states} - S_{depopulation\ ex\ states} - S_{secondary\ radiation} \pm S_{surroundings} \geq 0 \qquad (10):$$

If the transfer of entropy to the exiting luminescing radiation field is greater than the entropy generated by the Stokes shift, then the site of Down-Conversion (the phosphor) would have a net reduction in entropy, considering no other factors. Alternatively, if the transfer of entropy to the exiting luminescing radiation field is less than the entropy generated by the Stokes shift, then the site of Down-Conversion (the phosphor) would have a net increase in entropy, considering no other factors. Nevertheless, and notwithstanding the above, it is still unclear whether the entropy carried away by exiting radiation may be particularly useful for work for General Illumination when same is incident upon the visual pigments of a human observer unless there is some partial re-conversion, i.e., extracted from the radiation incident upon the visual pigments. (Zheng, 2014), (Ala-Laurila, 2003)

If the entropy received by the visual pigments of a human observer reflect all of the available information of the system(s) that created the radiation field, then embodying luminescence with the thermal radiation that describes the environment in which the radiation was created, is of substantive benefit to the receiver of said information, even if not in the form of illumination or luminance Human vision seems to be optimized for the peak maximum amount of entropy carried by the incident radiation as opposed to peak maximum amount of energy.

This is the fundamental conundrum of Down-Conversion and its most indispensable understanding: while there is no proof that the energy difference of the Stokes' shift in Down-Conversion is directly dissipated by heat through convection or molecular conduction, as opposed to thermal radiation or through luminescence, the net effect on efficiency might be the same. The entropy dissipated through radiation and consequently "radiative entropy is a measure of unavailable work that cannot be extracted" from radiation. "The goal is to improve the performance of energy conversion systems, namely, increasing the amount of useful work and reducing the unavailable work." (Zheng, 2014) On the other hand, the Stokes' shift is relatively small, especially compared with heat that may be the form in which entropy is dissipated as a consequence of radiation-less decay through internal conversion. Thus, the consequence of entropy generation via the Stokes' shift is unlikely to be a significant loss of efficiency, if any loss is indeed the case, and, as detailed herein, an increase can be obtained through an increase in photon numbers.

It is this entropy transfer which generally restricts the spectral quantum selection rules for radiative electronic transitions, so well explained by quantum mechanics applied to chemical matter, and as a parallel to what was long ago called the Einstein's law of photochemical equivalence (Allmand, 1926) (Einstein, On the Quantum Theory of Radiation, 1917) (Murkerji & Dhar, 1930) (Einstein, Thermodynamische Begründung des photochemischen Äquivalentgesetzes., 1912) There are many exceptions to this equivalence law so that it is not a universal law of nature, despite its often-debated adherence in the debate of the conception of Down-Conversion.

Luminescent states are defined to be those which subsequently and spontaneously produce radiation (an electromagnetic field) of the same or different magnitude in energy (frequency, or wavelength, or wavenumbers). Luminescent states can emit at an energy higher than that of the primary incident radiation: this is called an anti-Stokes shift. (Pandozzi, et al., 2005) Luminescence with an anti-Stokes shift requires the increase of radiation entropy to more than offset the decrease in entropy associated with the luminescing matter (due to depopulation of excited states) as well as the decrease in entropy associated with the heat bath at temperature T that otherwise provides the additional energy of the anti-Stokes shift. Entropy when multiplied by the temperature is in units of energy.

While hereinbefore luminescence has been discussed in a general manner, and the effect of entropy on same—not ignoring, of course, the importance of energy nor momentum—Down-Conversion to generate achromatic light has an additional consideration to be dealt with. Focusing on entropy of radiation that reduces efficiency, achromatic Down-Conversion (the combination of scattered primary radiation with secondary radiation) experiences an otherwise deleterious entropy of mixing, even if the two sources are monochromatic (provided they are not interfering). (Laue, 1906) (Zheng, 2014) That being the case, the entropic contribution to the process is spontaneous (regardless of the enthalpy of the radiation from the two sources) and the outgoing radiation entropy is greater than the sum of the radiation entropy that emanated from each of the two sources absent the mixing. This is one unavoidable origin of the inefficiencies of Down-Conversion associated with mixing of the light necessary to perform work: as an example, the mixing of thermal radiation from two blackbodies results in an increase in entropy of the combined radiation. (Khatri, Sunyaev, & Chluba, 2018) This is true whether the radiation fields are in equilibrium with their respective matter, or not. (Khatri, Sunyaev, & Chluba, 2018)

Prior to the disclosure filed on Mar. 26, 1996—within U.S. Pat. No. 6,600,175—almost all other attempts to prepare achromatic radiation from multiple light emitting diodes sought achromatic electroluminescence—broadbased but identical emission from each of the diodes, themselves. (See as just one, among many, examples, the disclosure within JH09232627—1997 Sep. 5—Hidemi, Yuzaburo, Isao, and Akihokp—"to provide a white LED of high purity and reliability" . . . with "three active layers, different from each other in band gap energy, are provided" and "light rays emitted from the active layers are light of three primary colours, red light, green light, and blue light" . . . and "only white light is emitted".) No doubt the general presumption was, prior to '175, that the inefficiencies introduced by the entropy of mixing three different frequencies of radiation, from three different colored LED devices (to make white light), would be too great to afford a lamp appropriate for General Illumination and hence the preference for a single electroluminescent device emitting all of the required colours to appear white to a human observer. (U.S. Pat. No. 5,136,483, 1992)

However, one should be mindful of a perhaps different perspective, the representation of Lavenda, referring to a thought experiment of Lorentz, that the splitting of pencils of radiation of the same frequencies into reflected and transmitted rays. Therein it is said that there is a gain in entropy because of the splitting of the rays and that the reverse process, mixing the before split rays, would not be spontaneous as it would require a reduction in entropy. (Lavenda, 1991)

Notwithstanding the great progress in ANSL (LED) lamps for General Illumination since '175, understanding the source of currently recognized inefficiencies and ameliorating, mediating, modifying or eliminating same is of societal benefit to improve the end-user's acceptance—of commercial achromatic light-emitting diodes—as instruments for General Illumination and a concomitant reduction in energy usage associated therewith.

The present-day commercial success of white LEDs was caused by the subject matter of the aforementioned patent (i.e.; '175), as distinct from the prior art at its time of invention. The disclosure within '175 emphasized as a preference (a preferred embodiment), for the source of secondary radiation, incorporating "fluorescent materials with extremely short radiative lifetimes, less than 50 nanoseconds", effectively a rate of luminescence fast enough to ameliorate the inefficiencies associated with using higher intensity primary radiation sources.

Intensity dependent studies have recently been performed in systems that are based on the implementation of Down-Conversion to generate white light for General Illumination. Specifically incorporated by reference is the interesting work on $Ce^{3+}$: YAG phosphor luminescence estimated by high intensity blue laser diodes. (U.S. Pat. No. 7,151,283, 2006) (U.S. Pat. No. 6,936,857, 2005) (Yuan Yuan, 2018) The phosphor reported therein demonstrated a reduction in fluorescence yield as the intensity of the incident primary radiation increased. More specifically, the authors noted "with the increase in the exiting laser power, the emitting luminous flux decreases". (Yuan Yuan, 2018) This may appear, at first, a direct contradiction to the thermodynamic argumentation that a high intensity, the radiation temperature is at a maximum and that entropic diminishment of free energy is at a minimum. However, a contradiction it is not. Thermodynamically the above conditions provide the maximum efficiency of work; but it does not define what work will be performed. Clearly rates of reactions determines competitive yields and at high intensity, and maximum work and high concentration of excited states, rates competitive with $k_f$ come to dominate. (Mauzerall D., 2013)

The radiometric terms will be hereinafter defined more completely, but it is beneficial to note that Radiant Flux (also called Radiant Power) in Joules per second or in Watts is a measure of Radiant energy emitted, reflected, transmitted, or received, per unit time. This is sometimes also called "radiant power". As hereinbefore noted, the temperature of radiation at a frequency (energy) is in fact strongly influenced by its intensity (power or flux); the higher the intensity, the higher the radiation temperature. As previously summarized, at low radiation intensity (radiation temperature) the population of [P*] is small and the free energy loss (with each additional absorption) due to the statistical mechanical entropy term is greatest. When the radiation intensity is high (high radiation temperature), the entropy of the transition is near zero and the free energy available to perform work, because of the transition, is the greatest. This is completely a thermodynamic argumentation. However, when [P*] becomes very high, both thermodynamics and kinetics determine the fate of the underlying assumption that there is no non-radiative decay that competes with $k_f$. Indeed, for General Illumination using Down-Conversion in ANSL, the rate of non-radiative decay due to $k_{nr}[P^*]$ becomes competitive with the rate of fluorescence, $k_f$. Thus, while overall work is at its greatest, that work indeed leads to an increase in processes other than fluorescence, as statistical thermodynamics does not favour one process over another.

The decrease in yield in fluorescence with increasing intensity of incident radiation is one of the perhaps surprising reasons why it would not be generally expected, or universally predicted, that increasing power of emerging blue gallium nitride (GaN) light-emitting diodes would necessarily translate into increasing white light illumination unless there was some unique means to accomplish same. In other words, that more initial (primary) photons might be available, and incident on a phosphor, would not necessarily mean that the efficiency of down-converted light emission by the phosphor would not necessarily decrease. Thus, intensity-dependent inefficiencies would mean that the advantage of brighter emission by the phosphors would not be necessarily a consequence of the brighter incident primary radiation. Indeed, one might argue that this is clearer that the converse, despite the opinions of many which are apparently based on misconception of and between energy and intensity (or flux).

Singlet-singlet annihilation, which occurs at high radiation intensities, is detrimental to operation of high brightness light-emitting devices. (Ruseckas, et al., 2009) (Barzda, et al., 2001) (Nettels, et al., 2015) (Jordens, et al., 2003) (King, 2008) Notwithstanding the above and as disclosed in '175: 1) very high radiation intensities of the primary source were required to generate enough illuminance for useful work and 2) such primary radiant sources were available with the introduction of "high-brightness" blue LEDs of high luminance, based on the work of many.

However, it was generally believed at the time of the invention disclosed in '175 that such high-brightness sources could not be used to generate white light via Down-Conversion (as evidenced by disclosure of contemporaneous thinking "we did not believe that it was possible to produce white light in a similar manner") despite the prior art that was able to Down-Convert using less than "high-brightness" light emitting diodes to convert violet light-emitting diodes to blue light emitting diodes using a "fluorescer"; i.e.; the "similar manner" explicitly referred to. [Nakamura, S. (2014). Declaration of Dr. Shuji Nakamura under 37 C.F.R. § 1.132. United States Patent & Trademark Office Control No.: 90/013,225; signed on Nov. 20, 2014.]

Subsequent discussion on the matter, many years later, concluded that because "Nakamura's LED . . . would provide more photons to be down-converted by the phosphors and thereby provide brighter overall light emission from the device"—parenthetically an assumption that the referenced author must view as reasonable—the advantage of brighter emission by the phosphors would be readily a consequence of the brighter incident primary radiation. This statement is based on the simple assumption that so-called "high brightness" incident radiation, expressed as numbers of photons as opposed to the total energy of photons, will lead to greater number of exiting photons from the phosphor as both scattered primary and exiting secondary radiation is required. This is essentially an argumentation of photon density. Important to the instant invention is the difference between the practical technology of General Illumination (normally operated at high photon density and high concentrations) and the photophysical science of luminescence (normally examined at low photon density and low concentrations).

The latter, the photophysical science of luminescence—as described in the often-referenced text "Fluorescence and Phosphorescence" by Peter Pringsheim (Pringsheim, Fluorescence and Phosphorescence, 1949)—is essentially a primer on the quantum mechanical nature of matter as evidenced by its interaction with a radiation field, understanding of which requires elimination of competing pathways of activation and deactivation, generally eliminated by experimentation at low photon densities and low concentrations of matter. The former, General Illumination practised at high photon density and high concentrations, is an engineering discipline, like the roots of thermodynamics (e.g.; steam engines), that is practiced in an environment where competing pathways of activation and deactivation are present as a consequence of the fundamental macroscopic manner in which mechanical devices must operate to provide the principal engineering benefit: practical General Illumination at useable and generally high intensity (luminance or illuminance).

At such high levels of excitation, however, the concentration of phosphor excited states increases dramatically to levels where the statistical mechanic entropy nears zero, providing maximum free energy to perform work, whether useful (desired) or not. At such high levels, the work performed because of the incident radiation includes singlet-singlet annihilation, a highly probable bimolecular (two-body) process when entropy is near zero, unless the singlet excited states have relatively short radiative lifetimes. This mechanism for annihilation, which in the case of General Illumination wastes free energy, is reminiscent of the mechanism for three-level and four-level lasers. The engineering description is frequently referenced as saturation. A similar problem occurs from an engineering perspective at the light-emitting diode used in General Illumination, itself. There the saturation is called a "droop".

Using the nomenclature that $Y_1$ represents the singlet excited state of the secondary emitter, such as $Ce^{3+}$:YAG, then singlet-singlet annihilation can be expressed as $Y_1+Y_1 \rightarrow Y_0+Y_2$ (where $Y_0$ and $Y_2$ represent ground electronic state and higher than the first singlet excited state, respectively) whereas stimulated emission is represented by $Y_1+h\nu \rightarrow Y_0+2h\nu$ and multi-photon absorption is represented by $Y_1+h\nu \rightarrow Y_2$. The singlet-singlet annihilation is of the Forster Resonance Energy Transfer type and does not require the two $Y_1$ states to be in contact. In a densely populated phosphor, a possible mechanism of Forster Resonance Energy Transfer $Y_1+Y_0 \rightarrow Y_0+Y_1$ allowing for excitation hopping to the nearest secondly excited $Y_1$. (Borisov, Gadonas, Danielius, Piskarkas, & Razjivin, 1982) (Hofkens, et al., 2003) (Völker, et al., 2014) Tell-tale sign of the onset of singlet-singlet annihilation is the emission flux reduces with increasing incident flux, the radiative lifetime decreases with increasing incident flux, and the spectral distribution becomes bluer, as if the phosphor experienced an anti-Stokes shift. Indeed, when the quintessential ANSL Down-Conversion phosphor, $Ce^{3+}$: YAG is exposed to ever increasing incident radiation flux, from a blue LED laser, the exiting flux after the Stokes shift, from the phosphor, decreases. This—higher incident brightness, lower exiting flux—is an excellent example of how at higher incident flux, thermodynamically, processes become more efficient and unwanted processes that still perform work, although unwanted work, can compete and are observed to compete against those wanted processes (in the case of General Illumination, Down-Conversion to yield achromatic radiation).

Since the Down-Conversion for General Illumination does not incorporate an optical resonator, the relative amount of stimulated emission from the phosphor is minor, and the macroscopic population of phosphor excited states interacts with other phosphor excited states (matter-matter interaction, as opposed to photon-matter interaction). Indeed, it had been, contemporaneously to '175, posited, in opposition to the Down-Conversion approach, that to generate white light from light emitting diodes, the combination of three separate lamps (one, red, one green and one blue) would be a successful approach (similar to the work of the hereinbefore referenced Hidemi, Yuzaburo, Isao, and Akihokp). Of course, at elevated temperatures, the entropy of mixing three separate and identifiable radiation sources would be even greater than the entropy of mixing blue and yellow radiation sources leading to greater inefficiencies associated with the former than the latter, all other factors being equal.

That excited singlet states of chromophores act as mobile quenching centers for other excited singlet states, has been demonstrated in aggregated and connected systems with many chromophores. Such singlet-singlet annihilation indeed does lead to decreased excited-state lifetimes at high excitation intensities and concomitantly to a decrease of the fluorescence yield. (Barzda, et al., 2001)

Thus, the reason why the '175 disclosure was different than the prior art (and contributed to the commercial success of white light LEDs post-'175) was the realization that: 1) high levels of white light illuminance was required for the practical engineering of General Illumination; 2) to obtain such high levels of white light using Down-Conversion, one needed to use primary LED sources of high brightness; 3) to avoid the inevitable wasting of such high brightness sources due to the entropic-reality that (as a consequence of high concentration of singlet excited states and quenching processes such as singlet-singlet annihilation in the source of secondary radiation) radiative lifetimes of less than 50 nanoseconds were preferred embodiments. Indeed, most of the phosphors used in commercial LED lamps have radiative lifetimes near 50 nanoseconds or less (as referred by '175) and most definitively less than 100 nanoseconds.

The shorter radiative lifetimes in the preferred embodiments represent the reciprocal of pure rates of luminescence that must not be made shorter due to quenching effects, whether by external atoms or by self-quenching. As by example to demonstrate this point, the phosphor $Ce^{3+}$: YAG is frequently used in Down-Conversion of blue radiation emitted from a GaN light-emitting diode whereby, in at least one preparation of the phosphor, by He, et. al., two radiative lifetimes were observed for the luminescence perceived to be yellow absent the mixing with scattered blue radiation: 26.5 nanoseconds and 91.1 nanoseconds. (He, et al., 2016) However, the shorter radiative lifetime of the luminescent ion was attributed to self-quenching (normally associated with increasing concentration) and hence not a pure reciprocal rate of radiation obtained at infinite dilution. The longer radiative lifetime reported in the referenced work is admittedly longer than the 60 to 70 nanosecond radiative lifetime for conventional $Ce^{3+}$ YAG phosphors traditionally used in white light Down-Conversion: the longer radiative lifetime most likely is related to energy hopping, of the Förster Resonance Energy Transfer type, which is known to occur with increasing concentration. The mechanism of self-quenching was not explicitly articulated. As mentioned hereinbefore that mechanism can be singlet-singlet annihilation (shorter lifetime) or Förster Resonance Energy transfer energy (longer lifetime) hopping or both (both shorter and longer lifetimes than usual). A third possible mechanism is $Y_1+Y_0 \rightarrow Y_0+Y_0+$heat, which calorimetry could be used to confirm. Consequently, it is probable that the two different lifetimes are an outcome of two separate phenomena: radiation imprisonment which leads to longer observed lifetimes—energy hopping—and singlet-singlet annihilation which leads to shorter observed lifetimes. (The referenced work notes FT-IR spectroscopic peaks at around 790 cm-1 which equates to 12.66μ and 2.26 kcal/mol and another spectroscopic peaks around 3432 cm-1 which equates to 2.9μ and 9.8 kcal/mol.) (He, et al., 2016)

It has been recently suggested that laser diodes will be used to power white light LEDs. No doubt these systems will benefit from phosphors with radiative lifetimes even less than 25 nanoseconds and it will be preferential to use phosphors with radiative lifetimes less than 5 nanosecond (less than 5,000 picoseconds), otherwise the observation of secondary luminescence saturation will become critical.

For a luminophore, whether a phosphor or not, the shorter the radiative lifetime is measured with greater precision, the more indeterminant the energy of the excited state is (as energy and time are conjugate variables) where:

$$\Delta E \Delta t \geq \hbar/2 \text{ or } \Delta X = \Delta A \Delta B \geq \frac{1}{2} |\langle \psi|[A,B]|\psi\rangle| \quad (11):$$

and $$\Delta X = \sqrt[2]{\langle \psi|X^2|\psi\rangle - \langle \psi|X|\psi\rangle^2} \quad (12)$$

is the standard deviation from measuring $|\psi\rangle$ with the observable X) (Wehner & Winter, 2010);

the broader the emissive spectral line (homogeneous broadening), and the greater the entropy gain in the radiation field because of the resulting spontaneous emission. (Vallance, 2017) (Weinstein, 1960)

Consequently, provided the radiative lifetime is short-enough, the entropy gains due to this homogeneous broadening into the radiation field with secondary emission offsets to a full extent the entropy associated with the Stokes' shift at the site of secondary emission.

In other words, for those systems that provide for General Illumination incorporating a Stokes' shift, the means of removing the entropy—otherwise generated at the source of secondary emissions—through radiation is enhanced by using luminophores with extremely short radiative lifetimes. Dissipation by internal conversion and then molecular vibrations for nonradiative decay from the lowest vibrational level of the electronic excited state—internal conversion is the rate limiting step, not the subsequent molecular vibrations—has too slow a rate to compete.

A consequence of the previously mentioned preferred embodiment in '175, which is incorporated herein by reference, is that the inefficiency associated with entropy generation because of the Stokes' shift, if indeed this is happening without recourse as shall hereinafter be further commented, leads to an increase in dissipation of the entropy by the exiting radiation field. It is important to note that the presumption that vibrational relaxation rates in an excited electronic state is the same as the vibrational relaxation rates in a ground electronic state, once internal conversion to the ground electronic state is affected, is frequently articulated to be a consequence of vibrational energy transfer to the plethora of nearby solvent molecules in which the luminophore is solvated. However, Down-Conversion for General Illumination as herein described is normally not constructed with a fluid surrounding the source of secondary radiation. Thus, the fundamental consideration of dissemination of entropy from the first electronic excited state; the rate of internal conversion followed by vibrational relaxation $(k_{v.r.}^{i.c.})$ would have to compete with either the rate of thermal radiation $(k_{t.r.})$ or the rate for luminescence $(k_f)$ to carry away the entropy, with respect to the Stokes' shift.

The applicable rate equation then is $$\frac{k_{v.r.}^{i.c.}}{\left(k_{v.r.}^{i.c.} + k_{t.r.} + k_f\right)} \quad (13)$$

where the entropy gained due to the Stokes' shift remains embodied with the matter that is the source of the secondary radiation until something else happens. The general assumption related to the Stokes' shift is that the vibrational relaxation is irreversible and that the heat is dissipated by conduction and then convection.

This is not possible, however if the same vibrational bands are populated by an external and different radiation source. Further, in a solid-state implementation, such as proposed here, in this instant invention, conduction away of the entropy in the form of heat to the environment is not likely to take place, especially if the environment is created in a manner that prevents, mitigates, or otherwise reduces conduction, which is another primary purpose of the instant invention. Indeed, there is an excited state equilibrium (Demars, 1983) (Maus & Rettig, 2002) setup in that the entropy associated with the Stokes shift is initially transferred from the chromophore, in whatever form this might take (e.g.; $Ce^{3+}$) to nearby phonons (e.g.; of the YAG lattice) and then back again, unless the entropy is somehow otherwise dissipated (e.g.; from the YAG lattice). If one denotes $Ce_{}^{3+}$ as a chromophore in a hot electronic excited state (Lin, Karlsson, & Bettinelli, 2016) and $YAG_{}$ as a phonon excited lattice, then the equilibrium is

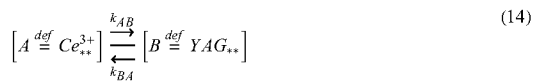

(14)

and the excited state equilibrium constant is $$\frac{[B]}{[A]} = K_{eq} = \frac{k_{AB}}{k_{BA}}.$$

(15)

As with all equilibriums, excited state equilibriums allow for the measurement of thermodynamic parameters. As an example, the excited state equilibrium between two rotational conformers of sterically restricted Donor-Acceptor Biphenyl, which ultimately is depopulated from the excited by a considerable slower fluorescence from both conformers, yields change in enthalpy of −0.59 kcal/mol and a change in entropy of −0.7 Joules per mol K. The change in activation energy going from the excited state of one conformer to the other is approximately 3.5 kcal/mol.

The current inventor is aware that some would argue that speaking of thermodynamic equilibrium over such short time scales is of little credibility, as one often sees articulated when considering photosynthesis, where the source of incident radiation is thermal, from the sun, and the entropy of the incident radiation is easy to calculate, as shall hereinafter be explained. Nevertheless, if the rate of fluorescence (in reciprocal seconds) from typical phosphors used in Down-Conversion for General Illumination is near $10^9$ and that of vibrational relaxation of the excited state due to the Stokes shift is five orders of magnitude faster ($10^{14}$), that spread is hypothetically equivalent to an equilibrium that lasts for at least 100,000 days (274 years) if the original equilibrium had been reached one day after reaction.

It is important to remember that formally, the rate of thermal radiation defined hereinabove reflects thermal radiation from the ground vibrational level of the first electronic excited state. Normally one considers thermal radiation as occurring from matter and is dependent on the temperature of that matter and does not identify itself as coming from any one electronic state. The essential observation of which the instant invention is dependent is that a two-level atom's (or molecule's) luminescence emission carries along with it the thermal radiation so that the underlying luminescence carries with it the entropy of the thermal radiation which would emit if there was no luminescence and no non-radiative decay, the latter of which is initiated by internal conversion. What this means is that there can be stimulated emission of thermal radiation and that thermal radiation is transmitted co-incident with the luminescence if the two-level states are surrounded by an environment in which the entropy resides (e.g., the YAG lattice with its Ce' associated chromophore).

Going back to consideration of the excited state equilibrium, Demas so eloquently notes, "(An) an important case where an excited state equilibrium is suitable (,) arises in thermal equilibration of the excited state manifold. For example, in condensed media, equilibrium within the excited-states singlet manifolds is typically complete within a few picoseconds following excitation to upper (excited) singlet states. For an emission occurring on a nanosecond time scale, equilibration of the emitting manifold can be considered essentially perfect." (Demars, 1983)

In the above example, one might consider over a very long period of time (even past the typically nanosecond time period of luminescence to perhaps days or years) a steady state approximation as with Down-Conversion for General Illumination, the primary radiation is always generated as long as the current is directed through the source of primary radiation and, assuming no luminescence saturation, there are always enough ground states at the source of secondary radiation to receive and act when primary radiation impinges. The steady state approximation is only exact, however, if either the $Ce_{}^{3+}$ concentration is much greater than the concentration of $YAG_{}$, or vice versa, at any one point in time. One way to ensure that the steady state approximation is not operable and that the excited state equilibrium is dominant is to simultaneously populate $YAG_{}$, and $Ce_{}^{3+}$ by irradiation with an infra-red-light LED and a blue light LED, respectively. With equilibrium at play, standard thermodynamic functions can be used to describe the states, their processes and evaluate underlying efficiencies.

If there is more than one phonon B ≝ $YAG_{}$ to be activated by an independent infrared LED with frequency v, then when one might populate B' ≝ $YAG_{*}$, if you will, with frequency v'. It is then clear that for every frequency that is characteristic of a phonon of excited state $YAG_{}$, one might have not only the source of primary radiation activating the $Ce_{}^{3+}$ chromophore, but also the plethora of $YAG_{**}$ phonons. Consequently, one has by virtue of sources of visible and infrared radiation sources, contrived a simulated blackbody radiator. If not perfectly reflecting, as shall hereinafter be explained, the system will be in equilibrium, there being no difference between excited state equilibrium and equilibrium, as the number of phonons that are available and which are populated approaches infinity. At infinity of course, the system will no longer have the characteristics of $Ce^{3+}$: YAG and in fact will have an emission spectrum independent of any one material used to construct the system. Regardless of whether the system is only at an excited state equilibrium or a total equilibrium, one is reminded that the expressions energy and entropy at equilibrium developed by Planck (Planck & Masius, The theory of heat radiation (Translation)., 1914) and others (Bose, 1924) (Einstein, Über einen die Erzeugung and Verwandlung des Lichtes betreffenden heuristischen Gesichtspunkt., 1905) for blackbody radiators has also been shown to apply to non-equilibrium cases. (Rosen, 1954) Boroskina et. al. teaches that "the introduction of the concept of the photon chemical potential enables establishing relations between the number of photons and the number of other quasiparticles photons interact with. These interactions can be modelled in analogy with chemical reactions (i.e., equilibrium is reached when the sum of the chemical potentials, including that of photons, is zero)." (Boriskina, et al., 2016)

The number of photons present are generally unrestricted except as impacted by those particles in which the photons interact (i.e., conservation of momentum; conservation of energy). Boroskina summarizes with two important observations: 1) photons with a positive chemical potential carry higher energy per photon state than thermally emitted photons at the same emitter temperature; 2) photons with negative chemical potential which are emitted, carry less energy than the photons in the blackbody spectrum. (Boriskina, et al., 2016) [It is noted that Bose's derivation of Planck's formula is inherently based on the quantum and momentum and thereby avoids classical theory used by his predecessors to derive the formula: "As opposed to these (other derivations), the light quantum hypothesis combined with statistical mechanics (as it was formulated to meet the needs of the quantum theory) appears sufficient for the derivation of the law independent of classical theory".] (Bose, 1924)

Lasers have been previously used to generate chromatic light through Down-Conversion (Pinnow). (Van Uiteret, Pinnow, & Williams, 1971) Lasers have near-zero entropy in their radiation field. If one views Down-Conversion as the transfer of radiation from one surface (the GaN LED die) to another (the phosphor), a thermodynamic treatment for the radiation energy emitted by the second surface depends only on its temperature and emissivity but the entropy emitted by the second surface also depends on the entropy of the incoming radiation. (Zhang & Basu, 2007) This is a fundamental difference between energy transfer and entropy transfer, both of which occur with the interactions of radiation and matter. A colloquial way of so saying, the post-transfer matter may not be characteristic of the source of radiation energy, but the post-transfer matter will always be representative of the source of radiation entropy. This is the fundamental reason why the source of primary radiation is important in the Down-Conversion process which admittedly defies conventional, if not erudite, wisdom.

Retrospectively it is now realized that the lower the entropy of the incident radiation, the greater the effectiveness of the process of Down-Conversion for General Illumination as originally disclosed in '175. Hence, polarized incident radiation, such as from light emitting diodes that emit polarized primary radiation, (Matioli, et al., 2012) should provide increased thermodynamic efficiencies in Down-Conversion for General Illumination, all other parameters being equal. (Zhang & Basu, 2007)

Nevertheless, even with very short radiative lifetimes, the process of using Down-Conversion introduces other inefficiencies that are more difficult to circumvent. The before mentioned inefficiency associated with entropy of mixing increases with increasing temperature. Down-Conversion, as herein defined, realizes reduction in efficiencies as the temperature—where the mixing takes places—increases. In theory then, Down-Conversion to deliver achromatic radiation is most efficient as the temperature at the site in which mixing takes place approaches 0 K. Indeed, this is the essence of thermodynamic treatment for luminescence: only at 0 K is all the energy of absorption (that results in spontaneous emission) available as free energy to perform non-heat or work that is useful. As shall hereinafter be disclosed, to reduce the inefficiencies associated with the entropy of radiation mixing, one would normally expect a prudent action is to lower the operating temperature at which the emissions from the primary radiation source and the secondary radiation mix their spectral energy. However, the present invention does the opposite, and this is its essential novelty: it seeks to benefit from characteristics of thermal radiation entropy at elevated temperatures to increase the efficiency of luminescence.

This approach is extremely counter-intuitive in that the most favoured phosphor used in Down-Conversion, $Ce^{3+}$:YAG, is widely reported to experience a reduction in luminescence yields with increasing temperature, although the mechanism for same is not well explained. (Agarwal, et al., 2017) Our interest in using phosphors of the Yttrium Aluminium Garnet type is that the intrinsic quenching temperature is much higher than conventionally articulated and the phosphor can be put into a protecting environment to negate many of the ancillary effects of higher operating temperature. Indeed, it has recently been reported that the "intrinsic quenching temperature of the Ce-luminescence is shown to be very high (>680 K). The lower quenching temperatures reported in the literature have been cautiously explained to be thermally activated concentration quenching (for highly doped systems) and the temperature dependence of the oscillator strength (for low doping concentrations)." (Bachman, Ronda, & Meijerink, 2009)

The instant invention is based on luminescence emission increasing in photon number, to the extent that conservation laws so allow, with increasing localized temperature, as the chemical potential of the luminescence decreases towards zero and contrary to the general interpretation of Einstein's law of photochemical equivalence. The driver for the invention is the now realized understanding that for thermal radiation there is no conservation of photon numbers and that luminescence that looks more like thermal radiation will inherit properties of thermal radiation as the chemical potential of the luminescent states decrease towards zero.

For the instant invention, the increasing localized temperature at the source of secondary radiation is created either by preferentially not dissipating (by convection or by conduction) naturally produced heat that impacts the site of, or the source of, the secondary radiation or by virtue of incorporating into the lamp, a thermal radiation source, also called a tertiary radiation source, whose spectral entropic maximum is in the non-visible, measured as if the tertiary radiation source is a perfect blackbody, and whose thermal radiation field is incident on the source of the secondary radiation. As an example of the latter, a thermal radiation source, is a mid-infrared InAs diode on InAs substrate with an InAsSbP window from Prolinx, Tokyo, Japan. The term infrared is characterized by the following nomenclature, at least as used in the instant invention:

Near-infrared: from 0.7 to 1.0 μm;
Short-wave infrared: 1.0 to 3 μm;
Mid-wave infrared: 3 to 5 μm;
Long-wave infrared: 8 to 12, or 7 to 14 μm;
Very-long wave infrared (VLWIR): >14 μm.

The primary radiation source is a light-emitting diode that is best described as emitting primary radiation that appears to a human observer as being blue, but which could also emit light that is perceived to be violet, or is ultraviolet, but which is higher in emission energy than the secondary radiation source. The secondary radiation source is a luminophor that absorbs the primary radiation from the primary radiation source and emits radiation that is luminescence and thermal and which is called secondary radiation. The tertiary radiation source is one that emits primary light that is not perceived by a human observer as being visible absent a thermal imaging device (e.g., night-vision goggles) and whose radiation is incident upon the secondary radiation source. The primary radiation and the tertiary radiation both of which are incident upon and absorbed and or scattered by the secondary radiation source however in the case of the tertiary radiation is principally absorbed by the source of secondary radiation. The approach of the instant invention is different than that which may be inferred from Soares et. al. whereby at temperatures far below ambient (12 K to room temperature), they observe an overall increase of the integrated intensity which was found to be accounted for a thermal activated process described by activation energies of 10 meV and 30 meV for the single crystal and target, respectively. (Soares, Ferro, Costa, & Monteiro, 2015)

Optimally, if an infrared (IR) light emitting diode is to be used, one would then select such a tertiary radiation source that corresponds to an infrared absorption peak of the ground electronic state of the secondary radiating matter and one that is not fully or completely absorbed by the intervening space between the source of primary radiation and the source of secondary radiation. The purpose of same is to introduce energy into rotational and vibrational modes into the ground electronic state of the source of secondary radiation and at the site of secondary radiation generation, although it is not a requirement of the instant invention that only this site is populated with energy. By populating these vibrational bands through thermal radiation, one is essentially freezing out these modes for deactivation of the excited states of the secondary emitter. By populating these modes with infrared radiation, it is the same as if the vibrations were sterically prevented from taking place in the first place: an effect known to dramatically increase the fluorescence Quantum Yield.

As by way of traditional modern molecular photochemistry, the fluorescence Quantum Yields of luminescent aromatic compounds are normally quite high as they are rigid molecules, both in the ground state and in the excited state from which they luminesce (Turro, Ramamurthy, & Scaiano, 1965) Rigidity can prevent cis: trans isomerization, a competing mechanism of deactivation from excited electronic states. (Xu, et al., 2016)

The IR spectroscopic peaks observed in the ground electronic state of $Ce^{3+}$: YAG have been attributed to the vibrational transitions as shown in Table 5 which is referred to as "Vibrational energies of YAG crystals". Recall, as previously noted, another referenced work indicated FT-IR spectroscopic peaks at around 790 $cm^{-1}$ which equates to 12.66μ and 2.26 kcal/mol and another spectroscopic peaks around 3432 cm' which equates to 2.9μ and 9.8 kcal/mol. (He, et al., 2016)

An example of a source of secondary radiation is a $Ce^{3+}:Nd^{3+}:YAG$ nanoparticle as elsewhere described (Wang, et al., 2015) or matter with the chemical composition of $Ce^{3+}:YAG$ or a wide variety of inorganic and organic luminophores with radiative lifetimes of less than 100 nanoseconds at their localized temperature as defined by the Kennard-Stepanov equation. For those sources of secondary radiation that are sensitive to higher localized temperatures, they are encapsulated in a protective environment which may include exposure to a non-cooling gas such as xenon, krypton, or argon or in the alternative, a reducing gas such a hydrogen that is diluted with a non-cooling gas such that the non-cooling gas makes up at least 50% of the composition of the gas.

Incidentally one notes that the orthodox definition of luminescence is electromagnetic radiation with a chemical potential, μ. In contrast, thermal radiation is electromagnetic waves or photons with zero chemical potential. Conventional treatments of the difference presume a significant magnitude to the chemical potential, evidenced by a sharp cut-off in the excitation spectrum for a luminescent body and the inference that thermal radiation and luminescence (cold radiation) have distinctly different properties. However, as the temperature of a heat bath, at which a luminescent body absorbs incident radiation, increases, the chemical potential of the luminescent state decreases, and the subsequent luminescence becomes more thermal radiation-like. This is an inevitable consequence of the luminescent excited state looking more like the ground state, at higher temperatures, from which the initial excitation takes place, as the chemical potential decreases from, for example, 3.0 eV (69 kcal/mol) to 0.3 eV (6.9 kcal/mol; 2,420 $cm^{-1}$; 4,132 nm) to 0.03 eV (0.69 kcal/mol; equivalent Temperature 348 K; Boltzmann population (at 298 K) 31%) to 0.003 eV (0.069 kcal/mol) to zero eV.

Returning to the reference of Rotschild wherein it is stated:

"By definition, the regime where photoluminescence and thermal excitations compete for dominance is when μ approaches zero. At μ=0, the radiation is reduced to the thermal emission rate." (Rotschild, 2017)

There is no abrupt cut-off between photoluminescence and thermal radiation: the competition occurs as the chemical potential approaches, but is not yet, exactly zero. Indeed, since the chemical potential is defined as zero for those systems with a perfect equilibrium between the radiation field and matter, an idealized system that is never truly realized, it is clear then that those systems generating photoluminescence, governed by the rules of thermodynamics and quantum mechanics, will always concurrently yield thermal radiation, and the former will look more like the latter as the energy gap between electronic states decreases.

The thermodynamic treatment of radiation as claimed herein relies on the chemical and thermal equilibrium among the electrons in the excited state atomic or molecular orbitals and among the electrons in the ground state orbitals. If these equilibria exist, as the instant invention claims, the emission of luminescent radiation is an equilibrium problem as much as the emission of thermal radiation. That is to say that the steady state arrival of electro-magnetic radiation is the same as the heat bath in which the matter resides and is stimulated either by photons or phonons, whatever the case may be, respectively.

Entropy of Mixing: Its Origin. Entropy of mixing is a thermodynamic reality normally discussed and associated with the examination of ideal gases. Recall that in the early models for thermal radiation the parallels with ideal gases were observed, contemplated, and led to a search for a particle nature of radiation. The well-known Gibbs paradox (Jaynes, The Gibbs Paradox., 1992) is associated with a thought experiment whereby a chamber with a partition has the same ideal gas (in sub-chambers) on both sides of the partition. With removal of the partition, there is no entropy of mixing as the identity of the gas from either chamber cannot be distinguished among themselves, as opposed to when each chamber contains a different gas, even if only by an atomic isotope. The key references Mr. Jaynes offers of Prof. Gibbs are:

1) Gibbs, J. Willard (1875-78) "On the Equilibrium of Heterogeneous Substances", Connecticut Acad. Sci. Reprinted in The Scientific Papers of J. Willard Gibbs, by Dover Publications, Inc., New York (1961);

2) Gibbs, J. Willard (1902), "Elementary Principles in Statistical Mechanics", Yale University Press, New Haven, Conn. Reprinted in The Collected Works of J. Wil lard Gibbs, Vol. 2 by Dover Publications, Inc., New York (1960).

[When it is said that two identical gases mix without change in entropy, it does not mean that the process can be reversed without change in entropy. Rather it means that one can return to a thermodynamic state that is indistinguishable from the original one with respect to macroscopic properties. Similarly, when there is an increase in entropy when two distinguishable gases mix, it does mean that there is a decrease in entropy when a process allows for return to a thermodynamic state that is indistinguishable from the original one with respect to macroscopic properties.] (Jaynes, The Gibbs Paradox., 1992) While this may seem unusual, one thing that is clear is that the entropy of mixing for indistinguishable ideal gases is completely independent of the nature of the gases. Further, Gibbs concluded that it is not any more impossible to return two different molecules to a thermodynamic state indistinguishable from its original state than it is to return two identical gas molecules, once mixed, to a thermodynamic state indistinguishable from its original state. While one cannot affect this separation without impacting any variables of the thermodynamic state—thus the entropy must change in de-mixing—it has been noted that it might happen at some later point in time without any intervention, thus impossible becomes improbable.

In contrast to Gibbs Paradox for ideal gases (if one had even existed in the view of Gibbs), it has been shown that if each of two cubic chambers contain the same (indistinguishable) thermal radiation, removal of the partition (increasing the volume) leads to an identifiable entropy of mixing under isothermal conditions: (Jaynes, The Gibbs Paradox., 1992) (Sokolsky & Gorlach, 2014)

A. "When the partitions between cubic cavities are removed, new eigenfrequencies appear for the electromagnetic field inside. If the temperature of the system had been kept constant, then the statistical weight of a given system state has increased (when new modes, appear the number of ways to distribute the energy between these modes increases). Thus, the entropy has increased." The entropy of mixing is in fact the source of information entropy.

B. The entropy increase from the mixing of radiation is due to the increase in radiation modes (photon numbers) offset in part by a decrease in temperature post-mixing: "it is shown that if the partition between two adjacent identical cuboid cavities with the photon gases at the same temperatures and pressures is adiabatically removed, the temperature of radiation decreases in the obtained composite cavity though the total number of photons increases". [This distinguishes an ideal gas from what may be called a photon gas—the lack of conservation of numbers in the latter case, which shall be more fully commented on hereinafter.] This is a recurrent theme in the context of maximum entropy and the return of radiation to an equilibrium state as a consequence of a perturbation to the equilibrium (Le Chatelier's principle—if a system at equilibrium is disturbed by a change in temperature, pressure, volume, or the concentration of one of the components, the system will shift its equilibrium position so as to counteract the effect of the disturbance).

C. In Down-Conversion, the entropy of mixing is of two radiation sources that are unequal and distinguishable by virtue of their spectrum, (e.g., blue radiation that is scattered and yellow radiation that is produced in any direction) among other parameters.

For example, an entropy of mixing term comes out of a derivation by Knox for the term $\partial s/\partial N$ (change in entropy to the radiation field with addition of one (emission into) or elimination of one (absorption out of) photon) where S is entropy and N is the number of photons of frequency $\nu$ present. (Knox, Thermodynamic and the Primary Processes of Photosynthesis., 1969)

There are other causes of energy-wasting (i.e.; work-wasting) in light emitting diodes using Down-Conversion that are not related to the entropy of mixing. Consequently, despite the energy preserving characteristics of light emitting diodes when compared to other types of General Illumination lamps, there remains many cumulative energy losses and the observable overall generation of heat is often explained as being a consequence of these losses. (Weisbuch, 2018) (Schubert, 2018)

It has been previously noted in the instant invention that many have expressed that one source of the energy inefficiency in lamps containing luminophores and light emitting diodes, is the Down-Conversion of primary radiation to secondary radiation. The latter (secondary radiation) is of a lower internal energy than the former (primary radiation) and, considering the conservation of energy, the difference is said to be dissipated in the form of heat proximate to the body where Down-Conversion takes place. This is an important consideration in that if this loss is, in fact, dissipated in this manner, positioning of the phosphor remote to the light emitting diode die would do little to prevent heat from being produced at the secondary source of radiation, if preventing, rather than mitigating, mediating, or ameliorating the effects of heat is indeed the claim (United States of America Patent No. 2012/0280256, 2012) Indeed, there seems to be little improvement in luminance if remote phosphors experience the same temperatures (~85° C.) as when the phosphor is in contact with the light-emitting diode die.

While the loss of efficiency due to the energy difference in Down-Conversion between the states which are populated after absorption and of those states occupied from which emission takes place is nearly universally quoted, there is little experimental evidence to support this description, the best proof of which would be based on calorimetry. Indeed, interpretations published by Mr. Knox on Kennard—Stepanov "parametric temperatures" is important to study: "(In a selection of) cases in which the anticipated linear relation is found . . . 'incorrect' temperatures are implied by the data. The first reaction to such a finding may be to envision some heating of the local environment by excess photon energy, and some attempts were made to connect this with Jablonski's ideas about excess excitation energy dissipation.

"This point of view does not withstand close scrutiny in the KS-relation context . . . A competing hypothesis to explain the elevated T* is based on inhomogeneous broadening." (Knox, Excited-State Equilibration and the Fluorescence-Absorption Ratio., 1999) The presumption of excess energy and its deleterious effects on subsequent processes appears not to be substantiated to the point that the widely believed presumption itself may not be considered as unambiguously proven (although it has been an appealing explanation associated with the quantum mechanical description of luminescence). (Van Der Hofstad, Nuzzo, Van Den Berg, Janssen, & Mekers, 2012) Inhomogeneous broadening is a consequence of the source radiation experiencing multiple different environments all which impact, differently, the vibrational levels of the ground and excited electronic states.

Another alternative interpretation of line broadening is due to the increase in entropy of the radiation field because of the conjugate variables, the energy and time uncertainty principles: "a basic assumption implicit in the application of thermodynamics to the electromagnetic field is that the laws of thermodynamics are locally valid for radiative emission and absorption processes. This means that a certain minimum amount of entropy must be created by the radiative process itself . . . .by considering the extreme case in which the spontaneous emission of a natural spectral line is the only process taking place, (that) this assumption is correct, and that its validity is essentially a consequence of the uncertainty principle as expressed by the reciprocal relationship between natural line breadth and lifetime." The significance of this reasoning is that the entropy which is a consequence of a Stokes shift is distributed to the radiation field and not to the surrounding energy bath, as is normally and historically assumed to be the case (i.e., Jablonski's ideas). (Weinstein, 1960) (See for example, Karo Michaelian: "The width of the allowed transition $\Delta E$ is determined by the natural line width dependent on the natural lifetime $\Delta t$ of the excited state, as given by the Heisenberg uncertainty relation $\Delta E \Delta t \geq h$. (Michaelian, K. The Dissipative Photochemical Origin of Life: UVC Abiogenesis of Adenine, Entropy 2021, 23, 217)

Admittedly, the measurement of energy of an emission which impacts the measurement of the time, and the non-commutative analogue, for which emission takes place, is only problematic when the rates of emission are very fast, as Planck's constant, $h/2\pi$, is an extremely small number.

Down-Conversion of course, by definition must utilize the hereinbefore referenced Stokes fluorescence (usually; but in certain cases, also, phosphorescence) shift at the source of secondary radiation. (Stokes, 1852) An often cited model for fluorescence generally (but not always) proceeds through three successive steps, i.e.; (1) absorption of radiation to reach non-stabilized excited states (Franck-Condon states), (2) stabilization of the excited state by vibrational relaxation (i.e.; Jablonski's ideas) and internal conversion (IC) to populate the lowest excited state (Kasha State), and (3) radiative decay resulting in the emission of a photon. (Birge, 1926) (Condon, 1926) (Franck & Dymond, 1926) (Kasha, 1950) (Galas, et al., 2018) Even absent the Stokes shift requirement (within Down-Conversion) for luminescence (a photochemical or photophysical process), or Kasha's rule, not all energy incident on a luminophore can be exploited as useful energy (i.e., to perform work). This is a function of incident intensity and temperature: the higher the temperature and the lower the intensity, the less useful work that can be performed. In the end, this is a matter of efficiency and not contrary to the statement made by Dr. Einstein whereby he states with respect to the Stokes shift and luminescence that "the intensity of light produced must—other things being equal—be proportional to the incident light intensity for weak illumination, as every initial quantum will cause one elementary process of the kind indicated above, independent of the action of the other incident energy quanta. Especially, there will be no lower limit for the intensity of the incident light below which the light would be unable to produce photoluminescence." (Einstein, Concerning an Heuristic Point of View Toward the Emission and Transformation of Light., 1905)

The best evidence for the energy difference in the Stokes shift being dissipated in the form of heat to the local environment would be in the use of calorimetry. In recent decades, a new technique called Photo-Acoustic calorimetry (PAC) provides for time-resolved examination of comparative heat flows. As noted by experts in this field "a (A) chromophore absorbing a short laser pulse releases a heat pulse when that chromophore undergoes radiationless transitions. This heat pulse produces a thermoelastic expansion of the medium that, if confined in time and space, launches a photoacoustic wave. Time-resolved photoacoustic calorimetry (PAC) is based on the detection of photoacoustic waves using ultrasonic transducers. PAC is often the technique of choice to measure transient volume/enthalpy changes of short-lived intermediates, and their corresponding lifetimes, due to radiationless processes after electronic excitation by a short laser pulse." (Schaberle, Rego Filho, Reis, & Arnaut, 2016)

Jablonski's ideas or Kasha's rule is based on a very fast radiationless decay to the lowest vibrational energy of the excited singlet state after which there is normally a relatively longer time before the Stokes fluorescence occurs. Of course, for Down-Conversion as practiced for General Illumination, generally the chromophore, the phosphor, is not in a medium that is a liquid to which the PAC is normally applicable. Thus, it is not generally clear that PAC can be used to ascertain whether the entropy generated from the radiationless decay from the lowest vibrational level of the electronic excited state from which luminescence takes place.

More importantly, the technique, PAC, has been used to measure the energy of the lowest vibrational level of the electronic excited state and the radiative lifetime associated therewith and that the technique gives results near that of spectroscopic examinations. Most importantly, PAC has not been used to demonstrate that the Stokes' shift itself, that very fast process by which the secondary emitter loses energy from a higher vibrational level of an electronic excited state to the lowest vibrational level of the electronic excited state, raises the local temperature in the medium in which the secondary emitter is enveloped. Rather the technique has been used to measure the radiative lifetime after the Stokes' shift has already taken place. Finally, even absent all the above limitations, the technique is not one that quantifies the amount of entropy that is dissipated through conduction versus that which is dissipated through luminescent or thermal radiation, in other words, the key "proportional" characterization as articulated by Dr. Einstein.

Excited State Thermodynamics. The thermodynamics of photochemistry and photo-physics is generally not considered (as is the thermodynamics of the incident radiation itself) in modern research on excited electronic states. (Ross R. T., 1967) (Case & Parson, 1971) (Saltiel, Curtis, Metts, Winterle, & Wrighton, 1970) (Berthelot & Borns, 1926) This is the case even though the thermodynamics of luminescence, for example, has a long history of scientific pursuit and is often said to be rediscovered many times over the past century and one-half. The two areas of contemporary scientific research that does seek to incorporate thermodynamics of radiation is photosynthesis and solar cells. In both cases the source of primary radiation is itself thermal radiation so that a thermodynamic consideration is perhaps more natural to invoke. However, there is no fundamental reason that thermodynamics of photo-initiated processes needs to be restricted to primary radiation that is thermal radiation.

As Ross & Calvin noted, losses in a photo-initiated process needs to consider "the entropy associated with the absorbed radiation; in other words, free energy is not the same as energy." Secondly, with respect to energy storage, which was their consideration, "If an absorber were in equilibrium with a radiation field, then it would reradiate at the same rate at which it received photons, meaning that the Quantum Yield for energy storage processes would be zero. To get a net retention of photons, the entropy of the absorber must be greater than the entropy of the radiation field". (Ross & Calvin, 1967) This view of Ross and Calvin can be used to support the Mauzerall Principle that a photo-process under steady state of illumination is not an equilibrium process as there must be a net retention of photons for an excited state to be available in which to retain energy. (Kahn, 1961)

The instant invention is principally based on a new understanding in Down-Conversion of the entropy of radiation and entropy can be evaluated from a statistical mechanics perspective irrespective of equilibrium thermodynamics Thermodynamics is also envisioned using reversible processes. As shall hereinafter be disclosed, reversible processes reveal the maximum efficiency; for irreversible photo-processes, the actual efficiency is simply lower than the maximum efficiency but in analogy thereto. Further, in the instant invention, one is not interested in energy storage but energy dissipation with a steady state of emission at a rate slower than that of the initial excitation.

In part, the impact of thermodynamics (e.g., the impact of entropy) is dependent on the temperature, T, in which the reactions are performed. Radiation-initiated processes are normally invoked as alternatives to thermal initiated processes. Hence, most photo-chemical and photo-physical examinations takes place at ambient temperature or less where the impact of the entropy term is less important. Even in those cases where photoinitiated entropy-controlled chiral reactions have been studied, the entropy of the incident radiation is not considered and assumed to be lost (due to Kasha's Rule) to the environment (i.e.; Jablonski's ideas) and play no further role. (Inoue, 2004) In other words, the enantio-specificity is a consequence only of matter and not the radiation field within which the matter is resident.

On the other hand, photochemistry with circularly polarized radiation to yield chiral matter is well known as is circularly polarized luminescence from organic light emitting diodes with asymmetry. (Kagan, Moradpour, Nicoud, Balavoine, & Tsoucaris, 1971) (Kuhn & Knopf, 1930) (Farshchi, Ramsteiner, Herfort, Tahraoui, & Grahn, 2011) (Heyn, 2011) [Thermal radiation generated in a magnetic field is circularly polarized; magnetic field-free circularly polarized thermal radiation can also be produced, from matter that has no mirror symmetry.] Perceptively, it has been noted that an atom (with a ground electronic state and an excited electronic state) exposed to blackbody radiation is a thermodynamic system and only at absolute zero is the Helmholtz free energy and the energy of excitation equal so that all the photonic energy can be used to perform work. (Ford, Lewis, & O'Connell, 1987) Since blackbody radiation is such with a maximum entropy for the spectral distribution necessary to be absorbed by the ground state photo-reactant, it is inevitable that at elevated temperatures of the photo-reactant, the efficiency of the reaction is the lowest when blackbody radiation, as opposed to other radiation sources, is the initiator of the photoreaction, regardless of the reaction mechanism.

Historically, examination of photo-chemical processes has inherently presumed, by conspicuous omission, that the energy of excitation, E, is equal to the enthalpy, H, available for subsequent reaction, as it is assumed there is no PV work performed concurrent with excitation. [However, see report of volume contraction after photoexcitation, usually due to cis-trans isomerization. The rate of isomerization is so fast that it can be considered to occur with (concurrent with) photoexcitation.] (Mauzerall, Gunner, & Zhang, 1995) (Gensch & Viappiani, 2003) "In most optical systems P and V are constant, thus the change in PV can be excluded from generating work. An exception to this general rule is the phenomenon of sonoluminescence, where UV emission is generated as sound is converted into light through a drastic change in PV." (Manor, Kruger, & Rotschild, Entropy driven multi-photon frequency up-conversion., 2013)

The thermodynamics of electromagnetic radiation is core to the instant invention and shall hereinafter be more completely revealed. The relationship between the energy of excitation and the free energy available to perform work is often assumed to not be impacted by entropy. The thermodynamic equation for a photo-initiated process is:

$$dG=dH-TdS=dE+d(PV)-TdS=h\nu_0+PdV-TdS \qquad (16):$$

The enthalpy is the change in energy concurrent with excitation plus any PV work so performed; assuming no PV work concurrent with excitation (within the period that an electromagnetic wave passes, at the speed of light, by a chromophore of a particular molecular size), then the enthalpy change is that of the photonic excitation as commented on, more eloquently, by others:

"If excitation does not change the pigments volume significantly, the increase in enthalpy when the pigment absorbs a photon is the same as the change in internal energy ($h\nu_0$). The pigment's increase in Gibbs free energy per photon absorbed ($\Delta G_p = h\nu_0 - T\Delta S$) then is zero at low light intensities where the enthalpic and entropic terms cancel and increases to $h\nu_o$ at high intensities as $$\left(\frac{n_e}{n_g}\right)$$

approaches 1 and the entropic term drops out." (Knox & Parson, Entropy production and the Second Law in photosynthesis., 2007) (Yarman, Kholmetskii, Arik, & Yarman, 2018)

This rather interesting insight attributed to Mr(s). Knox and Parsons, by way of the references included herein, is that the entropy of excitation is essentially the same as our entropy of mixing (in this case, at the site of our source of "primary radiation") at low intensities however, the Boltzmann thermal distribution governs and $T\Delta S=\Delta H=h\nu_0$. That is, there is no free energy available to perform work with very little intensity. At high intensities $n_e=n_g$ and $$k_B \ln\left(\frac{n_g}{n_e}\right) = k_B \ln(1) = 0$$

so that $\Delta G_p = h\nu_0 - T\Delta S = h\nu_0 - T(0) = h\nu_0$. That is at high intensities, the free energy to perform work with each new photon absorbed is essentially the photonic energy of excitation. Of course, the system must be designed so that the work that is performed is the desired work and not some other means of matter so excited returning to the ground electronic state. This thermodynamic argumentation is important in that it should remind the casual observer that the utility of incident radiative energy is different at very high intensities than it is at very low intensities.

The lucid and convincing argumentation of Mr. Knox and Mr. Parsons has been similarly discussed and debated elsewhere between one Mr. Duysens and one Mr. Kahn (Kahn, 1961)

"A few years ago, I gave a method, mainly based on the second law of thermodynamics, for calculating the maximum efficiency with which light energy can be converted into so-called high-grade energy such as work or Gibbs free energy. (Duysens, The Path of Light Energy in Photosynthesis., 1959) (Duysens & Amesz, Quantum Requirement for Phosphopyridine Nucleotide Reduction in Photosynthesis., 1959) This efficiency approached zero with decreasing light intensity and with increasing temperature of the system for conversion of light energy. An essential condition is that the light is diffuse (so that its intensity cannot be enhanced by means of a lens), or that the light-converting device is as efficient in diffuse as in non-diffuse light. The following, more interesting, reasoning by Dr. Kahn is based upon the statements, with which I agree: (A) the kinetic energy with which an electron is liberated from a photo-sensitive surface is independent of light intensity, even if this intensity approaches zero; (B) the photocurrent is proportional to light intensity. The author (Dr. Kahn) concludes, but incorrectly, as I hope to demonstrate, that the macroscopic work done per unit of absorbed light energy is independent of intensity, and remains a constant positive value, even if the light intensity approaches zero. This conclusion contradicts my result that the efficiency of energy-converting devices must approach zero if the intensity of the light approaches zero." (Duysens, A Note on Efficiency for Conversion of Light Energy., 1962) For reversible processes, the maximum efficiency approaches zero at low intensity and or high temperature; for irreversible photo-processes the actual efficiency is lower than the maximum efficiency.

The essential point of Mr. Duysens is to remind that for a photoreaction, the maximum efficiency approaches zero at low intensity and or high temperature. Be reminded, conversely, that at high radiation intensities a photo-reaction's efficiency may reach a maximum value: singlet-singlet annihilation, which is detrimental to operation of high brightness light-emitting devices, occurs at high radiation intensities.

Of course, the preceding discussion by and between Mr. Duysens and Mr. Kahn is reminiscent of earlier debates of the photoelectric effect first explained by Dr. Einstein in support of his premise that radiation had a distinctly particle-like behaviour. The clear thermodynamic argumentation is that the free energy available for work from a photo-initiated process approaches zero with decreasing light intensity and with increasing temperature of the system. Mr. Duysens is distinguishing between macroscopic work that can be performed (as a function of radiation intensity) versus the kinetic energy generated and the photocurrent produced, which are independent of and proportional to the intensity of the incident radiation, respectively. Dr. Einstein's treatment included comments that the kinetic energy with which an electron is liberated from a photo-sensitive surface is independent of the light intensity (even if the incident light intensity is near zero; see also Dirac). Those dismissing the thermodynamic treatment presume that there is a relationship between the magnitude of the "kinetic energy produced" and the efficiency of the work performed, even though it is well known that the efficiency of a photo-initiated process (the Quantum Yield) is rarely unity. More specifically, Dr. Kahn limited thermodynamic treatment as not in violation of the basic principles of quantum mechanics to this scenario:

"If one were to construct a system such that the photon source and the photoelectric specimen were placed in a perfectly reflecting envelope and sufficient time had passed for the various modes of electron excitation and decay in the specimen to be in equilibrium with the photon gas in the envelope, then the laws of thermodynamics could be applied to this system of photoelectric specimen and light source." (Kahn, 1961)

Inferred is that since a perfectly reflecting cavity with only a photon gas would never reach equilibrium, that then it is the photoelectric specimen that must be perfectly absorbing and perfectly emitting so that a blackbody radiator would reach equilibrium.

As hereinafter defined, once the initial excited state is populated, the subsequent processes may also be affected by entropic and enthalpic parameters that may impact the free energy available to perform subsequent work.

It shall be emphasized in the instant invention that the efficiency of a set of photoreactions approaches zero not only as the intensity of the incident radiation approaches zero but also as the temperature reaches a maximum. The inefficiencies associated with increasing temperature are inevitable and cannot be avoided, regardless of the mechanism by which entropy is increased in the underlying photo-processes. This is not to say that in certain cases increasing temperature cannot be used to avail a system to a particular temperature-enhanced photo-process. It simply means that at some point, in general, with increasing temperature all possible spontaneous photoreaction pathways will be a means of increasing total system-wide inefficiency. The utility and novelty of the instant invention therefore is that increasing temperature, up until a certain point, is utilized to overall increase efficiency of Down-Conversion by populating certain vibrational modes using thermal radiation or infra-red spectral radiation from a source that may be different than the source of primary radiation.

The excitation of a chromophore is defined herein to take place at no more than 1 atto-seconds ($1\times10^{-18}$ seconds), whereas subsequent processes said to be photo-initiated can take place in 1) femto-seconds ($10^{-15}$) or 2) pico-seconds ($10^{-12}$) or 3) nanoseconds ($10^{-9}$) or 4) micro-seconds ($10^{-6}$); or 5) milli-seconds ($10^{-3}$), 6) seconds or 7) hours. For example, it is reported that it takes between five (5) and fifteen (15) atto-seconds to ionize an electron from an atom after the electromagnetic wave first encounters the atom. (Ossiander, et al., 2017) Luminescence after photoexcitation in Down-Conversion takes place optimally between 1 and 100 nanoseconds; that is to say that the optimal rate of luminescence is from $10^7$ to $10^9$ reciprocal seconds.

Radiometry. Before proceeding, the discussion that follows uses terminology that is best presently defined, for clarity. Those radiometric terms identified as "spectral" are those for which the unit of measurement include, for example, "per $Hz^{-1}$" if frequency is the spectrometric term used. When the spectrometric function is integrated out, there is a corresponding radiometric term that remains with "per steradians". Generally, the instant invention is concerned with the radiation field emanating from an internal source, as opposed to that falling upon an external surface. The geometric model presumes a point source that can emit in all dimensions that make up a sphere. There are two additional terms: the area in which the radiation field is exiting and the angle from which it is radiating. The steradian term is actually a dimensionless derived SI unit as it is the area on the surface of a sphere that is the square of the radius from the center of the sphere into which the point source emits. The radiometric measurements that are calculated that include the angle of measurement include, by convention and for clarity, the steradian unit even though the geometric concept is in reality unitless.

Hence, the integration of Spectral Radiance yields the Radiance; Spectral Intensity yields Radiant Intensity; Spectral Radiant Flux (also called Spectral Radiant Power) yields Radiant Flux (also called Radiant Power). This is summarized in Table 1.

The difference between Radiance, Radiant Intensity and Radiant Flux has either the area or steradians integrated out. This summarized in Table 2.

The spectral radiometric terms used herein are:

Spectral Radiance is Watts per steradian per square meter per hertz (SI symbol $L_{e,W,v}$); Radiance of a surface per unit frequency (or wavelength, or wavenumber or angular frequency). The latter is commonly measured in W·sr⁻¹m⁻² Hz⁻¹. This is a directional quantity. This measurement, Spectral Radiance, expressed in frequency, wavelengths or wavenumbers is one of the most common representations of thermal radiation. The thermal radiation model represented by Planck's Law is, in fact, a derivation of Spectral Radiance: $L_{e,\Omega,\nu}$ [W·sr⁻¹·m⁻² Hz⁻¹]. The Spectral Radiance is often provided a different symbol: $B_\nu$ (if evaluated in frequency). The Spectral Radiance is perhaps the most common representation in Planck's Law (see Table 3).

Spectral Intensity is Watts per steradian per Hertz (SI symbol $I_{e,\Omega,\nu}$) Radiant intensity per unit frequency or wavelength. Thus $I_{e,\Omega,\nu}$ [Watts sr⁻¹ Hz⁻¹] Since the frequency units remain, the Spectral Intensity has not been integrated over all frequencies, when so integrated, it yields Radiant Intensity. Since Radiant Intensity has the units Watts sr⁻¹, it has not been extended over the entire surface of a sphere (in other words, it remains a directional quantity).

Spectral Flux is watt per Hertz (SI symbol $\phi_{e,\nu}$); Radiant flux per unit frequency or wavelength. The latter is commonly measured in W·Hz⁻¹. Hence, $\phi_{e,\nu}$ [Watts Hz⁻¹]

The Spectral Exitance (or spectral emittance) is the radiant exitance of a surface per unit frequency. Hence, $M_{e,\nu}$ [Watts m⁻² Hz⁻¹]. It is mathematically assigned as $$M_{e,\nu} = \frac{\partial M_e}{\partial \nu}.$$

The Spectral Exitance is one of the most common forms of measurement for Planck's Law (see Table 3).

The corresponding terms where the spectrometric function has been integrated out are:

Radiant Flux (also called Radiant Power) in Watts (SI symbol $\phi_e$); a measure of Radiant energy emitted, reflected, transmitted, or received, per unit time. This is sometimes also called "radiant power". Hence, $\phi_e$ [Watts].

Radiant Intensity in Watts per steradian (SI symbol $I_{e,\Omega}$); a measure of Radiant flux emitted, reflected, transmitted or received, per unit solid angle. This is a directional quantity. Hence, $I_{e,\Omega}$ [Watts sr⁻¹] Radiant intensity (often simply "intensity") is the ratio of the radiant power (also called Radiant flux) leaving a source to an element of solid angle $d\Omega$ propagated in the given direction. The term Intensity and Brightness is frequently misused in the field of radiometry so particular attention to the formula or the units should be paid when these terms are invoked.

Radiance is in Watts per steradian per square meter (SI symbol $L_{e,\Omega}$). Thus, $L_{e,\Omega}$ [Watts m⁻²sr⁻¹]. The Radiance is the Radiant Flux emitted, reflected, transmitted, or received by a surface, per unit solid angle per unit projected area. This is a directional quantity. Radiance is obtained by integrating the frequency, wavelength, or wavenumber of Spectral Radiance over the entire region of frequency, wavelength, or wavenumbers, respectively. The steradian units remain in the measurement of Radiance but the frequency units are integrated out. The presence of the steradian units indicate that the power per square meter has not been extended to all surfaces of a sphere from which the radiation emits from or on to.

The Radiant Exitance (or the term radiant emittance) is the radiant flux emitted by a surface per unit area. Radiant exitance is often called "intensity" in and this leads to considerable confusion. Hence, $M_e$ [Watts m⁻²]. Parenthetically, it is noted that the radiant flux received by a surface per unit area is called irradiance. The Radiant Exitance is mathematically assigned as $$M_e = \frac{\partial \phi_e}{\partial A}$$

and is the radiometric measurement in the Stefan-Boltzmann Law where $M_e = \sigma T^4$ [Watts m⁻²] and where $\sigma$ is the Stefan-Boltzmann constant.

There are two additionally common radiometric terms:

Radiant Energy in Joules (SI symbol $Q_e$); a measure of energy of electromagnetic radiation (sometimes denoted by E or U). Hence, $Q_e$ [Joules].

Radiant Energy Density in Joules per cubic meter (SI symbol $w_e$); a measure of Radiant Energy per unit volume. This measurement, often called energy density and noted with the symbol $\mu_e$, was perhaps the most instrumental measurement when physicists were first able to provide a model for thermal radiation that was in reasonable alignment between model and experimental data. The volume was calculable as the model was based on a known cavity design. Hence, $w_e = \mu_e$ [Joules m⁻³]. The energy density form of Planck's Law (in terms of frequency) is shown in Table 3.

Irradiance is Watt per square meter (SI symbol E). It is also called Radiant Flux Density.

Radiometric terms are all functions of Energy, usually with respect to the change in energy with time. There are no analogous radiometric terms for entropy (see Table 4), other than the reference of Wright et. al. (Wright, Scott, Haddow, & Rosen, 2001) Hence, an effort to determine the maximum entropy per given energy is fraught with difficulty when the experimental data is obtained using radiometry. Hence, when making such comparisons, it is most helpful to understand the units of measure for the radiometric experiment so as to develop, by modelling, a comparable term for the entropy of the radiation whose energy was measured.

By way of an example, keeping track of the proper units, it was previously noted that the integration of the Spectral Radiant Exitance form of Planck's Law yields the Radiant Exitance in terms of $M_e = \sigma T^4$ [Watts m⁻²]. The Spectral Radiant Exitance is obtained by multiplying the Spectral Radiance by π steradians. It is noted that multiplying the entropy analogue to the Spectral Radiance (for clarity, the Spectral energy Radiance) by it steradians yields the entropy analogue, the Spectral Radiant Entropy Exitance, and when subsequently integrated over all frequencies, yields $\sigma T^3$, the entropy flow rate per unit area. [Watts K⁻¹ m⁻²].

It is also helpful to define the term "power" and the term "work". Power is the amount of energy consumed per unit time; therefore, Radiant Flux is sometimes called Radiant Power. Power, as a function of time, is the rate at which work is done, so it can be expressed by this equation: P=dW/dT. Clearly, then, Work is a measurement of energy. In thermodynamics, Work is differentiated from Heat in that the former is the creation or consumption of energy that provides a useful function. Heat is the creation or consumption of energy that does not itself provide useful Work unless otherwise subsequently converted, always with less than unit efficiency, into Work by, for example, a heat engine. A restatement is "if, while suffering a cyclic process, a body absorbs heat from its exterior, that body must also emit heat to its exterior during the process" or "In other words, the heat supplied to the body undergoing the cyclic process cannot be converted entirely into work: there must be emission of heat from the body as well. The cyclic process cannot operate with perfect efficiency." (Evans, 2014)

As stated hereinbefore, reiterated for the purpose of summarization, 1) all matter generates and emits electromagnetic waves (i.e., radiation, or light) based on the temperature of the matter; 2) this is called thermal radiation which is an important means by which matter dissipates transfers heat; and 3) other means of heat transfer are called heat convection and heat conduction. (Cuevas & Garcia-Vadal, 2018) Although heat is energy and is measured in units of energy, heat in a physical process is often associated with inefficiencies. Of course, heat inefficiencies can be partially reconverted into useful energy in the form of a heat engine. Heat not reconverted raises the temperature of an operating system. Carnot efficiencies can be calculated for heat engines, and this is perhaps the principal reason that heretofore the thermodynamics of radiation has focused more when the primary radiation is thermal (its temperature is known) versus from luminescence. There are many issued patents with respect to light emitting diode lamps that claim to transfer unwanted heat by heat convection or heat conduction or both. (U.S. Pat. No. 10,107,487, 2018) Notwithstanding, there are some beneficial aspects of thermal radiation that make it more desirable as an alternative means to dissipate heat. Observe a so-called 4/3 factor (33% increase), a thermodynamic factor, that shall hereinafter be exploited. (Wright, 2007) (Chukova, 1976) Another element of thermal radiation electro-magnetic waves that shall be exploited is that it is the only known "particle" where the conservation of numbers does not apply. (Buoncristiani, Byvik, & Smith, 1981) (Smestad, Ries, Winston, & Yablonovitch, 1990) (Meyer & Markvart, 2009) [Volume fluctuations is perhaps the only time that photon numbers do not change as a response to changes in the equilibrium state.] (Norton, 2006)

The luminescent state can be activated thermally so that its chemical potential is zero. "Excited states that produce visible radiation can be prepared thermally, but this happens at a very small rate. Indeed, since we expect the upward transition rate to be $$e^{-\frac{\Delta E}{k_B T}}$$

times the radiative rate in fluorescence, we shall wait, on average, $1.9 \times 10^{14}$ years to perceive a red ($\Delta E=1.8$ eV) thermal photon at room temperature." This is a consequence of the exceptionally small high-energy tail (the Wien limit) of the Planck distribution at T=295 K. (Knox, Thermodynamic and the Primary Processes of Photosynthesis., 1969) (Knox & Parson, Entropy production and the Second Law in photosynthesis., 2007) (Knox, Excited-State Equilibration and the Fluorescence-Absorption Ratio., 1999)

When a fluorescent state is excited directly, this tail is effectively amplified. The formalism of Kennard and Stepanov is essentially based upon a shift of the zero of energy in the Boltzmann factor from the ground electronic state to some principal excited electronic state (called standard fluorescence). (Gilmore, 1992) After the preparation of that state the system is assumed quickly to equilibrate with its thermal bath, sufficiently quickly that all of the observed emission originates from the so-equilibrated states." (Knox, Excited-State Equilibration and the Fluorescence-Absorption Ratio., 1999)"However, it should not be assumed that a Boltzmann distribution of the excited electronic sublevels is identical to the Boltzmann distribution of the ground electronic sublevels. Hereinafter, such an assumption will be referred to as 'standard Fluorescence'." (Gilmore, 1992)

Without further clarification at this point, consider the following: in general, "the number of photons in a photon gas is not conserved. However, light emission and absorption processes involve interactions of photons with other quasiparticles, such as electrons, plasmons, excitons, polaritons, etc., and these interactions obey the conservation laws for energy, momentum, and angular momentum. Thus, the number of photons created or annihilated during these interactions cannot always be unrestricted. As a result, photons may derive not only their temperature, but also chemical potential from these interactions." (Boriskina, et al., 2016) (A photon gas is a thermodynamic model, paralleling that of an ideal gas, of electromagnetic radiation in a cavity)

A unique element of thermal radiation, heat transfer from a material to a recipient through radiation, is that it is independent of the emitting material's composition and the molecular bonding chemistry (that on an atomic scale defines the material's properties on a macro scale). Whereas previously mentioned is that there are three types of heat transfer, there are only two: thermal radiation, which is independent of the material's composition, and diffusion, which is transfer through molecular interactions. The latter is a function of, for example, molecular heat capacity; the former is generally thought to be independent of molecular oscillations unique to and characteristic of a radiating material (e.g., vibrations; rotation).

Thermal radiation is also different from thermal diffusion (conduction and convection) in that the latter depends on the temperature gradients and physical properties in the immediate vicinity of the element that is transferring heat to another element of space. In thermal radiation, energy is transferred between separated elements (two separated materials) without the need of a medium between the elements of space. (Siegel & Howell, 1972) A system can and usually does transfer heat by both mechanisms (radiation and molecular diffusion) at the same time and the total heat transferred is a sum of the magnitude for each process. The distance between the source of heat and the recipient of heat is an important consideration, as well, in the context of thermal radiation and molecular or atomic diffusion. Indeed, one can look at three domains of distance: far-field, near-field and contact. Thermal radiation in the far-field is of course that represented by the sun and the earth.

The near field is represented by the distance between source and recipient being closer than the dominant wavelength of radiation that defines the thermal radiation which at ambient is near 10 μm and the heat flux transferred between two blackbody radiators is enhanced by many orders of magnitude called the "super-Planckian" effect. This is attributed to the additional contribution of evanescent waves.

The heat flux enhancement in the near-field regime has good agreement with theoretical models of macroscopic heat transfer, which, however, cannot fully describe heat exchange at distances down to a few nanometres. Such theories generally do not account for the cross-over from near field to contact, in which case the objects are separated by atomic distances and heat flux is mediated by conductive transfer. (Kloppstech, et al., 2017) In the present invention, the transfer of heat is not required to be in the range of atomic distances not required to be, and one can exclude, in the range defined hereby as contact.

To further clarify, phonons (a quantum of energy or a quasiparticle associated with atomics vibrations in a crystal lattice) require matter to exist and cannot propagate in bulk vacuum, although they can transport across vacuum gaps a few angstroms wide. Vacuum phonon transport is a parallel heat-transfer process to near-field thermal radiation, although the length scales over which the two phenomena dominate are different. (Sellan, et al., 2012) Herein contact is defined to include phonon transport across gaps a few angstroms wide.

In Down-Conversion, the primary radiation so produced can yield secondary radiation with up to, no less than, unit efficiency. The term unit efficiency in photo-processes refers to the number of exiting photons subsequently performing useful work to the number of incident photons. On an energy basis, the inefficiencies in the creation of heat are either manifested by that which is disseminated by radiation, thermal radiation, and that which is disseminated via diffusion (convection or conduction). Depending on the origin of radiation, light can be either a worse or a better source of energy to extract work from, compared to heat conduction. (Boriskina, et al., 2016)

In this spirit, a fundamental difference between a thermodynamic view of photo-initiated processes and a quantum mechanical view is whether the units of radiation so produced (in some manner) can subsequently perform useful macroscopic work or not (considered in thermodynamics but not in quantum mechanics which focuses on the microscopic atomic lengths).

The spectral distribution of thermal radiation is from the long wavelength "fringe of the ultraviolet, the visible light region which extends from wavelengths of approximately 0.4 mm to 0.7 mm, and the infrared region which extends from beyond the red end of the visible spectrum to about 1000 mm". (Siegel & Howell, 1972) More than a century ago, a model for thermal radiation had been developed based on the observation called "ultraviolet catastrophe" whereby an algorithm was developed consistent with thermal radiation not extending deep into the ultraviolet region but starting at the "fringe of the ultraviolet" even at very high temperatures, such as that of the Sun.

A Hohlraum Model. The physics of thermal radiation is modelled after a vacuum cavity (a radiator) whose walls are black; they absorb and then subsequently emit all incoming light. There is admittedly a time element to absorbing and emitting subsequently all light which is normally not considered in the treatment of thermal radiation. The vacuum cavity radiator model does not require that all light be initially absorbed nor at all times absorbed, only that when the system reaches equilibrium, then all light is absorbed and subsequently all is re-emitted. This is the essence of the model that appears to be very predictive and thus widely believed to be operative.

The characteristics of a vacuum cavity radiator depends on the surface of the material that comprises the wall of the cavity, an enclosure, and is dependent solely on whether the incident thermal radiation is absorbed or not: it is not dependent on the specific material itself. In this sense posited is that the material indifference of thermal radiation is similar to the material indifference of the entropy of mixing of two different gases (consider Gibbs' Paradox, noted as the entropy of mixing is independent of the materials' composition, only that they be distinguishable). (Paglietti, 2012) Indeed, as Gibbs himself stated: "But if such considerations explain why the mixture of gas-masses of the same kind stands on different footing from mixtures of gas-masses of different kinds, the fact is not less significant that the increase of entropy due to mixture of gases of different kinds in such a case as we have supposed, is independent of the nature of the gases." (Gibbs, 1906)

In general, when radiation (thermal, or not) is incident on a surface, some of the radiation is reflected and some of it is absorbed as the radiation travels through the material. "A careful distinction must be made between the ability of a material to let radiation pass through its surface and its ability to internally absorb the radiation after it has passed into the body". (Siegel & Howell, 1972) As an example, a mirrored surface may reflect most of the incident radiation, but that radiation that does pass into the body of the material will be strongly absorbed. Thus, the mirrored material is said to have strong internal absorption capability but, nevertheless, most of the incident radiation is reflected.

A blackbody is defined as an ideal body—one does not really exist in its full form—that allows all incident radiation to pass through the surface, whatever its geometry and topology, and into the body of the material, i.e., no radiation is reflected at the surface, after which, after passing through the surface, all radiation in the body of the material is absorbed. This is true for all wavelengths and for all angles of incidence. Hence, the blackbody is a perfect absorber of incident radiation. It is also the perfect emitter: at equilibrium. This is the relevant definition that defines the conceptual model, except for perfectly reflecting surfaces (again one does not really exist in its full form), a cavity radiator at equilibrium, once it is reached, will analytically provide results predicted by the blackbody vacuum cavity radiator model.

The initial consideration of cavity radiation is that known as Kirchhoff's Law of thermal radiation, dating from 1859-1860, that may be stated as follows (using the symbols used within the hereinafter referenced review by Mr. Johnson): (Johnson, 2016)

"For an arbitrary body radiating and emitting thermal radiation, the ratio E/A between the emissive spectral radiance, E, and the dimensionless absorptive ratio, A, is one and the same for all bodies at a given temperature. That ratio E/A is equal to the emissive spectral radiance I of a perfect black body, a universal function only of wavelength and temperature'. This radiance, I, is often referred to simply as black radiation." (Johnson, 2016)

Again it is noted that the term "radiance, I" and "spectral radiance, E", referenced by Johnson are in our definition, Radiance with the units Watts per steradian per square meter (SI symbol $L_{e,W}$) and Spectral Radiance with the units Joules per second per steradian per square meter per hertz (SI symbol $L_{e,W,v}$); respectively. Of only historical importance, some have argued that the same observations and conclusions attributed to Mr. Kirchhoff were originally discovered by Mr. Stewart. (Stewart, 1859)

Of importance to today's current understanding of thermal radiation for the transfer of heat, modelled as a blackbody hohlraum, meaning in German a cavity or empty space, both Dr. M. Planck and Dr. A. Einstein made many important contributions. There has been a plethora of reviews of the historical significance of development and understanding of the physics of blackbody radiators with emphasis on the contributions of Dr. Planck and Dr. Einstein, the thermal radiation produced therefrom being dependent only on the temperature of hohlraum. (Wu & Liu, 2010) The treatment of Dr. Planck is a quintessential classical physics treatment and the equations produced therein are classical thermodynamics, although the treatment invoked as an ancillary justification a statistical method of counting, perhaps an obtuse one, that appeared to require oscillator energy states of integer number. (Boyer, 1984) The epistle by Thomas S. Kuhn with its reference to quantum discontinuity is a particular interesting and thorough consideration of the many treatments produced not only in a short period of time (1894-1912) but the many changeable accounts produced by the main characters as well: Dr. Planck and Dr. Einstein. (Kuhn T. S., 1978) Include as a reference for prior art to the instant invention the work of Thomas S. Kuhn and incorporate the references included therein as our own references of the prior art. The quantum discontinuity of the excitation and emission of the matter itself, that comprises the hohlraum, alluded to by Dr. Planck and most certainly reinforced as early as 1903 when Dr. Einstein stated, "During absorption and emission the energy of a resonator changes discontinuously by an integral multiple of R/N ($\beta\nu$)" where "R is the gas constant, N Avogadro's number, $\beta$ a constant". (Kuhn T. S., 1978)

Interestingly, Dr. Planck initially had based his proof on a consideration of perfectly reflecting cavities, rather than blackbody surfaces, but containing "an arbitrarily small quantity of matter" arriving at the same result that Kirchhoff had obtained for perfectly absorbing cavities. Dr. Planck had thereby demonstrated that all cavities either containing some small amount of arbitrary matter, or equivalently having walls completely comprised of arbitrary matter, must also contain black radiation when at thermal equilibrium. (Johnson, 2016) Black radiation is that which cannot be observed as distinct from its surroundings: radiation within, and viewed within, a blackbody cavity. When viewed outside the cavity, of course, the radiation is visible.

Summarizing the main difference between blackbody cavity radiators and those that are not, those with perfectly reflecting walls—if any would such exist—are those that never reach thermal equilibrium. This is an important observation in that if a cavity reaches equilibrium and is not a perfect reflector (otherwise it would not reach equilibrium) and has some absorption, it will closely approximate a blackbody radiator. How long it takes for equilibrium to be reached is another matter. In the review authored by Mr. Johnson, there are many excellent explanations that convincingly demonstrate the universal nature of cavity radiators as long at the walls are not completely reflecting and at least a minor amount of black matter is present therein. (Johnson, 2016)

The classical physics of thermal radiation are more elegantly stated by others:

"Planck maintains that ' . . . the radiation of a medium completely enclosed by absolutely reflecting walls is, when thermodynamic equilibrium has been established for all colours for which the medium has a finite coefficient of absorption, always the stable radiation corresponding to the temperature of the medium such as is represented by the emission of a black body". Note that the quoted statement covers both the situation where the object absorbs and emits over all frequencies, and the situation where some frequencies are not absorbed or emitted at all." (Johnson, 2016) Historians have noted that, indeed, Mr. B. Stewart himself much earlier "made the theoretical leap" that for cavities with perfectly reflecting walls "the sum of the radiated and reflected heat together became equal to the radiation of the lampblack".

Some reviews have suggested that Dr. Planck also introduced the concept of a white body. (Planck, The theory of heat radaition (Translation), 1914) The definitions used by Dr. Planck are:

"When a smooth surface completely reflects all incident rays, as is approximately the case with many metallic surfaces, it is termed "reflecting".

When a rough surface scatters all incident rays completely and uniformly in all directions, it is called "white".

A rough surface having the property of completely transmitting the incident radiation is described as "black".

Dr. Planck defines black materials as those with a rough surface which does not reflect; all incident rays falling on a black material pass through (are transmitted through) Planck's geometrical surface and are subsequently absorbed at some depth in the interior of the blackbody. No rays are reflected from the body even if the material in which it is made is a poor absorber. In other words, "A white body is one for which all incident radiation is reflected uniformly in all directions, an idealization exactly opposite to that of the blackbody." (Cheng, 2014) It has been recently demonstrated that a graphene nanostructure not only shows a low reflectance comparable to that of a carbon nanotube array but also shows an extremely high heat resistance at temperatures greater than 2500 K. The graphene nanostructure, which has an emissivity higher than 0.99 over a wide range of wavelengths, behaves as a standard blackbody material. (Matsumoto, 2013) Graphene fiber has also been fabricated. (Xu Z. G., 2015)

A contemporary of Dr. Planck was Prof. Wien who has briefly been mentioned hereinbefore. His work will be mentioned in more detail hereinafter as it is generally agreed that Dr. Planck's work was an improvement on the earlier disclosures by Prof. Wien of his eponymous Wien's approximation. A detailed review of "Radiation Theory and the Quantum Revolution" by Joseph Agassi reveals from Prof. Wien's 1911 Nobel Prize winning speech his focus on white cavities to replace black cavities. (Agassi, 1993) The story repeated by Agassi in his indomitable style was that the blackbody thermal radiation remains the same even if then placed in a white body. See page 96 and 97 in Agassi's review.

Light Rays, Light Scattering, Light Reflection. This our first mention of rays of light. Of course, "light is electromagnetic wave phenomenon described in the form of two mutually coupled vector waves, an electric-field wave and a magnetic-field wave. Nevertheless, it is possible to describe many optical phenomena in the form of scalar wave theory in which light is described by a single scalar wavefunction, called wave optics. When light propagates through and around objects whose dimensions are much greater than the wavelength, the wave nature of light is not readily discerned, so that its behaviour can be adequately described by rays obeying a set of geometrical rules. This model is called ray optics or geometrical optics (the limit of wave optics when the wavelength is infinitesimally small) and is the simplest theory of light (as compared with quantum optics)". (Saleh & Teich, 1991)

Previously mentioned has been both reflection and scattering. They are generally used to mean the same thing: light not penetrating the body of the material and therefore not being absorbed nor subsequently emitted. These optical properties of "rays of light" are generally surface phenomenon associated with solid state materials. In this instant invention, posited is that cavities whose walls are white scatter in all possible directions all incident light. The difference between reflection from a white "scattering" surface and reflection from a "mirroring" surface is Lambertian reflectance and specular reflectance, respectively. In specular reflectance, each incident ray is reflected at the same angle to the surface normal as the incident ray, but on the opposing side of the surface normal in the plane formed by incident and reflected rays. In Lambertian reflectance, the surface's luminance is isotropic, and the luminous intensity obeys Lambert's cosine law. Scattering is equated with Lambertian reflectance without regard to materials composition and assuming the scattered rays are isoenergetic with the incident rays. [Models for scattering also includes those where energy is lost and even where energy is gained, from the environment.] For the blackbody radiator, the internal black surfaces are ones where incident rays initially "pass through" and subsequently are "absorbed" as opposed to simply "absorbed".

While ray optics is a simplification of wave optics, itself a simplification of quantum optics, it is a remarkably useful classical mechanics model that is consistent with many historical experimental results on the interaction of light with matter. Further, with consideration of the Correspondence Principle—when the quantum numbers (energy) is large, the quantum mechanical system behaves according to (in correspondence with) the classical description—ray optics helps set up the classical thermodynamic treatment of thermal radiation.

Ray optics also brings into consideration the principle of least action. More specifically, in ray optics, Fermat's principle or the principle of least time, named after French mathematician Pierre de Fermat, is the principle that the path taken between two points by a ray of light is the path that can be traversed in the least time. Fermat's principle is the link between ray optics and wave optics.

Fluctuations from Equilibrium. Equilibrium states are core to understanding of cavity radiation. Thermal fluctuations are random deviations of a system from its average state, that occur in a system at equilibrium. All thermal fluctuations become larger and more frequent as the temperature increases, and likewise they decrease as temperature approaches absolute zero. As one example, a closed system in thermal equilibrium, such as a molecular gas in an adiabatic enclosure, is characterized by statistical fluctuations in energy. "Let us consider a thermodynamical (sic) system, which will be divided into two parts: one relatively small, called from now on "system", and a larger one, with the name "reservoir". Exchange of energy between these two parts will result in fluctuations of energy of the smaller "system" near a certain equilibrium energy E. General thermodynamic laws give a well-known equation attributable to Dr. Einstein:" (Kojevnikov, 2002)

$$\overline{\Delta E^2} = \overline{E^2 - 2E\overline{E} + \overline{E}^2} = \overline{E^2} - \overline{E}^2 = k_B T^2 \frac{dE}{dT} = k_B T^2 C_V \quad (17)$$

where $$\Delta E = \in = E - \overline{E} = E - \langle E \rangle \quad (18):$$

and where
$\overline{E^2}$ is the mean of the square of the equilibrium energy E; and
$\overline{E}^2$ is the square of the mean equilibrium energy; and that $\Delta E$ and $\in$ are redundant symbols as are $\overline{E}$ and $\langle E \rangle$.

Blackbody thermal radiation is said to have the maximum entropy to ensure that any deviations from maximum entropy result in a return to the state of equilibrium. The root mean square of the energy fluctuation, $\Delta E_{rms}$, is then $$\Delta E_{rms} = \sqrt[2]{\overline{\Delta E^2}} = \sqrt[2]{k_B T^2 C_V}. \quad (19)$$

Here, $C_V$, is the heat capacity at constant volume which has the thermodynamic identity of $$C_V = \left(\frac{\partial E}{\partial T}\right)_V.$$

The above equation is derived from determining the entropy fluctuation, $\Delta S$, corresponding to an energy fluctuation, $\in = E - \langle E \rangle = E - \overline{E}$, in the following form: (Irons, 2004)

$$\Delta S = \left(\frac{\in^2}{2T^2}\right)\left\{\left[\frac{1}{\left(\frac{\partial \langle E \rangle}{\partial T}\right)_V}\right]\right\} \quad (20)$$

If one knew the equilibrium energy, E, for the system in contact with a reservoir, one could simply insert and take the derivative with respect to T. Regarding fluctuations from equilibrium associated with radiation, one does have knowledge of the energy, E. The energy density of a blackbody system (an equilibrium between thermal radiation and matter) is known and is:

$$\mu(v, V) = Z_V U_V = \overline{E} = \langle E \rangle \ge \frac{8\pi v^2}{c^3}\left[\frac{hv}{e^{\frac{hv}{kT}} - 1}\right] \quad (21)$$

Recall that the Radiant Energy Density in Joules per cubic meter (SI symbol $w_e$) is a measure of Radiant Energy per unit volume. The energy density form of Planck's Law—there are many forms of this law—is obtained by multiplying the energy by $4\pi/c'$ (Rybicki & Lightman, 1979) (Ore, 1955)

The form used by Dr. Einstein was the energy density of the system (as a function of frequency and Temperature) times the volume, V, of the system, to be integrated over all frequencies $$E = \frac{8\pi v^2}{c^3}\left[\frac{hv}{e^{\frac{hv}{kT}} - 1}\right]Vdv = D\left[\frac{hv}{e^{\frac{hv}{kT}} - 1}\right] \quad (22)$$

where D is a constant. Note that $$\frac{\overline{E}}{D} = \frac{\langle E \rangle}{D} = \left[\frac{hv}{e^{\frac{hv}{kT}} - 1}\right] \quad (23)$$

then $$\frac{dE}{dT} = \frac{hv}{k}D\left\{\frac{\frac{hv}{e^{k_B T}}}{T^2\left(e^{\frac{hv}{kt}} - 1\right)\left(e^{\frac{hv}{kt}} - 1\right)}\right\}. \quad (24)$$

Thus, is found the term dE/dT therefore and recall that $$\overline{\Delta E^2} = \overline{E^2 - 2E\overline{E} + \overline{E}^2} = \overline{E^2} - \overline{E}^2 = k_B T^2 \frac{dE}{dT} = k_B T^2 C_V. \quad (25)$$

Then $$\overline{E^2} - \overline{E}^2 = k_B T^2 D \frac{h\nu}{k_B} \left\{ \frac{\frac{h\nu}{e^{k_B T}}}{T^2 \left(e^{\frac{h\nu}{kt}} - 1\right)\left(e^{\frac{h\nu}{kt}} - 1\right)} \right\} \quad (26)$$

$$\overline{E^2} - \overline{E}^2 = \left\{ Dh\nu \left\{ \frac{e^{\frac{h\nu}{k_B T}}}{\left(e^{\frac{h\nu}{kt}} - 1\right)\left(e^{\frac{h\nu}{kt}} - 1\right)} \right\} \right\} = \quad (27)$$

$$\left\{ Dh\nu \left\{ \frac{e^{\frac{h\nu}{k_B T}} - 1 + 1}{\left(e^{\frac{h\nu}{kt}} - 1\right)\left(e^{\frac{h\nu}{kt}} - 1\right)} \right\} \right\} = \left\{ Dh\nu \left\{ \frac{\left(e^{\frac{h\nu}{k_B T}} - 1\right) + 1}{\left(e^{\frac{h\nu}{kt}} - 1\right)\left(e^{\frac{h\nu}{kt}} - 1\right)} \right\} \right\} =$$

$$\left\{ Dh\nu \left\{ \frac{1}{\left(e^{\frac{h\nu}{kt}} - 1\right)} + \frac{1}{\left(e^{\frac{h\nu}{kt}} - 1\right)\left(e^{\frac{h\nu}{kt}} - 1\right)} \right\} \right\} =$$

$$\left\{ \frac{D}{\left(e^{\frac{h\nu}{kt}} - 1\right)} \right\} \left\{ \frac{h\nu}{1} + \frac{h\nu}{\left(e^{\frac{h\nu}{kt}} - 1\right)} \right\} =$$

$$\left\{ \frac{D}{\left(e^{\frac{h\nu}{kt}} - 1\right)} \right\} \left\{ \frac{h\nu}{1} + \frac{h\nu}{\left(e^{\frac{h\nu}{kt}} - 1\right)} \right\} = \left\{ \langle E \rangle \left\{ \frac{h\nu}{1} + \frac{\langle E \rangle}{D} \right\} \right\}.$$

The resulting expression, as usually written, where $\langle \Delta E^2 \rangle$ is the mean squared Energy, $\langle E \rangle$ is the mean (average) Energy, $\langle E_\nu \rangle^2$ is the square of the Energy in the frequency range between $\nu$ and $\nu + \Delta \nu$, and V is the volume of the blackbody radiator:

$$\langle \Delta E^2 \rangle = \overline{E^2} - \overline{E}^2 = h\nu \langle E \rangle + \frac{\langle E_\nu \rangle^2}{D} \quad (28)$$

$$\langle \Delta E^2 \rangle = h\nu \langle E \rangle + \frac{\langle E_\nu \rangle^2}{8\pi V \frac{\nu^2}{c^3} \Delta \nu} \quad (29)$$

which contains two terms for the change in mean squared energy, one of which Dr. Einstein identified with wave behaviour and one with particle behaviour, leading to the uniquely his hypothesis of the wave-particle duality of light. The various arithmetic means and theoretical incongruities deriving the fluctuation equation is provided in "Einstein's Fluctuation Formula. A Historical Overview" as well as "Reappraising Einstein's 1909 application of fluctuation theory to Planckian radiation". (Varró, 2006) (Irons, 2004)

One simply notes that the thought experiment conceived by Dr Einstein is of a perfectly reflecting system inside a perfectly absorbing reservoir: a situation that should prevent the specific system-radiation equilibrium envisioned from being established for a very long time. Nevertheless, if the system is not perfectly reflecting, then it may take a long time, but the fluctuation states are still accessible as the system and the reservoir near equilibrium. It should be clear that if these fluctuation states once reached from an equilibrium and then return to the same equilibrium, then the same states, if reached prior to the initial equilibrium, will lead to the same equilibrium. Perhaps the thought experiment of Dr. Einstein, a blackbody radiator outside of a perfectly reflecting radiator conversely parallels the blackbody radiator inside a white body hohlraum of Prof. Wien, yet with the same conclusion: generally thermal radiation is of the same entropy regardless of the wall construction otherwise work could be extracted from two different bodies at the same temperature—clearly an absurdity as expressed in the characteristic words (view) of Agassi.

By way of background, noted is the statistical mathematics definition of variance of X is equal to the mean of the square of X minus the square of the mean of X. The Einstein fluctuation formula—not without controversy—gives the variance (mean square deviation) of the energy of blackbody radiation in a narrow spectral range in a sub-volume of a cavity surrounded by perfectly reflecting walls. The formula is also said to contain two terms as the "particle-term" (the Wien term) and the "wave-term" (the Rayleigh-Jeans term). (Irons, 2004)

The fluctuations are assumed to be a result of a divergence from and return to equilibrium, but perfectly reflecting walls should never reach the equilibrium hypothesized as being operable. It has been postulated recently that blackbody radiation within a real cavity exhibits the thermal fluctuations predicted, but the fluctuations, with their "wave" and "particle" components, as argued, have their origin in the wall material (the matter) and are not intrinsic to radiation. (Irons, 2004) This concept of duality being a characteristic of matter or the interaction of matter with radiation, as opposed to an intrinsic characteristic of radiation itself is a long-based deliberation but is not essential to resolve for the purpose of the instant invention. It is reported that a better received derivation of the Planckian model was ultimately provided in 1917. (Bacciagaluppi, 2017) (Einstein, On the Quantum Theory of Radiation, 1917)

Nevertheless, a more rigorous treatment for fluctuations of the radiation field remains unresolved to this date and the true meaning of radiation duality is unclear: "there are two models of quantum phenomena and both lead to equivalent results. One can start either from the classical concept of a particle, or from classical wave concept and arrive at essentially the same quantum theory by quantizing one or the other". (Kojevnikov, 2002) It is unclear in that such duality is said to be a consequence solely of the measurement technique used and is not an intrinsic property—both simultaneously wave and particle—of radiation.

Still, the debate brings home the point, which is the instant invention's main interest, that unless a cavity radiator is perfectly reflecting, the rules governing cavity derived thermal radiation seem to approximately apply even if not perfectly absorbing. It should also be repeated that a state which is accessible via fluctuations from an equilibrium state is also accessible for a system prior to reaching its equilibrium state.

Material Indifference with Thermal Radiation. Why thermal radiation is independent of the chemistry associated with the composition of the cavity radiator is of course not completely clear, especially considering the wave-particle duality may not emanate from thermal radiation itself but may have their origin in the wall material of the vacuum cavity radiator. (Irons, 2004) [The material used in the hohlraum radiators were initially platinum cylindrical enclosures lined with iron oxide and subsequently with chromium, nickel and cobalt oxides, and enclosed in a larger asbestos cylinder.] (Mehra & Rechenberg, 2001) In the instant invention, in use are envelopes, glass cavities, mirrored or not, which contain the phosphor upon which the primary radiation is incident. Whereas in a perfect black body design, the walls are perfectly black, the black body theory does not require that, as long as the walls are not perfectly reflecting. Hence, one can simulate a hohlraum using coatings of phosphors.

There have been some arguments (hypotheses) to explain the lack of a molecular signature in thermal radiation. "The reason for cavity radiation having a characteristic spectrum which does not show the specific fingerprint of the boundary material is the entropy of the closed radiation system which takes a maximum value at the equilibrium conditions." (Kabelac, 2012) This mechanism to transfer heat, which maximizes the entropy of the transfer as well as offering the characteristic energy of the transfer, negates or perhaps obscures the signature of molecular and atomic interactions of the material that comprises the body of the cavity. In this case, the maximum entropy seems to reflect the maximum amount of information that is missing that otherwise would allow one to describe the material that is in equilibrium with the radiation field (the maximum number of states that are in equilibrium with the radiation field, information about which is missing; hence all possible states are equally probable). (Giffin, 2008) (Jaynes, Information Theory and Statistical Mechanics., 1957)

Materials that are not perfect blackbodies may also reveal signatures of electronic transitions under thermal heating: "under a voltage bias, metals and semiconductors show thermal emissions emulating a blackbody with additional emissions displaying a signature of "electron: hole" recombination unique to that metal or semiconductor". (Liu, 2011) Thermal emission, clearly a general process for all matter, is perhaps only "unique" in a perfect blackbody in that the appearance of molecular signatures are completely obscured whereas thermal emission in general may include molecular signatures if the equilibrating material only approximates a blackbody (i.e., most materials are not blackbodies). It is not clear if it is the equilibrium once attained that obscures the material's signature or if it is the benefit of obtaining maximum entropy—itself available only at equilibrium, or fluctuations therefrom. "Thermodynamically, a system in equilibrium maximizes entropy because we have no information about its initial condition (except for conserved quantities): equipartition means no memory." That a molecular signature is normally represented by spectroscopic examination (i.e., characterized by the electromagnetic radiation absorbed or emitted), itself not a conserved quantity, may be the reason that thermal radiation at equilibrium cannot reveal the characteristic of a perfect blackbody. [As noted by Mr. Barton, "we start by stressing the familiar truth, that no spectroscopic information specific to the system can be obtained as long as the system remains in overall thermal equilibrium: all that one then sees is the universal black-body spectrum." ] (Barton, 1987)

Thermodynamic Entropy. At its simplest, it is acknowledged that entropy, S, times temperature, T, has the units of energy. In traditional thermodynamics, heat is in units of energy; work is in units of energy; "T x S" is in units of energy. In the thermodynamic equations of state, entropy is an important consideration, and are reminded of the two key thermodynamic equations for the functions called free energy, which is the remaining energy free to perform work: the Gibbs free energy, G, and Helmholtz free energy, A (sometimes expressed as F), are in units of energy. The quintessential thermodynamic equations, in exact differential form, are:

$$dG=dH-TdS \qquad (30):$$

and $$dA=dE-TdS. \qquad (31):$$

For a process in which energy is transferred both as work and heat, the law of conservation of energy says that the energy of the systems obeys the equation $$dE=\delta q+\delta w \qquad (32):$$

where dE is the exact differential of internal energy; $\delta q$ is the inexact differential of heat and $\delta w$ is the inexact differential of work (path dependent). All state functions are exact differentials (path independent). Thermal radiation transports heat: luminescence is radiation with a chemical potential. The present invention performs Down-Conversion at a temperature at which the chemical potential of luminescence approaches zero, as shall hereinafter be demonstrated how to accomplish.

In the integrated form, the exact differential, for a process in which energy is transferred both as work and heat, is $$E=q+w \qquad (33):$$

It can be observed that radiation exerts pressure on matter with which it interacts, as radiation carries with it momentum, and the change in momentum with time, $$\text{delta}(p)/\text{delta}(t)=\text{delta}(mv)/\text{delta}(t)=m\text{delta}(V)/\text{delta}(t)=ma=F, \qquad (34):$$

occurs from the force applied to the radiation by the surface and the opposing force applied by the radiation to the surface. However, under customary and usual (normal) terrestrial circumstances, radiation pressure is too small to be observed. Hence, our thermodynamic treatment considers radiation of all types, thermal or luminescence, to be principally the transfer of energy (i.e.; the conservation of energy) and one perhaps can safely ignore the requirements for transfer of momentum (i.e.; the conservation of momentum) (Bartoli, 1884) (Bradshaw, 2017)

This is not to say that the consideration of radiation pressure did not play a role in the evolution of the interaction of radiation with matter. As recent historical review has noted:

"By arranging black and reflecting cavities it was possible to construct a cyclic process in which heat was transmitted from one body to another. The cavity radiation could be handled by the usual methods of thermodynamics. To remain consistent with the second law, one had to assume that radiation exerted a pressure so that a performance of work would compensate for the transfer of heat." (Badino, 2015)

Of course, the conservation of momentum is a fundamental law of physics which states that the momentum of a system is constant if there are no external forces acting on the system. It is embodied in Newton's first law (the law of inertia). The law of conservation of energy states that the total energy of an isolated system remains constant, it is said to be conserved over time. This law means that energy can neither be created nor destroyed; rather, it can only be transformed or transferred from one form to another.

While it was long ago recognized that the field of thermal radiation was a special case where thermodynamics of mechanical systems may be applied to electromagnetic waves (or "photons", whatever the case or one's preference may be), it is generally accepted that a key step in the thermodynamic study of blackbody radiators was that embarked near 1900.

The thermodynamic treatment considers (for a cavity radiator that, when heated, generated thermal radiation) an equilibrium interaction, between the Radiated flux or "Radiated power" (energy per unit time) of a mechanical resonator with an electromagnetic field, is generated. This equilibrium is expressed in the terms of power and spectral power as the accompanying experiments would measure power and spectrum of the generated thermal radiation. This is interesting in that thermodynamics does not have a time element associated with it (other than perhaps the Second Law may be viewed as meaning "later", which equates with "more random"). (Denbigh, 1953) Indeed, a core element of classical thermodynamics is based on evaluating systems at equilibrium even though it is recognized that the thermodynamic system being analysed may take an exceedingly long time to reach equilibrium. (Brown, 2001)

More specifically, the equilibrium situation is the loss of oscillator energy to energy absorption by the electromagnetic field and back again: a good absorber (the oscillator) is a good emitter (the oscillator). Absorption of energy and emission of energy, back again, by the oscillating radiation field and the emission of energy and the absorption of energy, back again, by the oscillators comprising the surface is the essential equilibrium situation. Negating the importance of the time element of Power, the equilibrium relationship then to be discerned is between the energy of the oscillator (called resonators) and the energy of the thermal radiation.

In other words, the cavity radiator spectral distribution can be considered from the perspective of the electromagnetic field, or from the perspective of the oscillating electrons in the matter surrounding the cavity. Because there is thermodynamic equilibrium between the radiation and the surrounding matter in a closed structure, the two approaches are equivalent. (Reiser & Schachter, 2013) If one considers the oscillating electrons to form, in transient, partial radical ion negative and partial radical ion positive charges at distances whereby they lose correlation, then a magnetic field effect on blackbody radiation is anticipated and indeed a small effect has been observed. It is expected that the magnetic field effect would increase with increasing temperature of the blackbody radiator.

At the time of the 1900's, the atomic view of matter was still unclear and hence the nature of the oscillators was not explored in a treatment proffered by Dr. Planck; in his analyses: " . . . he could not even say for certain what the oscillators were or why they were oscillating". (Galison, 1981) [Indeed, many things about molecules that is presently common knowledge was not known at the time of Dr. Planck's pioneering work in physics; see, for example, "It is still very uncertain", Dr. Planck wrote in his Treatise on Thermodynamics, "whether the molecules of liquid water are the same as those of ice. In fact, the anomalous properties of water in the neighbourhood of its freezing point make it probable that even in the liquid state its molecules are of different kinds."] (Planck, Treatise on Thermodynamics, 1969)

To the instant invention, the Planckian model for blackbody radiators is critical in our treatment of Down-Conversion in that it introduces the importance of the entropy of radiation, whereas all of the existing contemporaneous commentaries on Down-Conversion and secondary radiation for the purpose of light emitting diode General Illumination have focused on energy of radiation. The underlying principle to exploit is the equilibrium of energy of the radiators (or oscillators) with the energy of the thermal radiation produced by heating the radiators (or oscillators) in the perfect blackbody hohlraum. However, the same equilibrium that results in equating energy must also keep the entropy the same or increase with deviations from the equilibrium state: this is the Detailed Balance (Zhu & Fan, 2014) (for a process at equilibrium, the forward rate of each step is equal to the reverse rate of that step) which the instant invention shall hereinafter exploit.

More specifically, for the hohlraum, the equality is considered as the energy of the oscillators in a certain state and the energy density of the radiation emanating from the volume of the blackbody radiator. As more elegantly explained, "At the end, there is a simple relation between the thermal radiation energy density $u=u(v, T)$ and the elementary oscillator energy U (frequently denoted as U in the physics literature, although often used is the notation E). For example, "$u_{(radiation\ energy\ density)}=[8\pi v^2/c^3] \times U_{(elementary\ oscillator\ energy)}$, a fundamental result in Planck's research. The simplest way to understand this relationship is by dimensional analysis, as U is an energy, but u is energy density (energy per unit volume):

$$\left\{\left(\frac{v}{c}\right)^2 d\left(\frac{v}{c}\right)\right\}$$

is a differential inverse volume; $2 \times 4\pi$ comes from polarization and angular integration." (Boya, 2003)

While there are many forms of Planck's formula, it is best to focus on energy density where the general form for the energy density is $$u(v,V)=Z_V U_V \qquad (35):$$

where V is the volume of the hohlraum and v is the frequency of the spectral radiation. (Kramm & Molders, Planck's blackbody radiation law: Presentation in different domains and determination of the related dimensional constants., 2009) (Kramm & Herbert, Heuristic Derivation of Blackbody Radiation Laws using Principles of Dimensional Analysis., 2008) The term $Z_V$ is the spectral mode density of the radiation field enclosed in the hohlraum, in a cavity bounded by, in the words of Kramm and Herbet, perfectly "reflecting" walls. [Again, see the discrepancy between perfectly reflecting walls and perfectly absorbing and then emitting walls: this dichotomy is remindful of the model used by Feynman to describe light scattering. In that model of Feynman, the scattered light is emitted light from decay of an electron from an excited state to a ground state even though no chromophore for absorption is present.]

The spectral mode density has been found, by Dr. Planck and others, before his analyses and after, using classical physics and wave description of electromagnetic radiation:

$$Z_V = \frac{8\pi v^2}{c^3}. \qquad (36)$$

The spectral mode density is coupled with the average energy of the radiation to provide the energy density of radiation enclosed within the hohlraum:

$$\mu(v, V) = Z_V U_V = \frac{8\pi v^2}{c^3}\left[\frac{hv}{e^{\frac{hv}{kT}} - 1}\right] \qquad (37)$$

That above is the modern-day representation of the energy density within the cavity of the hohlraum using modern day constants, as opposed to generic constants of integration. The symbol u is equivalent to the SI symbol $w_e$ for Radiant Energy Density and the symbol U is equivalent to $$\left[\frac{\epsilon}{e^{\frac{\epsilon}{kT}}-1}\right] = \left[\frac{h\nu}{e^{\frac{h\nu}{kT}}-1}\right] \quad (38)$$

with the Radiant Energy Density having the units of Joules per cubic meter. (Varro, 2006)

A mathematical identity of interest is: (Hall, 2013)

$$\frac{1}{e^x - 1} = \sum_{j=1}^{\infty} e^{-jx} = e^{-x} + e^{-2x} + e^{-3x} + \ldots \quad (39)$$

If $$x = \left\{\frac{h\nu}{kT}\right\},$$

then (using the form to be integrated over all frequencies and V is the volume of the cavity)

$$E = \frac{8\pi\nu^2}{c^3}\left[\frac{h\nu}{e^{\frac{h\nu}{kT}}-1}\right]Vd\nu \quad (40)$$

and $$E = \frac{8\pi\nu^2}{c^3}\left[\frac{1}{e^{\frac{h\nu}{kT}}-1}\right]h\nu Vd\nu = \frac{8\pi h\nu^3 Vd\nu}{c^3}\left[e^{-\frac{h\nu}{kT}} + e^{-\frac{2h\nu}{kT}} + \ldots\right] \quad (41)$$

Thermodynamics of Thermal Radiation—The Entropy of Radiation. The thermodynamic evaluations of mechanical systems were well known at the time of Dr. Planck and the first and second derivatives of various thermodynamic relationships was also clear and of known importance. "An important quantity in thermodynamics is the second derivative of the entropy, this is closely related to the Second Law: negativity of the second derivative guarantees that the entropy will increase back to equilibrium if the system is disturbed." (Bova, 2003)

Perhaps the first introduction of radiation entropy is, it has been demonstrated, by a contemporary of Dr. Planck:

"(However,) Wien noticed that if a cavity full of radiation is a genuine thermal system, it must be possible to assign a temperature, and even an entropy, to it . . . ". For the black-body radiation, all components (at different wavelength, polarization state, and direction of propagation) have the same temperature, although the energy density differs. The uniformity of the temperature, Wien noticed, derives from the fact that "these components are independent from one another, because we can produce a radiation that contains only one component . . . This suggests that a cavity radiation is analogous to a mixture of gases of dissimilar chemical species."

Why this is of importance—the second derivative to reflect a maximum—is not so clear other than to support the hypothesis that thermal radiation is an electromagnetic field of a type that has the maximum entropy carried by it, versus non-thermal electromagnetic fields that carry less entropy than the maximum. The significance of this would be, perhaps, associated with the usual fluctuations of a system normally at equilibrium (as in the fluctuation theory developed by Dr. Einstein): negativity of the second derivative guarantees that the entropy will increase back to equilibrium if the system is disturbed. The historical impetus for considering that fluctuations of cavity radiation, normally at equilibrium, should necessitate a return to maximum entropy for the radiation emanating therefrom is driven by the fact that thermal radiation is defined at an equilibrium state: thermodynamic reactions at equilibrium have the maximum entropy (and Gibbs free energy at zero and Helmholtz free energy at a minimum). This was a fundamental assumption introduced by Dr. Planck and equilibrium thermodynamics provided a path forward simply using second derivatives of entropy to energy.

In thermodynamics, because of Maxwell Relations, there is almost an infinite set of second derivatives or partial derivatives, some with significant physical meaning. With respect to the state function entropy, the Principle of Maximum Entropy states that at equilibrium, $dS=0$ and $d^2S<0$. One can solely use second derivatives of entropy as other justifications originally advanced are supportive of, but not necessary to be and generally were not included within, the mathematical treatment that yields the energy density of the radiation enclosed within the hohlraum. The Radiance associated therewith and the spectral distribution thereof, of course, are the characteristics of the radiation that exits the hohlraum, to be used in the universe to performance work and to transfer heat (some of which may be converted back to perform work using a heat engine).

If one considers a thermodynamic system's energy, U, based on the entropy, S, the volume, V and the number of "particles, N, $U_{S,V,N}$, there are nine second order differentials, only six of which are unique: one that is unique is $$\left[\frac{d^2 U}{dS^2}\right].$$

The mathematics associated with the entropy to energy treatment of blackbody cavity radiators is essentially an integration of a differential equation. A starting point for this approach may be considered in a very simple form whereby the negative sign indicates an entropic maximum, as is required in the theory of Dr. Planck:

$$-\left[\frac{d^2 S}{dU^2}\right]^{-1} = C \cdot \nu \cdot U. \quad (51)$$

where C is a constant not otherwise defined and U and S are the energy and the entropy of the resonator (oscillator) of the blackbody that interacts with (and in equilibrium with) the electromagnetic field enclosed therein and v is the radiation frequency. (Martinelli, 2017) At some point in the arithmetic model, energy U and entropy S of the radiators must become the energy and the entropy of the thermal radiation. Consequently, this second differential equation, at the least, assured that the entropy (of the thermal radiation) is a maximum, for a particular relevant energy of the oscillator, in equilibrium with the thermal radiation. As one knows, the energy of radiation is a function of a Constant times the frequency. Hence, the second differential used as a starting point will be a function of the square of the energy as U is also included at the starting point. Since the second differential is a function only of S and U, at this point the frequency is a variable not changed. However, to obtain the total energy and total entropy, one would then have to integrate to dv after obtaining the energy and entropy at only one v.

Parenthetically, it is noted that the first derivative $$\frac{dS}{dU} = \frac{1}{T} = \frac{dS}{dE} \tag{52}$$

is well known as the thermodynamic temperature, T (and the symbol "U" is redundant with the symbol "E"). (Boya, 2003) The utility of the thermodynamic temperature is that it provides an opportunity to change the evaluation of the experimental results from discerning a relationship between frequency and temperature (those which are measured experimentally) to distinguishing a relationship between entropy and energy. For a cavity radiator, the temperature at which thermal radiation is in equilibrium with the matter (material) that is radiating is clear. It is not always clear what is the entropy and energy of the same system. It is noted that "(T)temperature is fundamentally a statistical concept requiring many bodies. If the distribution of energies is broad, the temperature is high. If the distribution of energies is narrow, the temperature is low. Temperature is basically a measure of the half-width of the distribution". (Rabinowitz, 2006)

The thermodynamic temperature equation allows for the model of the hohlraum at a particular temperature (which emits a characteristic spectrum of frequencies of radiation) in an experimental volume of the cavity itself, is what links entropy and energy and more importantly, entropy density and energy density. Thus the search for the solutions to the second differential, which ensures entropy is a maximum to the energy, will yield a relationship of entropy in terms of frequency and energy and energy in terms of entropy and frequency, expressed in the forms of density (to remove the Volume sensitivity to the relationship). When integrated over all frequencies, the solution to the second differential then becomes extended to total energy density and total entropy density. The fundamental question then becomes what the mathematical expression of entropy to energy is that is accurately defining the second differential of their relationship.

Other well-known thermodynamic relationships are:

$$-\left[\frac{d^2U}{dS^2}\right]^{-1} = \frac{d^2A}{dT^2} = -\frac{dS}{dT} = \frac{C_V}{T} = \frac{1}{T}\frac{dU}{dT} \tag{53}$$

Note that $$C_V = T\left(\frac{\partial S}{\partial T}\right)_{V,N};$$

in addition, $$C_V = \left(\frac{\partial U}{\partial T}\right)_{V,N} = \left(\frac{\partial E}{\partial T}\right)_{V,N},$$

as the symbol "U" is redundant with the symbol "E".

The thermodynamic temperature being expressed in terms of entropy and energy is an identity that appears in many theoretical treatments to develop models for energy and, perhaps, is a major motivation for seeking, by experiment or by model, an equilibrium situation among the system parameters.

Please note that the heat capacity at constant volume is $C_V$ whereas the term $C \cdot v$ is a to be defined constant C multiplied by the frequency v. Note that an essentially equivalent relationship was written in "Planck, Photon Statistics, and Bose-Einstein Condensation" as shown:

$$-\left[\frac{d^2S}{dU^2}\right]^{-1} = C \cdot v \cdot U \xrightarrow{yields} \left[\frac{d^2S}{dE^2}\right] = -\frac{1}{bv\epsilon} \tag{54}$$

Also, see Equation 2.13 in Statistical Physics: A Probabilistic Approach by Bernhard Lavenda. (Lavenda, 1991)

The nomenclature symbol "E" is frequently used instead of "U"; and where "$\epsilon$" is energy of the oscillator.

Starting from $$-\left[\frac{d^2S}{dU^2}\right]^{-1} = C \cdot v \cdot U \tag{55}$$

with some minor algebraic reformulation, $$\int \left(\frac{dS}{dU}\right)\left(\frac{dS}{dU}\right) dU = -\left(\frac{1}{C \cdot v}\right) \int \left(\frac{1}{U}\right) dU \tag{56}$$

which is then integrated to yield $$\left(\frac{dS}{dU}\right) = -\left(\frac{1}{C \cdot v}\right)(\log_e U + b_1) \tag{57}$$

The term $b_1$ is the arbitrary constant of integration not otherwise defined.

Consequently, rearranging $$dS = -\frac{1}{C \cdot v}(\log_e U + b_1) dU \tag{58}$$

and inserting the definition for the thermodynamic temperature, $$dS = T^{-1} dU \tag{59}:$$

which follows from the well-known thermodynamic relation $$\frac{dS}{dU} = \frac{1}{T} \tag{60}$$

Setting dS equalities consequently yield $$-\left(\frac{1}{C \cdot v}\right)(\log_e U + b_1) dU = T^{-1} dU \tag{61}$$

and, consecutively, $$(\log_e U + b_1)(dU) = -C \cdot v T^{-1} dU \tag{62}:$$

$$(\log_e U + b_1) = -C \cdot v T^{-1} \tag{63}:$$

$$(\log_e U) = -[C \cdot v T^{-1} + b_1] \quad (64)$$

$$e^{\log_e U} = e^{-[C \cdot v T^{-1} - b_1]} = (e^{b_1})(e^{-C \cdot v T^{-1}}). \quad (65)$$

One can then solve arithmetically for U, by rearranging and setting these terms to be exponents of e. Thus, $$e^{\log_e U} = U = K\left[\frac{1}{e^{\frac{C \cdot v}{T}}}\right] = K e^{-\frac{C \cdot v}{T}} \quad (66)$$

where K is an integration constant, $e^{b_1} = K$, and $C \cdot v$ is the function of frequency (constant C times the frequency, $v$) from the initial second differential equation relating entropy to energy. The form of this equation is Wien's approximation (also sometimes called Wien's law or the Wien distribution law), determined by Mr. Wien solely on an empirical basis. In modern days terminology, Wien's distribution law is written as $$\left(\text{where } C \cdot v = \frac{h}{k}v\right).$$

$$L(v, T) = \left[\frac{2hv^3}{c^2}\right]e^{-\frac{hv}{kT}} \quad (67)$$

Note that at this point there is no need to introduce any quantum of discrete energy for the oscillators (nor for the radiation itself that results from energy transfer by and between the oscillators and the radiation field). Clearly the constant C in the mathematical approach is presently equated with the constant h/k, or Planck's constant divided by Boltzmann's constant. The original second-order differential equation could then have been written as:

$$-\left[\frac{(d^2 S)}{dU^2}\right]^{-1} = \frac{hvU}{k} \quad (68)$$

where the constant C $$C = \frac{h}{k}.$$

[In Kuhn, $\beta$ is the symbol used to represent h/k, which is the present constant C.] (Kuhn T. S., 1978) The omnipresent exponential term then originates from the integration of the 1/U term; itself of such a form due to the relationship of both $$\frac{dS}{dU} = \frac{1}{T}; \text{ and } \frac{d^2 S}{dU^2} \propto \frac{1}{U}. \quad (69)$$

The simple second derivative form presented herein can be found in the classic works of others (that focus on the historical developments of the quantum by Planck) which is presented herein for completeness:

$$-\left[\frac{d^2 S}{dU^2}\right]^{-1} = C \cdot v \cdot U = \frac{hvU}{k} \quad (70)$$

where C is multiplied by v and by U $$\frac{d^2 S}{dU^2} = -\frac{\alpha}{U}; \alpha \quad (71)$$

not defined (Kuhn T. S., 1978) page 96

$$\left[\frac{d^2 S}{dU^2}\right]^1 = -\frac{1}{\gamma v \bar{E}} \quad (72)$$

(Lavenda, 1991), page 75

Dr. Planck had offered a look at how the "energy" of electromagnetic radiation (units not yet known; hence in what form are the unit of energy is not yet determined) is related to the energy of oscillators in thermal equilibrium with the electromagnetic radiation such that the "energy" of both are simply a function of the temperature T of the cavity radiator. It appears that by considering the second derivative of entropy of the oscillators to the energy of the oscillators, ensuring the total entropy is a maximum, Dr. Planck showed how one can then mathematically convert same to determine the "energy" of the thermal radiation.

At this point, a better starting point might be with two constants, C and D, is considered which is expressed as a power series:

$$-\left(\frac{d^2 S}{dU^2}\right)^{-1} = C \cdot v \cdot U + DU^2 \quad (73)$$

Noting that the negative sign is required in order for the entropy to be a maximum.

[In Joseph Agassi's Appendix, the second differential equation does not have a negative sign and is of the form $$\left(\frac{d^2 S}{dU^2}\right) = \frac{a}{U(b+U)} \quad (74)$$

(see page 128) (Agassi, 1993)

Without the negative sign, the double integration is reported as (without explanation) as $$U_v = hv\left(e^{\frac{-hv}{kT}} - 1\right)^{-1} \quad (75)$$

(see Equations (14) and (15))

which is not an identity with Planck's formula.]

Historical teachings focus on the following set of second differential equations:

$$\left(\frac{d^2S}{dU^2}\right) = -\frac{\alpha}{U(\beta+U)} \quad (76)$$

(Kuhn T. S., 1978), page 97
and Planck stated that it yielded $$E = \frac{C\lambda^{-5}}{e^{\frac{c}{\lambda T}}-1} \quad (77)$$

where one gets a radiation formula with two constants, c and C, "which, as far as I can see at the moment, fits the observational data, published up to now, as satisfactory as the best equations put forward for the spectrum, namely those of Thiesen, Lummer-Jahnke, and Lummer-Pringsheim".]

Our starting equation can be re-written to allow for an evaluation that uses a (similar) starting point articulated in other reviews (but missing the actual mathematical proof) which is shown for completeness purposes:

$$\frac{d^2S}{dU^2} = -\frac{1}{CvU+DU^2} = -\frac{\alpha}{U(\beta v+U)} \quad (78)$$

where one arbitrarily assigns the constant C to be $$C = \frac{\beta}{\alpha} \quad (79)$$

and constant D to be $$D = \frac{1}{\alpha}\left(\text{i.e.}; \frac{C}{D} = \beta\right) \quad (80)$$

or as expressed by $$\frac{d^2S}{dU^2} = -\frac{\alpha}{U(\beta v+U)} \quad (81)$$

Note in Boya the starting expression: (Boya, 2003)

$$\left\{\left(-\left(\frac{(d^2S)}{(dU^2)}\right)^{-1}\right)\right\} = \alpha U + \beta U^2 \quad (82)$$

and Parisi $$\frac{d^2S}{dU^2} = -\frac{\alpha(v)}{U(\beta(v)+U)} \quad (83)$$

Note that the $U^2$ now introduced (in comparison with initial starting point) implies, according to Parisi, $$\frac{d^2S}{dU^2} \propto U^{-2} \quad (84)$$

as for a harmonic oscillator as opposed to the initially proposed relationship of $$\frac{d^2S}{dU^2} \propto U^{-1} \quad (85)$$

[See Mr. Martinelli's work where an alternative starting point is provided:

$$\frac{d^2S}{dU^2} = -\frac{a}{avU(bv+U)} \quad (86)$$

where the integration is said to yield the term $bv/(e^{-av/T}-1)$] (Martinelli, 2017)
Note the mathematical manipulation of $$U = <E> = \bar{E} = \frac{hvx}{1-x} = \frac{hv}{x^{-1}-1} = \frac{hv}{e^{\frac{hv}{kT}}-1} \quad (87)$$

if one sets $$x = e^{-\frac{hv}{kT}}.$$

The second differential provided by Martinelli in his starting point is negative, as one would require for the entropy to be a maximum. However, he provides without mention the same end formula as Aggasi. Without the negative sign, the double integration is reported as (without explanation):

$$U_v = hv\left(e^{\frac{-hv}{kT}}-1\right)^{-1} \quad (88)$$

(see Agassi's Equations (14) and (15))
which is not an identity with Planck's formula.
From the proposed starting point, one rearranges and then integrates:

$$\frac{d^2S}{dU^2} = -\frac{\alpha}{U(\beta v+U)} = -\left(\frac{\alpha}{\beta v}\right)\left\{\frac{1}{U} - \frac{1}{\beta v+U}\right\} \quad (89)$$

Note the algebraic rearrangement provides an equivalent representation by adding U and then subtracting U:

$$-\frac{\alpha}{U(\beta v+U)} = -\left(\frac{\alpha}{\beta v}\right)\left\{\frac{(\beta v)}{U(\beta v+U)}\right\} = \\ -\left(\frac{\alpha}{\beta v}\right)\left\{\frac{(\beta v+U)-U}{U(\beta v+U)}\right\} = -\left(\frac{\alpha}{\beta v}\right)\left\{\frac{1}{U} - \frac{1}{\beta v+U}\right\} \quad (90)$$

Then, integrating and setting equal to the thermodynamic temperature:

$$\int \frac{dS}{dU}\frac{dS}{dU}dU = -\left(\frac{\alpha}{\beta v}\right)\int\left\{\frac{1}{U} - \frac{1}{\beta v+U}\right\}dU \quad (91)$$

Note that the mathematical integration of the form below is known to be:

$$\int \left\{\frac{1}{x} - \frac{1}{c+x}\right\} dx = \int \frac{1}{x} dx - \int \frac{1}{c+x} dx = \ln(x) - \ln(c+x) + C \quad (92)$$

Hence $$-\left(\frac{\alpha}{\beta v}\right) \int \left\{\frac{1}{U} - \frac{1}{\beta v + U}\right\} dU = -\left(\frac{\alpha}{\beta v}\right) \{\ln(U) - \ln(\beta v + U)\} \quad (93)$$

$$\frac{dS}{dU} = \frac{1}{T} = -\left(\frac{\alpha}{\beta v}\right) \{\ln(U) - \ln(\beta v + U)\} = \quad (94)$$

$$\left(+\frac{\alpha}{\beta v}\right) \{-\ln(U) + \ln(\beta v + U)\} = \frac{\alpha}{\beta v} \left\{\ln \frac{\beta v + U}{U}\right\}$$

then $$\frac{\beta v}{\alpha T} = \left\{\ln \frac{\beta v + U}{U}\right\} \quad (95)$$

$$e^{\frac{\beta v}{\alpha T}} = \left\{\frac{U + \beta v}{U}\right\} = 1 + \frac{bv}{U} \quad (96)$$

$$e^{\frac{\beta v}{\alpha T}} - 1 = \frac{bv}{U} \quad (97)$$

$$\frac{\beta v}{e^{\frac{\beta v}{\alpha T}} - 1} = U = \frac{hv}{e^{\frac{hv}{kT}} - 1} \quad (98)$$

$$\frac{\frac{C}{D} v}{e^{\frac{C_v}{T}} - 1} = U \quad (99)$$

The starting point proposed in the instant invention, therefore, is:

$$-\left(\frac{d^2 S}{dU^2}\right)^{-1} = \frac{hv}{k} U + \frac{1}{k} U^2 \quad (100)$$

with the units being Joules per K. The starting point proposed by Martinelli (2017) would be (with units being Joules² per K):

$$-\left(\frac{d^2 S}{dU^2}\right)^{-1} = abv^2 U + avU^2 = hv\left\{\frac{(hv)^1}{k} U + \frac{1}{k} U^2\right\} \quad (101)$$

The units for Planck's constant h (h=β) is joule-seconds; for frequency v, reciprocal seconds; for Boltzmann's constant (k=α), joules per Kelvin. The constant C is $$C = \frac{h}{k};$$

the constant D is k−1.

Then calculated the energy U is (this is the usual written form of Planck's formula):

$$U = \left[\frac{hv}{\left(e^{\frac{hv}{kT}} - 1\right)}\right] \quad (102)$$

with the units for the "energy" U in joules.

The expression derived by Martinelli is: (Martinelli, 2017)

$$U = \left\{\frac{bv}{\left[\left(e^{\frac{av}{T}}\right) - 1\right]} = \frac{hv}{\left[\left(e^{\frac{hv}{kT}}\right) - 1\right]}\right\} \quad (103)$$

One notes that there is nothing quantum mechanical about this treatment or required in the mathematical derivation at this point other than to assign a constant the symbol, h, which later would be found to be a critical constant in quantum mechanics.

Therefore, classical thermodynamic treatment of entropy as a function of energy, provides an equation that is in near perfect agreement with the experimental measurements associated with energy, power, and intensity. This experimental verification confirms that for a given energy (frequency), the entropy of thermal radiation is a maximum. One can then infer that for a given frequency from radiation that is not thermal radiation, the entropy is less than a maximum and only approaches a maximum if the radiation becomes more thermal like and the process approaches an equilibrium. Fluctuations away from equilibrium allow a return to equilibrium; hence approaching an equilibrium from the other side means at some time thereinafter an equilibrium will be reached.

As noted, before, a mathematical identity of interest is $$\frac{1}{e^x - 1} = \sum_{j=1}^{\infty} e^{-jx} = e^{-x} + e^{-2x} + e^{-3x} + \ldots \quad (104)$$

If $x = \frac{hv}{kT}$, then $$E = \frac{8\pi v^2}{c^3} \left[\frac{hv}{e^{\frac{hv}{kT}} - 1}\right] V dv \quad (105)$$

$$E = \frac{8\pi v^2}{c^3} \left[\frac{1}{e^{\frac{hv}{kT}} - 1}\right] hv V dv = \frac{8\pi h v^3 V dv}{c^3} \left[e^{-\frac{hv}{kT}} + e^{-\frac{2hv}{kT}} + \ldots\right] \quad (106)$$

so that the energy of each frequency state is ϵ=nhv, n=1, 2, 3, 4 . . . .

If one sets includes the number of modes in the blackbody, one obtains the Planck Radiation Law in terms of frequency and where is used as constants, Planck's constant and Boltzmann's constant (in modern day notation):

$$\text{Radiance } L_v(v, T) = I(v, T) = \left[\frac{2v^2}{c^2}\right] \left[\frac{hv}{e^{\frac{hv}{kT}} - 1}\right] \quad (107)$$

This is called Radiance and has units of Joules per second per steradian per square meter.

Planck's Radiation Law can be expressed in different formulations that are all equivalent. Further, Planck's law can be expressed in terms of Radiance, Radiant Flux Density or Radiant Energy Density, among other possible expressions (with units shown):

$$\text{Radiance } L_v(v, T) = \left[\frac{2hv^3}{c^2}\right]\left[\frac{1}{e^{\frac{hv}{kT}} - 1}\right] = \left[\frac{2v^2}{c^2}\right]\left[\frac{hv}{e^{\frac{hv}{kT}} - 1}\right] W/m^2 sr \quad (108)$$

Irradiance or Radiant Flux $$\text{Density } E_v(v, T) = \left[\frac{2\pi v^2}{c^2}\right]\left[\frac{hv}{e^{\frac{hv}{kT}} - 1}\right] W/m^2 \quad (109)$$

$$\text{Radiant Energy Density } w_e(v, T) = \left[\frac{8\pi v^2}{c^3}\right]\left[\frac{hv}{e^{\frac{hv}{kT}} - 1}\right] \text{Joules}/m^3 \quad (110)$$

The full entropy density, in terms of the "energy", of the thermal radiation, are: (Boya, 2003)

$$S(U) = k\left[\ln(1 + U/hv)^{(1+U/hv)} - \ln\left((U/hv)^{(U/hv)}\right)\right] \quad (111)$$

or $$S(U) = k\left[(1 + U/hv)\ln(1 + U/hv)^{(1)} - (U/hv)\ln(U/hv)^{(1)}\right] \quad (112)$$

The term $\frac{U}{hv}$ is:

$$\frac{\frac{hv}{\left(e^{\frac{hv}{kT}} - 1\right)}}{hv} = \frac{1}{\left(e^{\frac{hv}{kT}} - 1\right)} \quad (113)$$

which is the number of photons at frequency $v$ (i.e., $n_p$) and which is unitless. It is also, interestingly, the average quantum number of a harmonic oscillator.

Therefore, the entropy density term is in the form where $$S(U) = k[(1+n_p)\ln(1+n_p) - (n_p)\ln(n_p)] \quad (114):$$

and the change in entropy in terms of $n_p$ is $$\frac{dS}{dn_p} = k[\ln(1 + n_p) - \ln(n_p)] = k\left[\ln\left(\frac{1+n_p}{n_p}\right)\right] = k\left[\ln\left(1 + \frac{1}{n_p}\right)\right] \quad (115)$$

The entropy density could have been calculated from the energy density function derived by Planck but appears not have been done so. Rather a combinatorial consideration of oscillators (called complexions by Planck) led him to the entropy density function whose first derivative with respect to energy was consistent with the energy density function contained. The complete derivation has been reported elsewhere. Historical reviews seem also to not provide an explicit derivation entropy density from the thermodynamic definition of temperature or even the initially hypothesized second derivatives. See "Thermodynamics of radiation pressure and photon momentum and "Radiation entropy flux and entropy production of the Earth system" for discussions on the calculation of the entropy density for a blackbody radiator. (Mansuripur & Han, 10'7) (Wu & Liu, 2010) Note that Appendix A by Wu & Liu provides the calculus to derive the entropy density equation from the energy density equation, referencing "Gradshteyn, I. S., and I. M. Ryzhik (1980), Tables of Integrals, Series and Products, 1160 pp., Academic, New York", and hence is referenced herein by attribution.

The entropy maximum in terms of frequency can be determined at any temperature of the hohlraum; it is generally at a shorter frequency than the spectral maximum in terms of Radiance (energy). Thus, the region (in radiation frequencies) bathochromic to the entropic maximum provides greater radiation entropy relative to radiation energy than that region hypsochromic to the energy maximum.

What is unique about Planck's Radiation Law is the fact that the right-hand side is independent of the geometry or the properties of the body. As such, many consider it as a fundamental law and in this regard it as an upper limit to what a body can emit as thermal radiation, all other bodies, regardless of geometry and material properties would yield less entropy and less energy. (Reiser & Schachter, 2013)

There are two important points regarding Planck's Radiation Law: when it is integrated over all frequencies (or wavelengths) to provide the total energy of radiation enclosed within the vacuum cavity radiator, it yields the Stefan-Boltzmann law for T4 dependency. When it, Planck's Radiation Law, is evaluated at those frequencies (or wavelengths) for which Wien's approximation (also sometimes called Wien's law or the Wien distribution law) is found to be valid, Planck's distribution law in fact reduces to that of Wien.

When integrated over all wavelengths emitted, the thermodynamic relations of state for a photon gas are determined and are now well summarized in contemporaneous literature. The photon gas is a model of a quantum mechanical system of quanta of an electro-magnetic field with acceptance of the particle-wave duality of such a field, such duality emanating from the fluctuation analysis of Dr. Einstein.

More specifically, when $hv \gg kT$, then in terms of Radiance (Joules per second per steradian per square meter)

$$L(v, T) = \left[\frac{2hv^3}{c^2}\right]\left[\frac{1}{e^{\frac{hv}{kT}} - 1}\right] \quad (116)$$

becomes $$L(v, T) = \left[\frac{2hv^3}{c^2}\right]\left[\frac{1}{e^{\frac{hv}{kT}}}\right] \quad (117)$$

Note that Wien's approximation (also sometimes called Wien's law or the Wien distribution law) is valid at high frequencies (high energy) and in that case $hv \gg kT$. At low frequencies (low energy), or at very high temperatures, then it is not true that $hv \gg kT$ and Planck's Radiation Law must be used to model the spectral radiance from a cavity radiator.

Using the form as summarized by Dr. Einstein: (Einstein, On the Quantum Theory of Radiation, 1917)

"(Wien) discovered, as is known, the formula [Wien's radiation formula]

$$\rho = \alpha v^3 e^{\frac{-hv}{kT}} \quad (118)$$

which is recognized today as the correct limiting formula for large values of v/T.

The significance of the "−1" in the denominator of Planck's Law is that the spectral distribution at any temperature will have greater Radiance, using Planck's law, than using Wien's approximation (also sometimes called Wien's law or the Wien distribution law), at low frequencies (low energy). This extra Radiance is attributable to induced (stimulated) emission at low frequencies. The induced emissions do not occur at to any discernible high frequencies (high energy). As temperature (at which the hohlraum operates) increases, the increase in energy is dissipated (from the hohlraum inner surface to the electromagnetic radiation in energy equilibrium) in an increasing number of thermal radiation photons of an average energy as opposed to ever increasing the spectral radiation energy. There is no limit to the number of photons that may be created in the hohlraum: by increasing the number of photons, N, rather than increasing the energy of each photon, the entropy $(S_B = -Nk_B \Sigma_i p_i \ln p_i$ or $S(U) = k[\ln(1+U/hv)^{(1+U/hv)} - \ln(U/hv)^{U/hv}])$ (119):

of the radiation is assured to be a maximum. [In chemical reactions, entropy generally increases in reactions when the total number of product molecules is greater than the total number of reactant molecules.] This is a consequence of the Correspondence Principle—when the energy is large, the quantum mechanical system behaves according to (in correspondence with) the classical description. At high energies, the quantum mechanical representation—Planck's Law—corresponds to Wien's approximation and the contribution of the "−1" term in the denominator to Radiance is negligible. [Similarly, if the adjustment had been "+1" term in the denominator would reduce the underlying energy versus the classical case and at high energies, the reduction would be minimal]

At lower frequencies, the entropic contribution per energy at any radiation frequency is greater than the classical mechanics treatment would otherwise project. This is a consequence of stimulated emission in the blackbody at the lower frequencies. At frequencies bathochromic to the entropy maximum, there is more emission of radiation from the walls of the hohlraum than there is absorption of the radiation by the walls. This is balanced at frequencies hypsochromic to the energy maximum where there is less emission of radiation from the walls of the hohlraum than there is absorption of radiation by the walls. In terms of wavelength, the entropy maximum is governed by the equation:

$$\lambda_{entropy}^{max} = \frac{3.00292 \times 10^{-3}}{T} \text{ meters,} \quad (120)$$

whereas $$\lambda_{energy}^{max} = \frac{2.89777 \times 10^{-3}}{T} \text{ meters} \quad (121)$$

such that $$\lambda_{entropy}^{max} / \lambda_{energy}^{max} = 1.03629. \quad (122)$$

(Delgado-Bonal & Martin-Torres, 2016) (Agudelo & Cortés, 2010)

The transcendental equation for entropy maximum in wavelengths is: (Delgado-Bonal & Martin-Torres, 2016)

$$-5\frac{hc}{\lambda k_B T}\left(e^{\frac{hc}{\lambda k_B T}} - 1\right)^2 - 5\frac{hc}{\lambda k_B T}\left(e^{\frac{hc}{\lambda k_B T}} - 1\right) + \frac{hc}{\lambda k_B T}^2 e^{\frac{hc}{\lambda k_B T}} -$$

$$4\ln\left(\frac{1}{e^{\frac{hc}{\lambda k_B T}} - 1}\right)\left[\left(e^{\frac{hc}{\lambda k_B T}} - 1\right)^2\right] + \left(\frac{hc}{\lambda k_B T}\right)e^{\frac{hc}{\lambda k_B T}}\left(e^{\frac{hc}{\lambda k_B T}} - 1\right) = 0 \quad (123)$$

The expected number of photons in a photon gas is given by $n = K_n V T^3$, where $K_n$ is a constant. Note that for a particular temperature, the expected particle number n varies with the volume in a fixed manner, adjusting itself to have a constant density of photons. In an idealized system, should one ever exist, the change in entropy with change in volume is $S - S_o = \Delta S = -nk \ln(V/V_o)$ (Varro, 2006) This conceptual construction is essentially a two-state system, one state represented by V and the second state represented by $V_o$, where it is the only consideration that the number of photons of thermal radiation is fixed. (Bijil, 1952) (Sokolsky & Gorlach, 2014)

When the term "photon" is used to discuss electromagnetic radiation, one is considering the energy as if it was a particle, like an ideal gas. At high frequencies, the Wien's approximation (also sometimes called Wien's law or the Wien distribution law) is valid (as hv>>kT): this is the region in which radiation is said to be acting like a particle. At low frequencies, Wien's approximation is not valid, the correction of Planck's Radiation Law is required, and this is the region in which the radiation is said to be acting wave-like. In reality, at least quantum mechanical reality, the duality of radiation is simply a reflection of the results of a measurement technique. The Correspondence Principle articulates that the behavior of systems described by the theory of quantum mechanics reproduces classical physics in the limit of large quantum numbers, high energy, and in the case of a blackbody radiation, in the region in which the radiation is said to be particle like. In the region of deviation from Wien's Law, of low quantum numbers, where the radiation from a blackbody radiator is said to be acting wave-light, and where a correction to an otherwise valid classical mechanic formula is required (as opposed to an invalid classical mechanic formula which yielded an obtuse description in the ultraviolet).

The difference between Wien's approximation (also sometimes called Wien's law or the Wien distribution law) and Planck's Radiation Law is rather small (a minus "1" in the denominator; curiously the denominator has a plus "1" for a Fermi oscillator) but the experimental results on blackbody radiators is of sufficient accuracy to demonstrate that the difference is real. As Dr. Planck would no doubt relish: what more can one say? The Wien's approximation predicts the spectrum of thermal radiation for a given temperature T but deviates from the experimental results for long wavelengths (low frequency) emission (that is, the deviation is apparent at lower energies of the spectral distribution) Similarly, the Rayleigh-James approximation predicts the spectrum of thermal radiation for a given temperature T but deviates from the experimental results for short wavelengths (high frequency) emission (that is, the deviation is apparent at higher energies of the spectral distribution).

It has been similarly demonstrated that the fundamental difference between Planck's law and the Wien approximation is that the former considers "induced emission" or "stimulated emission" whereas the latter does not. (Ross & Calvin, 1967) Stimulated emission provides for two identical photons each with the characteristics of the incident photon. Thus, it is called negative absorption as it appears as if less radiation is absorbed (as one using actinometry measures more of the "incident" unabsorbed photons than is the case). The "stimulated emission" contributions to thermal radiation emanates from or was determined as a consequence of Dr. Einstein's fluctuation equation for thermal radiation.

Thus, the extra term for the second derivative of the change in entropy to energy of the oscillators and of the radiation resulted therefrom, the $DU^2$ term in $$-\left(\frac{(d^2S)}{dU^2}\right)^{-1} = CvU + DU^2 \tag{124}$$

as opposed to $$-\left[\frac{d^2S}{dU^2}\right]^{-1} = C \cdot v \cdot U \tag{125}$$

where C is multiplied by v and by U leads to a preference for increasing photon numbers at lower frequencies: thereby suggesting that there are some inefficiencies in generation of photons at higher frequencies. {Parenthetically, one wonders what the model would look like if the starting point was an even longer series; say $[CvU+DU^2+/vU^3]$.}

Recall using the nomenclature that $Y_1$ represents the singlet excited state of the secondary emitter, such as $Ce^{3+}$: YAG, then singlet-singlet annihilation can be expressed as $Y_1+Y_1 \rightarrow Y_0+Y_2$ (where $Y_0$ and $Y_2$ represent ground electronic state and higher than the first singlet excited state, respectively) whereas stimulated emission is represented by $Y_1+h\nu \rightarrow Y_0+2h\nu$ and multi-photon absorption is represented by $Y_1+h\nu \rightarrow Y_2$. The singlet-singlet annihilation is of the Förster Resonance Energy Transfer type and does not require the two $Y_1$ states to be in contact. (Andrews, 2000) Indeed, stimulated emission of the type herein stated would lead to an increase in photon numbers at high frequencies as it appears to be negative absorption. Consequently, it is suggested that excited state quenching of the singlet: singlet type is perhaps the reason that at high temperatures a cavity radiator maximizes its entropy by stimulating emission at lower frequencies and that it is excited state quenching at higher frequencies that reduces the emission to near zero.

Stimulated emission was first proposed by Dr. Einstein in 1917 by re-examining the derivation of Planck's law. "First, Einstein proposed that an excited atom in isolation can return to a lower energy state by emitting photons, a process he dubbed spontaneous emission. Spontaneous emission sets the scale for all radiative interactions, such as absorption and stimulated emission. Second, his theory predicted that as light passes through a substance, it could stimulate the emission of more light. Einstein postulated that photons prefer to travel together in the same state. If one has a large collection of atoms containing a great deal of excess energy, they will be ready to emit a photon randomly. However, if a stray photon of the correct wavelength passes by—its presence will stimulate the atoms to release their photons early—and those photons will travel in the same direction with the identical frequency and phase as the original stray photon." (This Month in Physics History: Einstein Predicts Stimulated Emission., 2005) In other words, the entropy of the emission radiation field will decrease. This must be offset by an increase in entropy somewhere else.

In the case of thermal radiation, the entropy increase "somewhere else" is in the non-conservation of photon numbers. Consequently, within a blackbody cavity radiator, as the intensity, flux density, energy density or radiance increases, the stimulated emission increases, the entropy of the radiation field decreases—because those stimulated emission photons will travel in the same direction with the identical frequency and phase as the incident photons, thereby increasing order—and the number of modes of the "emitted radiation field" increases. This is perhaps another reason for the ultraviolet catastrophe: the conservation of energy requirement of the emission shifts from spectral energy (increasing with increasing temperature until it reaches the maximum) to number of modes of radiation field (increasing with temperature). (Mungan C. E., 2005) (Mungan C., 2003)

This argumentation is completely consistent with the observation that the entropic maximum is bathochromic to the energy maximum and that the entropy to energy ratio is less at higher frequencies, hypsochromic to the energy maximum, and the entropy to energy ratio is greater at lower frequencies, bathochromic to the entropy maximum. As noted, the stimulated emission occurs at lower frequencies, the stimulated emission is a result of greater emission than there is absorption, and the greater emission results in an increase in the photon numbers. That is offset by the fact that there is no stimulated emission at higher frequencies, there is a reduction in photon numbers at frequencies hypsochromic to the energy maximum and there is greater absorption than emissions at higher frequencies. If there was no offset as described herein between relatively lower photon numbers at higher frequencies, and the volume of the blackbody radiator stayed the same, then the consequence would be that the temperature of the cavity would have to increase until a new equilibrium is obtained.

A Photon Gas. The electromagnetic radiation in a blackbody radiator, when developed using the thermodynamic and statistical mechanics foundations, leads one to the perhaps misleading conclusion that the radiation mirrors to some degree the thermodynamic and statistical mechanics of an ideal gas. When integrated over all wavelengths emitted, the thermodynamic relations of state for a photon gas are well known.

In thermodynamics, the Helmholtz free energy is a thermodynamic potential that measures the useful work obtainable from a closed thermodynamic system at a constant temperature and volume. For a photon gas modelled from a black-body radiator, the Helmholtz free energy is $$A = -\frac{1}{3}U \tag{126}$$

where A is the Helmholtz free energy and U is the internal energy of the photon gas. Previously it was noted that Helmholtz free energy is thermodynamically defined as $$dA = dE - TdS. \tag{127}$$

The total internal energy of a photon gas integrated over all wavelengths or frequencies emitted from a cavity radiator is simply a function of the constant Volume and the constant Temperature of the cavity $$U = \delta V T^4 \tag{128}$$

where the constant $\delta$ is a function of Boltzmann's constant k, Planck's constant h, and the constant speed of light c. The negative sign assures that the Helmholtz free energy is less than zero and this is at a minimum.

The entropy of the same photon gas, when integrated over all wavelengths or frequencies emitted by the cavity radiator, is:

$$S = \frac{4}{3}\frac{U}{T}. \tag{129}$$

Consequently, the term $$TdS = \frac{4}{3}U.$$

So far, one has expressed the thermodynamic functions of a photon gas in terms of the Internal Energy od the Photon Gas. More specifically, the internal energy of the photon gas, U, is given by (after integrating over all frequencies): (Leff, 2002)

$$U = \frac{8\pi^5 k^4}{15 c^3 h^3} V T^4 \tag{130}$$

The entropy of a photon gas is given by: (Leff, 2002)

$$S = \frac{4}{3}\frac{U}{T} = \frac{32\pi^5 k^4}{45 c^3 h^3} V T^3 \tag{131}$$

At equilibrium, the Gibbs free energy is zero meaning that no more useful work can be obtained from the system at equilibrium. Given the thermodynamic equation $$0 = dG = dH - TdS; TdS = \frac{4}{3}U \tag{132}$$

then the enthalpy of a photon gas is: (Leff, 2002)

$$H = \frac{4}{3}U = \frac{32\pi^5 k^4}{45 c^3 h^4} V T^4 \tag{133}$$

The average number of a photon gas is: (Leff, 2002)

$$N = rVT^3 \tag{134}$$

where $$r = \left[60.4\left(\frac{k}{hc}\right)^3\right] = a \text{ constant} \tag{135}$$

It is emphasized that for a photon gas, the "number" is an average as opposed to an exact number whereas for an ideal gas, the "number" is exact: ($PV = nRT = Nk_B T$ where $k_B/R$ = Avogadro's number).

As already denoted, the Helmholtz free energy is a thermodynamic potential used for systems at a constant temperature and a constant volume. However, considering a cavity radiator, one cannot use the usual expression for the chemical potential $$\left(\frac{dA_{V,T}}{dN} = 0\right)$$

because one cannot increase N (i.e., add photons to the system) at constant volume, V, and at the same time keep the temperature, T, constant. The equilibrium value for the Helmholtz free energy is not zero (recall $$A = -\frac{1}{3}U; \text{ from } TdS = \frac{4}{3}U; E = U = A + TdS = -\frac{1}{3}U + \frac{4}{3}U = \frac{3}{3}U\right).$$

The Gibbs free energy is a thermodynamic potential that measures useful work obtainable from a closed thermodynamic system at constant temperature and constant pressure. At equilibrium, the Gibbs free energy is zero meaning that no more useful work can be obtained from the system at equilibrium. The change in Gibbs free energy per particle added is known as the chemical potential µ and since dG/dN=0 at equilibrium, then the chemical potential of thermal radiation from an absorbing cavity radiator is zero (0). This means that no matter how many photons are created or destroyed within a cavity radiator at thermal equilibrium, no additional work is available to be performed and the number of photons can increase and decrease and have no impact on the Gibbs free energy of the system. Indeed, pressure of a photon gas can be expressed solely as a function of temperature and not as a function of volume. Thus, one can add a photon to the system at constant Temperature and keep the Pressure constant as well.

The value of a change in Gibbs free energy is the maximal work that can produce the system in reversible and monothermal conditions. At equilibrium and at constant temperature, the Helmholtz energy function is minimal. The difference between the Helmholtz and Gibbs energies lies in the fact that in the first case, the maximal work is equal to the sum of the useful work and that of expansion whereas in the case of the Gibbs energy its decrease is only equal, in reversible conditions, to the useful work.

The essential difference between the photon gas and the ideal gas of molecules: for an ideal gas, an isothermal expansion would conserve the gas energy, whereas for the photon gas, it is the energy density which is unchanged, the number of photons is not conserved, but proportional to volume in an isothermal change.

Optical Cooling with an Anti-Stokes' Shift. The source of primary radiation in Down-Conversion as disclosed in U.S. Pat. No. 6,600,175 is a light emitting diode. The electroluminescence, the primary radiation, is due to electron: hole recombination, a process akin to radical ion pair recombination. In that case, an excited state of one species is formed and the ground state of the other is populated. The luminescence is generated when the excited state is depopulated and the energy that is available is given off in the form of electromagnetic radiation. However, Mr. Jan Tauc pointed out many years ago that a part of the energy of electromagnetic waves generated by electron: hole recombination (electro-luminescence produced by the passage of current in the forward direction in a p-n junction) is taken from the surroundings in the form of heat (entropy) and there was no barrier in principle to an LED being more than 100% efficient. (Tauc, 1957) Despite this knowledge, it remains the case for light-emitting diodes, as used with high electrical current inputs for General Illumination, considerable heat is generated because of less than perfect electron: hole recombination. The luminescence that is generated carries away both energy and entropy that is generated at the p-n junction.

In this manner, both thermal radiation and luminescence can carry entropy. Optical cooling may occur under the proper circumstances, therefore. It is well documented that electromagnetic waves from a laser can reduce the entropy of matter; it is required however that because of the interaction of matter with laser radiation that the entropy of matter be carried away by luminescence. Since electromagnetic waves from a laser have zero entropy, and spontaneous emission from luminescent matter so excited is spread out in all directions, this is the most important reason why the luminescent radiation does not have zero entropy and carries away the entropy from the matter so excited.

It should not be surprising that radiation can dissipate entropy from matter as this is what is essentially accomplished by thermal radiation emitted by a black body radiator, where the entropy carried away is shown to be a function of the temperature of the radiator:

$$S = \frac{4}{3}\frac{U}{T} \tag{136}$$

where U is the internal energy of the photon gas and T is its temperature. As noted by Mr. Mungan, the thermal radiation carries away entropy with a 4/3 factor while the entropy of the matter decreases by U/T, and thus the total entropy change of the universe is positive in this irreversible emission process. This implies that not only does thermal radiation carry away entropy from matter, but it does so at a rate greater than that which is lost by the matter itself. Thermal radiation has heat capacity at constant volume. One can recall that heat capacity for matter can be determined at either constant volume or constant pressure.

"It is possible to cool a material by anti-Stokes fluorescence. This simply means that the material emits photons which have a higher mean energy than those it absorbs. The energy difference arises from thermal excitations in the sample. Effectively, heat is converted into light, which leaves the material and is dumped onto a heat sink elsewhere." (Mungan C., n.d.)

"The idea that anti-Stokes fluorescence might be used to cool a material is a surprisingly old one, proposed as early as 1929 by Pringsheim. (Pringsheim, Zwei Bemerkungen über den Unterschied von Lumineszenz- and Temperaturstrahlung., 1929) This proposal led some 16 years later to a rather spirited debate between Pringsheim and Vavilov, with the latter claiming that its realization is impossible on thermodynamic grounds. (Vavilov, Some remarks on the Stokes law., 1945) (Pringsheim, Some remarks concerning the difference between luminescence and temperature radiation: Anti-Stokes fluorescence., 1946) (Vavilov, Photoluminescence and thermodynamics, 1946) Landau himself had to step into the controversy and proved that the entropy lost by the sample upon cooling is more than compensated for by an increase in the entropy of the light, resulting from the loss of monochromaticity, phase coherence, and directionality of the beam. (Landau, 1946) (Mungan C., n.d.)

"The next class of materials proposed for fluorescent cooling was semiconductors, in a 1957 paper by a Czech theorist. (Tauc, 1957) In this and subsequent experimental and theoretical work until recently, the fluorescence resulted from current injection into an active junction (i.e., a LED) rather than from optical absorption using a laser." (Keyes & Quist, 1964) (Gerthsen & Kauer, 1965) (Landsberg & Evans, 1968) (Berdahl, 1985) (Dousmanis, Mueller, Nelson, & Petzinger, 1964) (Pankove, 1975) (Mungan C., n.d.)

The mechanism by which optical cooling takes place invoking anti-Stokes fluorescence (an anti-Stokes shift) is representative of slightly off-resonance effects available when one uses a radiation source with near zero entropy. The excitation source has an energy slightly below that which is required to populate the lowest vibrational level of an electronically excited state. The extra energy that is required to so populate comes not from the radiation source but from the surroundings in which the chromophore is located. This decreases the temperature of the surroundings and provides the necessary energy to populate the excited state which then spontaneously fluoresces at an energy level higher than that of the excitation source. In order for an anti-Stokes shift to cool its surroundings, which is difficult to practice, the incident radiation has to be slightly off resonant and to have almost zero entropy (which essentially means that it has to be monochromatic and of high radiance). Heretofore only a laser has been able to be a practical source of incident radiation for anti-Stokes optical cooling.

A light emitting diode such as that used in Down-Conversion for General Illumination is not a laser and does not generate radiation with near zero-entropy, especially since it is not monochromatic. It is for this reason that the disclosure of "a microelectronic device comprising: a heat-generating structure adapted to emit a visible light output and to generate heat energy, wherein the heat-generating structure includes at least one of a light emitting diode and a Down-Converting luminophoric medium; and an upconverting luminophoric material that receives a portion of the heat energy and at least partially converts the portion of the heat energy to upconverted visible light in addition to the visible light emitted by the heat generating structure, wherein the microelectronic device radiates the visible light output emitted by the heat-generating structure and the upconverted visible light" and "wherein the upconverting luminophoric material comprises an anti-Stokes phosphor" is not a practicable device nor a useable construction with a light emitting diode as the microelectronic device. (U.S. Pat. No. 8,297,061, (2012)) The claimed or disclosed source of the incident radiation which invokes the anti-Stokes cooling is not completely clear except in one description whereby upconverting phosphors absorb light between 1500 nm and 1610 nm (and emits between 950 nm and 1075 nm, which is not useful for illumination), the source of which is not revealed. Concurrently therein it states regarding FIG. 2, "The reflecting surface 36 includes features such as reflective protrusions 38 thereon that act to reflect some of the primary emission from the light emitting diode 32 onto the anti-Stokes phosphor film 37 to enable the cooling process" where the primary radiation is generally stated to be visible light (in other words, light that is not 1500 nm to 1610 nm).

Another inference therein of multi-photon absorption does not disclose that such processes require very high intensities such a laser as the excitation source, in contrast to a light emitting diode, in general. Further complicating the claimed device is the preference that it contain both a Stokes' phosphor and an anti-Stokes phosphor: generally speaking, such a construction, if in a near-field implementation, leads to quenching either by molecular collisional (near contact) interaction or by Förster resonance energy transfer (near-field virtual photon energy transfer) so that luminescence only from the lowest energy emitter is possible. That is to say that the anti-Stokes phosphor essentially becomes a Stokes phosphor, but indirectly, provided the radiative lifetime of the anti-Stokes phosphor is substantively greater than 50 nano-second.

In an interesting far-field hypothetical model, whereby hohlraums with walls containing an anti-Stokes filter, and an internal blackbody, if one could exist, with a Stokes filter, the model shows that the internal blackbody has a lower temperature that that of the heat bath which is the temperature at which the hohlraum operates. (McDonald, 2017) This represents an irreversible cycle and hence the model is one where there is no equilibrium between the hohlraum and the radiation field or the internal blackbody and the radiation field. The impracticability of such a combined Stokes/anti-Stoke device effectively cooling at ambient is noted. (McDonald, 2017) According to Mr. McDonald, "This result (evaporative photon cooling) is implied in . . . [J. Tauc, The Share of Thermal Energy Taken from the Surroundings in the Electro-Luminesce Energy Radiated from a p-n Junction, Czech. J. Phys. 7, 275 (1957)] . . . as remarked by E. Yablonovitch (private communication)". (McDonald, 2017)

Thermal Properties to Non-thermal Radiation. Luminescence follows the rules for Absorption and Emission as first promulgated by Dr. Einstein who then applied them to the equilibrium of thermal radiation (the algorithm for which required stimulated emission as a correction to Wien's Law and which incorporated wave relations for radiation as a correction for particle relations). This may be the first time non-thermal properties may have been applied to thermal radiation. {One of the more interesting examples of non-thermal properties being applied to thermal radiation is that in its matter interacting with the radiation field, both Stokes and anti-Stokes transitions are allowed as well as isoelectronic transitions.] But what of the converse? The Kennard-Stepanov universal relation, first developed by Mr. Kennard and then put in modern form by Mr. Stepanov, is a thermodynamic treatment of a transition between ground electronic states and electronic excited states. "The Kennard-Stepanov relation can be straightforwardly derived . . . for a system with an electronic ground state $|g_i\rangle$ and an electronically excited state $|e_j\rangle$, each of which are subject to an additional sublevel structure. It is assumed that the excited state lifetime is sufficiently long that its sublevel population (as well as the ground state manifold) acquires thermal equilibrium." The treatment is based on a derived Kennard-Stepanov function of the form:

$$\ln\left[\frac{a(\omega)}{f(\omega)}\right] = \left[\frac{\hbar\omega}{k_B T}\right] = \left[\frac{\hbar}{k_B T}\right][\omega] \tag{137}$$

In this treatment, one simply plots (for any particular wavenumber), the natural log of the ratio of the normalized spectral intensity of the absorption over the fluorescence (y-axis) versus the wavenumber (x-axis). This ratio then gives a slope that is $$\text{slope} = \frac{hc}{k_B T}; \tag{138}$$

hence an apparent temperature can be discerned. (Moroshkin, Weller, Saß, Klaers, & Weitz, 2014)

Temperature of Radiation. Recall that the Radiance is given by:

$$\text{Radiance } L_\nu(\nu, T) = \left[\frac{2h\nu^3}{c^2}\right]\left[\frac{1}{e^{\frac{h\nu}{kT}}-1}\right] = \left[\frac{2\nu^2}{c^2}\right]\cdot\left[\frac{h\nu}{e^{\frac{h\nu}{kT}}-1}\right] \text{W/m}^2\text{sr} \tag{139}$$

The temperature can be solved in terms of the Radiance and the energy of the electromagnetic radiation: (Ries & McEvoy, Chemical potential and temperature of light., 1991) (Porter, 1983) (Ries, Thermodynamics of Quantum Conversion of Light, 1999)

$$T_{\varepsilon,L_\varepsilon} = \frac{\varepsilon}{k\ln\left(\frac{2\varepsilon^3}{h^3 c^2 L_\varepsilon}+1\right)} \tag{140}$$

where $\varepsilon = h\nu$. The Temperature of the radiation is only dependent on the energy (if monochromatic, there is only one energy) and the Radiance of the radiation. The higher the Radiance, the higher the Temperature of the radiation. The number of photons is given by $$n = \frac{1}{e^{\frac{\varepsilon_p - \mu_p}{kT}} - 1} \tag{141}$$

and $\mu$ is the chemical potential of the photons and $\varepsilon$ is the energy of the photon. (Ries, Thermodynamics of Quantum Conversion of Light, 1999)

Recall the relationship of Spectral Radiance for blackbody thermal radiation in a vacuum:

$$\text{Spectral Radiance } L_\nu(\nu, T) = \left[\frac{2h\nu^3}{c^2}\right] \tag{142}$$

$$\left[\frac{1}{e^{\frac{h\nu}{kT}}-1}\right] = \left[\frac{2\nu^2}{c^2}\right]\left[\frac{h\nu}{e^{\frac{h\nu}{kT}}-1}\right] \text{Wm}^{-2}\text{Hz}^{-1}\text{sr}^{-1}$$

Irradiance or Radiant Flux (143)

$$\text{Density } E_\nu(\nu, T) = \left[\frac{2\pi\nu^2}{c^2}\right]\left[\frac{h\nu}{e^{\frac{h\nu}{kT}}-1}\right] \text{W/m}^2$$

$$\text{Radiant Energy Density } w_e(\nu, T) = \left[\frac{8\pi\nu^2}{c^3}\right]\left[\frac{h\nu}{e^{\frac{h\nu}{kT}}-1}\right] \text{Joules/m}^3 \tag{144}$$

Note that the ubiquitous term $$\left[\frac{1}{e^{\frac{h\nu}{kT}}-1}\right] \quad (145)$$

Is unitless, whereas the term $$\left[\frac{h\nu}{e^{\frac{h\nu}{kT}}-1}\right] \quad (146)$$

has units of energy. The spectral radiance has units of $Wm^{-2} Hz^{-1} sr^{-1}$
which can be expressed as $$\frac{W \cdot \sec}{m^2 \cdot sr} \text{ as } Hz^{-1} = \sec.$$

This is confirmand by the units for frequency (Hz) and Planck's constant (Watts·sec$^2$), and speed of light (m/sec).

With rearrangement, a common form for Spectral Radiance takes into account that the equation is actually an integration as a function of the frequency:

$$L_\nu d\nu = \left[\frac{2\nu^2}{c^2}\right]\left[\frac{h\nu}{e^{\frac{h\nu}{kT}}-1}\right] d\nu. \quad (147)$$

When integrated, one obtains the Radiance and the frequency units drops out. The formula for Radiance per unit area per steradian is obtained after completing the integration, whose proof has been provided elsewhere, $$L = \int_0^\infty L_\nu d\nu = \int_0^\infty \left[\frac{2\nu^2}{c^2}\right]\left[\frac{h\nu}{e^{\frac{h\nu}{kT}}-1}\right] d\nu = \frac{2\pi^4 k^4}{15 h^3 h^3 c^2} T^4 W m^{-2} sr^{-1} \quad (148)$$

One can further integrate over all steradians which yields the Radian Emittance per unit area, a formula which is not necessary for the instant invention.

An important form of the Spectral Radiance equation for thermal radiation is when one divides by the energy term hν to give the Spectral Radiance in terms of photon numbers:

Spectral Radiance $L_\nu(\nu, T) =$ (149)

$$\left[\frac{2h\nu^3}{h\nu c^2}\right]\left[\frac{1}{e^{\frac{h\nu}{kT}}-1}\right] = \left[\frac{2\nu^2}{c^2}\right]\left[\frac{1}{e^{\frac{h\nu}{kT}}-1}\right] \text{photon } s^{-1} m^{-2} Hz^{-1} sr^{-1}$$

Let us consider the Spectral Radiance in terms of photon numbers by removing the energy term hν and call this term Intensity:

$$\text{Intensity } L_\nu(\nu, T) = \frac{\left\{\left[\frac{2h\nu^3}{c^2}\right]\left[\frac{1}{e^{\frac{h\nu}{kT}}-1}\right]\right\}}{h\nu} = \left\{\left[\frac{2\nu^2}{c^2}\right]\left[\frac{1}{e^{\frac{h\nu}{kT}}-1}\right]\right\} \quad (150)$$

and recall that the velocity of light in a medium other than a vacuum is $$\frac{c}{\upsilon} = n; \quad (151)$$

Thus,

Intensity $L_\nu(\nu, T) =$ $$\left\{\left[\frac{2\nu^2}{\upsilon^2}\right]\left[\frac{1}{e^{\frac{h\nu}{kT}}-1}\right]\right\} = \left\{\left[\frac{2n^2\nu^2}{c^2}\right]\left[\frac{1}{e^{\frac{h\nu}{kT}}-1}\right]\right\} \text{photon } s^{-1} m^{-2} Hz^{-1} sr^{-1}$$

for Intensity of thermal radiation, in photon numbers, not in a vacuum. Generally, one does not consider the index of refraction, n, as for gases the value is close to unity.

To remove the units steradians$^{-1}$, and noting that there are 4π steradians in a sphere, taking the Intensity, $B_\nu(\nu,T)$, over 4π solid angle yields $$\text{Radiant Exitance } M_e = \left\{\left[\frac{8\pi n^2 \nu^2}{c^2}\right]\left[\frac{h\nu}{e^{\frac{h\nu}{kT}}-1}\right]\right\} W m^{-2} \quad (153)$$

This is the Spectral Radiance, now taken over 4π steradians so the units for Radiant Exitance are photon $Ws^{-1}m^{-2} Hz^{-1}$ or $Wm^{-2}$. The Radiant Exitance is the radiant flux emitted by a surface per unit area. This is the emitted component of radiosity. "Radiant emittance" is an old term for this quantity. This is sometimes also confusingly called "intensity". In the form of photon numbers, the Radiant Exitance is:

$$\text{Radiant Exitance } M_e = \left\{\left[\frac{8\pi n^2 \nu^2}{c^2}\right]\left[\frac{1}{e^{\frac{h\nu}{kT}}-1}\right]\right\} \text{photon } s^{-1} m^{-2} Hz^{-1} \quad (154)$$

Mr. Ross and Mr. Calvin derived an equation for the change in entropy with photon numbers as: (Ross & Calvin, 1967) (Ross & Calvin, 1967) (Ross R. T., 1967)

$$\text{Radiant Exitance } M_e = \left\{\left[\frac{8\pi n^2 \nu^2}{c^2}\right]\left[\frac{1}{e^{\frac{h\nu}{kT}}-1}\right]\right\} \text{photon } s^{-1} m^{-2} Hz^{-1} \quad (155)$$

can be solved in terms of (using the notation of Ross and Calvin:

$$M_e = B(\nu, T) = \left\{\left[\frac{8\pi n^2 \nu^2}{c^2}\right]\left[\frac{1}{e^{\frac{h\nu}{kT}}-1}\right]\right\} \text{photon } s^{-1} m^{-2} Hz^{-1} \quad (156)$$

Generally, the term used by many in the field is brightness, signified by the symbol $B_\nu$, although the term has lost favour and is encouraged to be used, if at all, in a photometric not a radiometric, context.

$$\text{"Intensity"} B_\nu(\nu, T) = \left\{\left[\frac{8\pi n^2 \nu^2}{c^2}\right]\left[\frac{1}{e^{\frac{h\nu}{kT}}-1}\right]\right\} \quad (157)$$

The temperature T in the equation is that of a blackbody radiator, $T_{B_0}$. With some algebraic restatements, the equation can be rearranged to the form $1/T_{B_0}$, or $h\nu/T_{B_0}$:

$$\frac{h\nu}{T_{B_0}}\left[\frac{\text{Joules}}{K}\right] = k_B \ln\left\{\frac{(1+8\pi n^2 \nu^2)}{c^2 B}\right\}\left[\frac{\text{Joules}}{K}\right] \quad (158)$$

where it is relied upon that one is finding for the temperature of "Intensity" of blackbody radiation expressed in terms of photon numbers (as opposed to $h\nu$, energy). (Yablonovitch, 1980) That is to say, "The entropy gained by a blackbody upon absorption of a ("one") photon at $\nu$ is $h\nu/T_{B_0}$". (Ross R. T., 1967) One should recall that entropy in the standard thermodynamic equation has energy over degrees K units. One should also note that the temperature used, $T_{B_0}$, is simply a substitute for radiation intensity in the form of "$B_\nu(\nu,T)$".

Consequently, the change in entropy with the removal of one photon from the radiation field in terms of brightness $B_1$ $$-k_B \ln\left\{\frac{(1+8\pi n^2 \nu_1^2)}{c^2 B_1}\right\} \quad (159)$$

and the gain in entropy due to fluorescence with the radiation field in terms of brightness $B_2$ $$+k_B \ln\left\{\frac{(1+8\pi n^2 \nu_2^2)}{c^2 B_2}\right\} + \frac{(h\nu - u)}{T} \quad (160)$$

where T is the temperature of the surroundings.
Further note that $$\frac{h\nu - u}{T} = \frac{h(\nu_1 - \nu_2)}{T}. \quad (161)$$

Brightness Theorem. This theorem states that one cannot increase the brightness of optical rays through a passive device. The term brightness in ray optics normally is referencing "Intensity" or Radiant Exitance as hereinbefore commented. This theorem is related to entropy, reflecting on the entropy of radiation, whereby it is clear that the entropy of brighter, more concentrated radiation is decreased. In order to decrease entropy, a non-spontaneous event, one has to perform work, i.e., add energy to the system. One cannot decrease entropy without adding energy to a system, thereby eliminating a passive device to so effect.

If one considers the change in entropy with the removal of a photon from a radiation field for the purpose of absorption (the radiation can be from any source type provided the peak frequency is $\nu_1$)

$$\Delta S_1 = -k \ln\left\{1 + \frac{(8\pi n^2 \nu_1^2)}{c^2 B_1}\right\} \quad (162)$$

and $$\Delta S_2 = -k \ln\left[\left\{1 + \frac{(8\pi n^2 \nu_2^2)}{c^2 B_2}\right\} + \frac{h(\nu_1 - \nu_2)}{T}\right] \quad (163)$$

and $$\Delta S_1 + \Delta S_2 \geq 0 \text{ or } -\Delta S_1 - \Delta S_2 \leq 0 \quad (164):$$

Then, and with some minor algebraic rearrangement $$k \ln\left\{\frac{(8\pi n^2 \nu_1^2)}{c^2 B_1}\right\} - k \ln\left\{\frac{(8\pi n^2 \nu_2^2)}{c^2 B_2}\right\} - \left\{\frac{h(\nu_1 - \nu_2)}{T}\right\} \leq 0 \quad (165)$$

$$k \ln\left\{\frac{(8\pi n^2 \nu_1^2)}{c^2 B_1}\right\} - k \ln\left\{\frac{(8\pi n^2 \nu_2^2)}{c^2 B_2}\right\} \leq \left\{\frac{h(\nu_1 - \nu_2)}{T}\right\} \quad (166)$$

$$\ln\left[\frac{(8\pi n^2 \nu_1^2)}{c^2 B_1} / \frac{(8\pi n^2 \nu_2^2)}{c^2 B_2}\right] \leq \left\{\frac{h(\nu_1 - \nu_2)}{kT}\right\} \quad (167)$$

$$\frac{(8\pi n^2 \nu_1^2)}{c^2 B_1} / \frac{(8\pi n^2 \nu_2^2)}{c^2 B_2} = \left\{\left[\frac{\nu_1^2}{B_1}\right] / \left[\frac{\nu_2^2}{B_2}\right]\right\} \leq e^{\frac{h(\nu_1-\nu_2)}{kT}} \quad (168)$$

which can be rearranged to $$\frac{B_2}{B_1} \leq \frac{\nu_2^2}{\nu_1^2} e^{\frac{h(\nu_1 - \nu_2)}{kT}} \quad (169)$$

Note that the term $$\frac{\nu_2^2}{\nu_1^2}$$

will always be less than one, but the term $$e^{\frac{h(\nu_1-\nu_2)}{kT}}$$

will always be greater than one and the second term will increase faster than the first term will decrease.

A system based on primary radiation incident on a source of secondary radiation that results in a Stokes shift is a source of energy that may allow for an active device to increase the brightness of the secondary radiation (i.e.; phosphor) whereby it is seen that the greater the Stokes shift, the greater the maximal brightness potential ("Intensity" or Radiant Exitance) of the secondary radiation so produced.

The temperature, T, as developed in Yablonovitch, is ambient and includes both thermal radiation as well as radiation with a chemical potential. (Yablonovitch, 1980) The analogous entropy Detailed Balance determinations by Ross and Calvin led to brightness equations using the effective radiation temperature of a blackbody, admittedly an artificial designation of temperature as alluded to by Mauzerall.

The ratio of $B_2/B_1$, developed by Yablonovitch for the purpose of concentrating light for a solar cell, shows that while the brightness decreases linearly as in the term $\nu_2/\nu_1$, it increases exponentially via the term $e^{(\nu_2-\nu_1)}$ as in Down-Conversion, $\nu_2 > \nu_1$. Whereas many have focused on Down-Conversion with a Stokes shift engaging an obvious decrease in energy, in fact the energy from the Stokes shift can be used to increase the brightness of the lower energy secondary radiation compared with the higher energy primary radiation. The so-called energy lost from a Stokes shift, $\nu_2-\nu_1$, is relatively small: a 100 nm bathochromic peak shift (from 450 nm to 550 nm) is equal to a loss of 11 kcal/mol. In the instant invention, another means of providing energy to increase the brightness of secondary radiation is provided: by using a thermal radiation source of no more than 11 kcal/mol.

One advantage of using an infrared tertiary source to mimic the effect of Stokes shift, as in the instant invention, is one will note that at some point, as $$v_2 \xrightarrow[approaches]{} 0,$$

then the maximal increase in brightness B2 must approach zero, due to the first term $$\frac{v_2^2}{v_1^2},$$

whereas the second term informs that there is only thermal radiation and no radiation with chemical potential:

$$e^{\frac{h(v_1-v_2)}{kT}}$$

as $hv_2$ approaches zero. Clearly it is better to rely on ancillary thermal radiation from the source of tertiary radiation than for the Stokes shift to approach zero, which is not a practical solution in any case for Down-Conversion, itself based on a Stokes shift for the purpose of finding the correct spectral distribution to power ANSL.

Recall that the entropy density of blackbody radiation in terms of photon numbers is:

$$S(U) = k[(1+n_p)\ln(1+n_p) - (n_p)\ln(n_p)] \quad (170)$$

and the change in entropy per photon number $$\frac{dS}{dn_p} = k[\ln(1+n_p) - \ln(n_p)] = k\left[\ln\left(\frac{1+n_p}{n_p}\right)\right] = k\left[\ln\left(1+\frac{1}{n_p}\right)\right] \cong \quad (171)$$

$$-k\ln(n_p) = \frac{hv}{T_{B_0}}$$

Radiation Transport through a Medium. A great deal of the theoretical work on blackbody radiators is based on transport through a vacuum. By introducing the refractive index, n, in the Intensity of thermal radiation, one can account for same through a transporting medium such as a gas:

$$\text{Intensity } B_v(v, T) = \left\{\left[\frac{2v^2}{v^2}\right]\left[\frac{1}{e^{\frac{hv}{kT}}-1}\right]\right\} = \left\{\left[\frac{2n^2v^2}{c^2}\right]\left[\frac{1}{e^{\frac{hv}{kT}}-1}\right]\right\} \quad (172)$$

A gas has a standard molar entropy which is absolute. When thermal radiation is transported through a gas medium, some frequencies (energy) of the radiation are absorbed by quantum transitions, usually between rotational and vibrational and not electronic states, as well as translational energy. Whenever the energy of radiation is transferred to matter, there is also a corresponding entropy transfer unless the radiation carried no entropy (coherent). The higher the standard molar entropy of the medium absent the radiation, the greater the entropy that can be that can be transferred from the radiation with each energy transfer (to the vapor medium) transition that is allowed. This is the principal reason that transparent gases are preferred over transparent liquids or solids for thermal radiation entropy transfer. On the other hand, if the primary objective is to maintain a certain temperature and to minimize thermal radiation entropy transfer, a transparent solid (such as a glass) is a preferred embodiment.

It may be counter-intuitive that the transfer of entropy from radiation to matter is greatest when the matter itself (and prior to the interaction) has a high standard molar entropy. Entropy transfer is a spontaneous process provided the energy transfer is also a spontaneous process. Since spontaneous processes must lead to an increase in entropy, one might wrongly conclude that the lower the entropy of the absorbing species, the greater the likelihood a spontaneous entropy transfer process from radiation will satisfy the constraint that the change in entropy be positive. However, returning to the equilibrium picture of vacuum blackbody radiation from a hohlraum whereby the equilibrium is back and forth between the subsurface of the wall matter and the thermal radiation as opposed to between the latter and the surface interface with the vacuum. The entropy transferred to the subsurface is from radiation with maximal entropy for that given energy and may be subsequently transferred to a nearest-neighbour capable of oscillation before back to the vacuum and the creation of thermal radiation therein. If the radiation has the maximum entropy, then the oscillators within the walls have the maximum molar entropy. In the case of entropy transfer to gases from radiation, the higher the standard molar entropy of the vapor, the more likely a nearest-neighbour vapor can accept the entropy transfer from the vapor molecules that were initially entropically enhanced.

The total entropy of an ideal gas molecule can be calculated as the sum of terms, $S_{Total} = S_t + S_r + S_v + S_e + S_n + \ldots$ where the subscripts refer to translational, rotational, vibrational, electronic and nuclear entropy terms respectively. (Kennedy, Geering, Rose, & Crossan, 2019) At standard temperature and pressure, for most atmospheric gases, the principal contribution to the total entropy is translational entropy whereas vibrational entropy is nearly zero. (Kennedy, Geering, Rose, & Crossan, 2019) These different elements of standard molar entropy are presented in Table 6 which is referred to as "Translational, rotational and vibrational entropies of gases for encapsulation in an enclosure."

Recall that the units for entropy are Joules per degree Kelvin.

In terms of translation entropy, the vapor with the greater $S_t$, will transfer its entropy with higher load than that with lower $S_t$. For the following set, referred to as "Translational entropy of gases in atmosphere at sea level." in Table 7, the preferred gas is that with the highest translation entropy, calculations of which were developed from the Principle of Least Action. (From Kennedy I, Geering H, Rose M, Crossan A. A Simple Method to Estimate Entropy and Free Energy of Atmospheric Gases from Their Action. Entropy (Basel). 2019 May 1; 21(5):454. doi: 10.3390/e21050454. PMID: 33267168; PMCID: PMC7514943.)

DISCLOSURE OF THE INVENTION

Technical Problem

Despite major improvements versus incandescence, inefficiencies in the production of illuminance from light emitting diode lamps leads to an increase in the required electrical input to generate more radiation which is accompanied by a subsequent increase in the generation of energy that cannot be quantitatively used for work; i.e.; resulting in the generation of heat. There is a circularity: the more useful work that is required, the more electrical input is mandatory, the more heat that is generated. The work for General Illumination is the utilization of useful energy for the process of vision. One loss of efficiency is due to the entropy of mixing, a fundamental property of Down-Conversion to form achromatic radiation that cannot be avoided.

The reduction in free energy—necessary to perform the required work—associated with the entropy of mixing increases with increasing temperature. What is necessary to improve the underlying efficiency is a process whereby the heat generated is dissipated in a manner that also increases the amount of radiation with the spectral distribution amenable for performing useful work without the necessity for cooling. In the present invention, entropy from thermal sources including infra-red emitting light emitting diodes provides additional energy to vibrationally excite the ground electronic state of secondary emitters that yields Down-Conversion.

Technical Solution

The present invention is based on the discovery that a highly efficient light emitting device may be simply and economically fabricated utilizing a first solid state light emitting device for generating a shorter wavelength radiation—the Primary Radiation—whose peak wavelength is visible to a human observer. Further, at least one second light emitting device, an emitter of thermal radiation—the infrared radiation—whose maximal peak wavelength (as defined by the transcendental equation for entropy maximum in wavelengths, or otherwise measured spectroscopically) is not visible to a human observer. Further, both the Primary Radiation and the infrared radiation are transmitted to, and incident upon, a luminophore (fluorescent and/or phosphorescent material, a phosphor), for Down-Conversion, by the luminophore, of the shorter wavelength radiation to yield light—Secondary Radiation. Further and finally, the combination of all three of which (Primary Radiation, plus Secondary Radiation, plus thermal radiation) is achromatic to a human observer.

There are two mechanisms for dissipation of heat by transfer: those related to molecular vibrations and rotation and those independent of intervening molecules and which can be affected in a vacuum. The former is heat transfer by either conduction or convection, the latter is heat transfer by thermal radiation. Thermal radiation has the benefit of transfer heat at 1⅓ time the heat content. [This "4/3" expression is a result of equilibrium thermodynamics; "3/3 ($U_r/T$) comes from the usual isovolumic entropy change of a photon gas at temperature T when radiation of energy $U_r$, is added. The other $U_r/3T$ comes from the work done in expanding the volume to accommodate the new radiation at the original temperature.] (Knox, Thermodynamic and the Primary Processes of Photosynthesis., 1969)

This is an example of work being performed by heat to return the system back to equilibrium. Most importantly, in thermal radiation, there is no requirement that the number of thermal radiation photons be conserved in the transfer of heat from the source. An alternative explanation, that invokes Detailed Balance, is that the extra $U_r/3T$, compared with thermal conduction and thermal radiation transport from emission-only, is associated with the re-absorption of hohlraum emitted radiation to keep the temperature at T without additional heating from the surroundings. This is a fundamental consequence of the Detailed Balance of matter absorbing and emitting radiation, which is not a balance for other forms of heat (thermal conduction; thermal convection). In other words, if the thermal radiation is not allowed to escape and the temperature remains at T, then the Volume of the hohlraum must increase. Alternatively, if all the thermal emission is in theory allowed to transport heat to the outside of the hohlraum, a new equilibrium must be established as the temperature will be reduced or the temperature of the hohlraum will have to be maintained with an external source of heat.

Down-Conversion is based on the emission of light with a chemical potential whereby conservation of photon numbers is required. However, as the temperature increases to a certain critical level, the chemical potential of secondary radiation decreases until the chemical potential vanishes to nearly zero. Above this critical temperature, the number of photons of secondary radiation increases as does the number of photons that enhances heat transfer by thermal radiation. By eliminating heat transfer by convection and conduction and maximizing heat transfer by thermal radiation at a critical temperature at which the chemical potential of the secondary radiation is near zero, the photon flux of the light emitting diode lamp increases beyond that below the critical temperature.

To protect the source of primary radiation, the source of secondary radiation and the thermal radiation (infrared radiation), any of these sources may be isolated in an enclosure or a chamber and exposed to a vacuum or a gas under a pressure that is either at, below or above atmospheric pressure. The gas may be used to enhance thermal migration, or it may be used to reduce thermal migration depending on how or in what subcomponent the device seeks to mimic a blackbody hohlraum. The vacuum or the gas may have a protective effect, an enhancing effect or simply transport heat from one enclosure to another enclosure. There may be more than one enclosure and each element may be in its own enclosure with a different gas or vacuum at different partial pressures with the presence of air or other gases. A microelectronic device as taught herein may sit within an optically transmissive outermost enclosure. More than one microelectronic device may sit within an optically transmissive outermost enclosure.

Advantageous Effects

There are several subcomponents of the claimed device all of which may generate heat or be exposed to heat because of the heat generation of a nearby subcomponent. Historically, General Illumination lamps using Down-Conversion and light emitting diodes attempted to transfer all heat to the exterior of the device, to the surroundings, across the device: surroundings boundary. In the instant invention, the heat generated by the subcomponents is sought to be transported to or retained at the source of secondary radiation to reduce the chemical potential of the secondary radiation emitted by the phosphor, luminophore or fluorophore that is the source of secondary radiation. At the same time, gases are sought to be used to protect or to minimize damage of subcomponents being exposed to high temperatures. Thus, one uses protecting gases or enhancing gases such as Nobles gases, whereas as well a smaller set of gases is selected that are protecting or enhancing but which have a standard molar entropy to transport to, transport away or isolate said gases to a particular subcomponent. There are three particularly good parameters to use to select the gases that may have certain thermal properties which can be incorporated, depending on the design criteria. One is the Standard molar entropy of the gas; the others are the thermal diffusivity and thermal effusivity. The latter two are a better criterion than the more often claimed thermal conductivity for the reasons discussed herein.

The thermal effusivity is a measure of a materials ability to exchange thermal energy with its surroundings. The thermal diffusivity of a material is a measure of how fast the material temperature adapts to the surrounding temperature. Generally, they do not require much energy from their surroundings to reach thermal equilibrium.

As mentioned before, the thermal diffusivity and thermal effusivity can be calculated with the following material properties:

$$\text{thermal diffusivity, } a, \text{ is } a = \frac{\lambda}{\rho C_V} [m^2/s] \quad (173)$$

$$\text{thermal effusivity, } b, \text{ is } b = \sqrt[2]{\lambda \rho C_V} [W \cdot s^{1/2}/m^2 \cdot K] \quad (174)$$

with $\lambda$=thermal conductivity [W/m·K] (175):

$\rho$=density [kg/m³] (176):

$C_V$=specific heat capacity [J/kg·K] (177):

Thermal diffusivity is measured in units of metres squared per second (m² per s). Thermal diffusivity is defined to be the thermal conductivity divided by density and specific heat capacity at constant pressure. It measures the rate of transfer of heat of a material from the hot end to the cold end. The greater the specific heat capacity and density the slower the rate of transfer of heat. The thermal conductivity implies a rate of heat transfer, but it can be significantly impacted by the capacity of the gas to hold onto the heat, thus the reason to not exclusively choose the gas based on it, thermal conductivity.

The thermal diffusivity of a material influences the penetration dept and speed of temperature adaption under a varying thermal environment. The thermal diffusivity says nothing about the energy flows. On the other hand, the thermal effusivity influences the ability to exchange thermal energy with its surroundings.

Hence, for a heat source that one wishes to transfer the heat from one end to another, for example a light-emitting diode emitting heat and at one end of a cylindrical enclosure filled with gas whereby one seeks to transfer the heat by molecular vibrations to the other end of the cylindrical enclosure, the best parameter to use in ones' design is the highest thermal effusivity of the otherwise transparent gas. For the same construction but whereby one seeks to transfer thermal radiation from one end to another, the best parameter to use is the standard molar entropy. A table of gases and the quantity of their various "thermal" and entropy parameters is summarized in Table 8. If one seeks to transfer both heat by molecular transport and thermal radiation, it is best to use a mixture of gases with high thermal diffusivity and high standard molar entropy. A cylinder that contains a mixture of hydrogen and helium will find that the helium gas will separate from the hydrogen gas such that the concentration gradient of helium will be in favour of the cold side of the cylinder: this is essentially a reversal of the entropy of mixing of distinguishable gases, such that the separation will require a decrease in entropy, offset by the greater increase in entropy due to thermal diffusion throughout the cylinder.

(Heath, Ibbs, & Wild, 1941) By way of further illustration, for a light-emitting diode heat source at one end of a cylindrical enclosure filled with a helium and hydrogen mixture and the cooler end having localized source of secondary radiation, inside the cavity the helium will have higher concentration surrounding the phosphor and the hydrogen will have a higher concertation surrounding the light-emitting diode.

Reported measurements of Thermal Diffusivity are strongly influenced by temperature, the higher the temperature, the greater the reported thermal diffusivity. The literature contains wildly variable reported numbers if multiple sources are used as references.

BRIEF DESCRIPTION OF THE DRAWINGS

There are eleven drawings, including FIG. 1, FIG. 2, FIG. 3, FIG. 4, FIG. 5, FIG. 6, FIG. 7, FIG. 8, FIG. 9, FIG. 10, and FIG. 11 within the specification of the instant invention.

Drawing sheets FIG. 1 and FIG. 2 incorporate therein both a light-emitting diode within or proximate to an enclosure, a secondary emitter known as phosphors within or proximate to the same or another enclosure, and a thermal radiation source within or proximate to the same or another enclosure. Whereas more detailed descriptions of the instant invention are provided hereinafter, note that FIG. 1 represents a sideways view of a claimed device that contains the primary radiation source light-emitting diode and adjacent thereto the thermal radiation source which may also be a light-emitting diode. This sideways view is a cross-section that cuts across the center of the device so that all of the essential elements of the instant invention (primary light emitting diode, secondary source of radiation phosphor, enclosure, a vacuum or gas, and thermal radiation device) are visible and, in this case, all are sealed, within the enclosure. Since the rays of light are emitted perpendicular to the top surface in FIG. 1, this cross-section view is called a transverse view.

Figure 1:
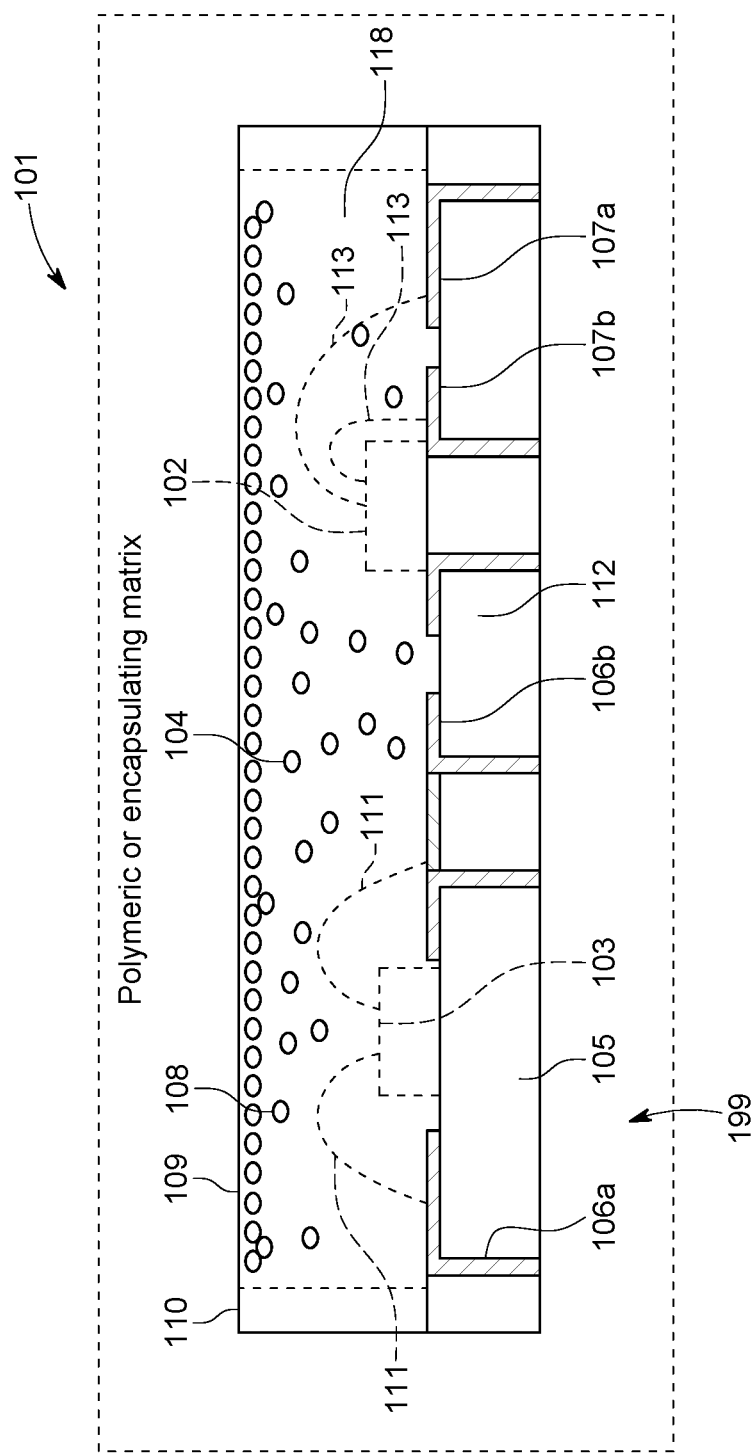

In a view of FIG. 1 from the top, one would not see the internal components but would see a sealed rectangular enclosure, i.e., a solid face, that appears the translucent color of the phosphor coating, internal to the enclosure. As this top-down view is not particularly informative nor descriptive, it is not shown in the drawings. In a similar manner, a sideways view that is not a cross-section and viewed from some distance to the device sidewalls, and from which little light is emitted as most of the light is emitted from the top face of the device, is not particularly informative and one would not see the internal components but would simply see the walls of a sealed rectangular enclosure. Thus, this sideways view of the device in FIG. 1, not being informative, is not shown in the drawings.

Figure 2:
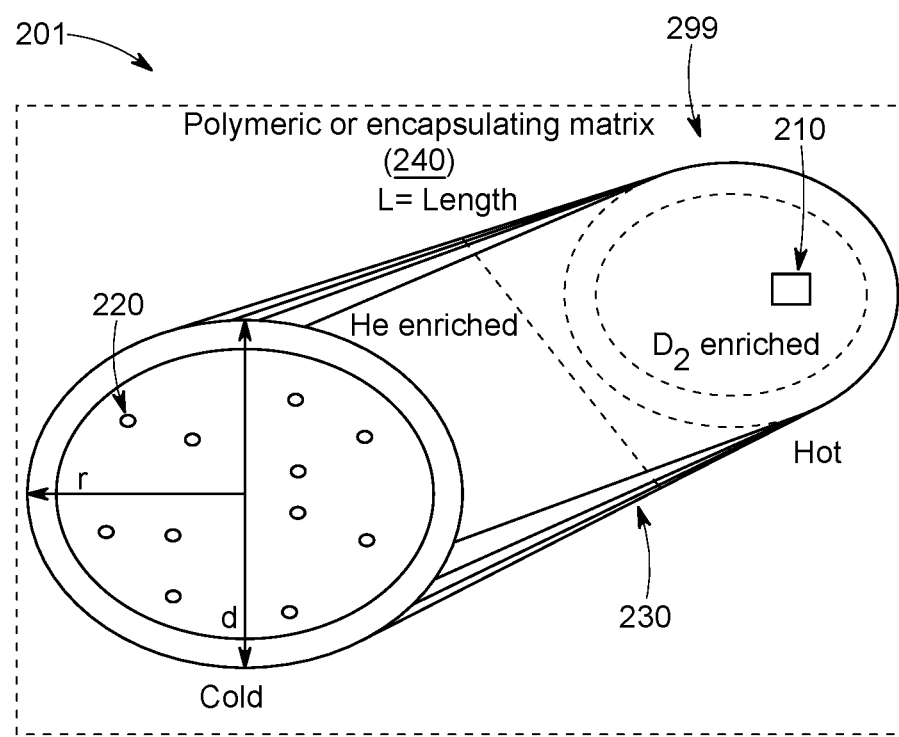

The assembly shown in FIG. 2 is called a three-quarters view: a representation of the drawing posed about halfway between front and profile views. This assembly contains and or has proximate to it the essential requirements of the claimed invention: primary light emitting diode, secondary source of radiation phosphor, enclosure, a vacuum or gas, and thermal radiation device. The drawing in FIG. 2, because of the three-quarters view, particularly demonstrates there are faces of the enclosure and that the enclosure is sealed such that material, matter, may not cross the boundary defined by the enclosure but that radiation and thermal radiation may so cross. FIG. 2 also shows demonstrably that the enclosure while sealed need not be rectangular in shape nor cubic in volume. A transverse or perpendicular or parallel view of the device in FIG. 2 would not necessarily provide any additional information than the three-quarters view and hence these other views are not presented in the drawings of the claimed invention. Most importantly, the three-quarters view shows clearly the two faces of an enclosure, typically one through or from which incoming primary radiation is provided, a second from which scattered and or secondary radiation is delivered to the outside environment, the length between these faces, the volume of space between these faces and that the intervening space of a certain length need not be uniform.

More detailed descriptions of all Figures are provided in the specification of the instant invention, but the views provided, in one case a transverse cross-section, in another a three-quarters view, provided sufficient definition of the light-emitting diode devices to support the claimed invention.

The drawings FIG. 3-11 incorporate tables as mentioned within this Specification.

FIG. 3 is Table 1, Spectral "Power" Radiometric Terms, and Integrated Forms in "Power".

FIG. 4 is Table 2 "Energy" Radiometric Terms.

FIG. 5 is Table 3 Planck's Law in Terms of Frequency and Angular Frequency. Common Forms.

FIG. 6 is Table 4 Entropy Flow analogous terms to Radiometric Energy (Flow) Terms.

FIG. 7 is Table 5 Vibrational energies of YAG Crystals.

FIG. 8 is Table 6 Translational, rotational and vibrational entropies of gases for encapsulation in an enclosure.

FIG. 9 is Table 7 Translational entropy of gases in atmosphere at sea level.

FIG. 10 is Table 8 Comparison of Standard Molar Entropy and Thermal Diffusivity for Encapsulated Gases, FIG. 11 is Table 9 Infrared Light Sources.

As Used Herein Glossary

As used herein, a source of secondary radiation is a phosphor, otherwise called a luminophore or a luminophor, the luminescence emanating therefrom being fluorescence, phosphorescence, or electro-luminescence.

As used herein, thermal radiation is a consequence of the motion of electrons or atoms due to heat whereby this motion of charged particles, or atoms with different electronegativity, create random currents, said random currents being the origin of thermal emission (thermal radiation is spontaneous emission). A typical thermal radiation source that is not a light emitting diode is a tungsten filament or a grating on SiC.

As used herein, a solid-state source of tertiary radiation is a solid-state thermal radiation source, including an infrared light-emitting diode.

As used herein, a solid-state source of quaternary radiation is a source of heating that is not a diode, such as a membrane heater based on microelectromechanical system (MEMS) technology, or nanoscale thermal emitters (based on near-nanoscale passive oscillators that are electromagnetically coupled when heated to about 700 degrees Celsius), or tailored incandescent sources.

As used herein, a primary light-emitting diode is one that emits primary radiation and is variously described as a first solid state light emitting diode or a first light-emitting diode, and whose radiation is incident upon a source of secondary radiation. As incident, then the source of secondary radiation is in a receiving relationship with the emission from the primary light emitting diode.

As used herein, a secondary light-emitting diode is one that emits tertiary radiation which is preferably infrared radiation.

As used herein, primary radiation is emitted by the source of primary radiation.

As used herein, secondary radiation is emitted by the phosphor, luminophore or luminophor.

As used herein, tertiary radiation is non-visible radiation bathochromic to the primary and secondary radiation and whose radiation is incident upon a source of secondary radiation. As incident, the source of secondary radiation is in a receiving relationship with the emission from the source of tertiary radiation.

As used herein, quaternary radiation is non-visible radiation bathochromic to the primary and secondary radiation and whose radiation is incident upon a source of secondary radiation. As incident, the source of secondary radiation is in a receiving relationship with the emission from the source of quaternary radiation.

As used herein, bathochromic or a bathochromic shift relates to a shift to a longer wavelength in the absorption or emission spectrum of a photoactive species, usually a luminescence element.

As used herein, hypsochromic or a hypsochromic shift relates to a shift to a shorter wavelength in the absorption or emission spectrum of a photoactive species, usually a luminescence element.

As used herein, a luminophoric medium is an environment in which luminescence flourishes, may function or flourish with special regard to being a substance or substances as the means of transmission of luminescence.

As used herein, achromatic light or achromatic radiation is light or radiation without dispersing it into its constituent colors, giving the appearance of luminance or illuminance practically free from extraneous colors.

As used herein, polychromatic radiation or polychromatic light is radiation of light being or relating to radiation that is composed of more than one wavelength. Polychromatic radiation, when properly mixed, is perceived by a human observer to be achromatic radiation when exiting the region or space where mixing occurs or when said properly mixed polychromatic radiation falls upon a surface observable by a human observer.

As used herein, a chamber is an enclosure within which the source of primary radiation and or the source of secondary radiation and or the source of tertiary radiation sits within, so that any of these sources is isolated from the outer boundaries of the microelectronic device, wherein said chamber or enclosure the source or sources may be exposed to a vacuum or a gas under a pressure that is either at, below or above atmospheric pressure, and where said chamber or enclosure entrains within the space within it, a vacuum or a gas. As used herein, entrain means to contain within by a structure, absent said structure that within would escape.

As used herein, a luminescent element is a structure or matter that luminesces when powered by electro-magnetic waves, electrical current, or magnetic fields to do so.

As used herein, a luminescent material is consisting of matter that spontaneously emits luminescence when in a receiving relationship with a source of energy, or when exposed to energy from said energy source, in various forms.

As used herein, a spectral entropic maximum is in the non-visible, bathochromic to the visible, and is measured or calculated as if a tertiary radiation source is a perfect blackbody radiator such that the entropic maximum is bathochromic to the energy maximum.

As used herein, a spectral frequency maximum is the maximum emission in frequency as measured in an absorption or emission spectrum where the maximum frequency is a surrogate for the maximum energy absorbed or emitted. For a light-emitting diode powered by an electrical current, the spectral frequency maximum is that of emission. The maximum energy emitted is equal to Planck's constant multiplied by the maximum frequency.

As used herein, a maximal emission peak wavelength is the maximum emission in wavelength as measured in an emission spectrum where the maximum wavelength is a surrogate for the maximum energy emitted. The maximum energy emitted is equal to Planck's constant times the speed of light, both divided by the maximum wavelength.

As used herein, light-emitting diode sources may comprise GaN or SiC, which when powered generate light, especially radiation hypsochromic, fully or partially, to the secondary radiation, and heat including thermal radiation.

As used herein, Down-Conversion converts primary radiation with a frequency maximum of $\upsilon\_1$ to a more useful frequency range with a frequency maximum of $\upsilon\_2$, whereas the latter is lower in energy than the former; hence, the incident radiation is converted down in energy to that of the subsequently emitted radiation. A Stokes shift is representative of the Down-Conversion process. Elsewhere in the Specification of the instant invention, three steps are stated to be required for Down-Conversion.

As used herein, a material that Down-Converts is one characterized by a Stokes shift.

As used herein, the Stokes shift is the difference between the spectral position of the maximum of the first absorption band and the maximum of the fluorescence emission and can be expressed in either wavelength or wavenumber unit. The wavenumber Stokes shift is an approximation since it assumes that the wavenumber maxima are at the same position as the wavelength maxima which is not strictly true. When fluorescence spectra are converted from a wavelength scale to a wavenumber scale the position of the maxima slightly shift since the spectral bandpass of the measurement is constant in wavelength but not in wavenumber. For very accurate wavenumber Stokes shift calculations one convert's the spectra to a wavenumber scale and locate the maxima from the wavenumber spectra.

As used herein, hydrogen is the diatomic gas comprising two hydrogen atoms; deuterium is the diatomic gas comprising at least one deuterium atom; helium is the monoatomic gas comprising predominantly $^2$He atom; argon is the monoatomic gas comprising predominantly $^{18}$Ar atom. Other gases cited may be monoatomic, diatomic or many atoms covalently attached to form a molecule.

As used herein, the standard molar entropy is the entropy content of one mole of pure substance at a standard state of pressure and temperature.

As used herein, the Molar heat capacity is the amount of heat required to raise the temperature of 1 mole of a substance by one unit.

As used herein, the thermal effusivity (also called thermal inertia or thermal responsivity) of a gas is a measure of the gas 'ability to exchange thermal energy with its surroundings. It is defined as the square root of the product of the gas' thermal conductivity and its volumetric heat capacity.

As used herein, thermal diffusivity describes how well a material can spread heat, taking into account both how quickly the heat can be conducted through the material (thermal conductivity), and how quickly its own temperature can change when the material is heated (heat capacity). Specifically, thermal diffusivity describes how quickly a material under transient heat conduction converges to steady state heat transfer.

As used herein, an electromagnetic field, also called an electro-magnetic field, is a classical field produced by accelerating electric charges. It is the field described by classical electrodynamics and is the classical counterpart to the quantized electromagnetic field tensor in quantum electrodynamics. The electromagnetic field propagates at the speed of light (this field is light) and interacts with charges and currents. The field can be viewed as the combination of an electric field and a magnetic field. The electric field is produced by stationary charges, and the magnetic field by moving charges (currents); these two are often described as the sources of the field.

As used herein, electromagnetic radiation (or radiation, without an added adjective that further modifies radiation, as hereinbefore defined) consists of waves of the electromagnetic field, propagating through space, carrying electromagnetic radiant energy. Electromagnetic radiation is used interchangeably with electromagnetic field.

As used herein, an optically transmissive enclosure is a barrier that separates out a space within it, said barrier being capable of being transmissive to optical radiation.

As used herein, optical radiation comprises the infrared radiation, the light perceived by a human to be visible, and ultraviolet radiation.

As used herein, optical radiation is part of the electromagnetic spectrum with a wavelength range from 100 nm to 1 mm.

As used herein, luminescence is defined as generating secondary radiation (often fluorescence) after an electronic transition to a higher quantum (discrete) electronic state populated because of absorption of incident primary radiation.

As used herein, thermal radiation is defined as originating from a heat source so as to dissipate heat from that source recognizing that the transitions are between vibrational or rotational quantum (discrete) levels as opposed to quantum (discrete) electronic levels.

As used herein, a cavity radiator is a black body radiator.

As used herein, standard molar entropy. Is the entropy of 1 mol of substance at the standard pressure of 1 atm (101.3 kPa) and given temperature. Values of the standard molar entropies of various substances at 298 K (25° C.) are given in the Table 8.

As used herein, light that is visible to humans is comprised of electromagnetic radiation with a primary range between 380 nm and 750 nm. Visible to humans are pure spectral colors made by a smaller wavelength range within that primary range and colors such as pink and magenta that are made by distinct combination of wavelengths that are non-contiguous.

As used herein, blue radiation or blue light is a color perceived to be blue by humans but is broader in spectral wavelength than is traditionally assigned. The traditional assignment of blue monochromatic light is radiation with a maximum between 450 and 480 nm. As used herein, the blue monochromatic light, or blue light, or blue radiation is a set of electro-magnetic waves with a maximum between 380 and 500 nm.

As used herein, blue light emitting diodes and blue light emitting diode dies are semiconductors comprising a p-n junction when powered emit radiation perceived to be blue by humans including blue colors that are considered be shades or hues of blue, including, but not limited to, cyan, indigo, and purple.

As used herein, YAG means yttrium aluminium garnet, with a chemical composition of $Y_3Al_5O_{12}$. The garnet may be doped with trivalent ions such as Cerium ($Ce^{3+}$).

As used herein, the thermodynamic definition of adiabatic is a type of thermodynamic process that occurs without transferring heat or mass between the thermodynamic system and its environment. Unlike an isothermal process, an adiabatic process transfers energy to the surroundings only as work. See Th. Förster's "Primary photophysical processes" for description/definition of excited state adiabatic and diabatic processes. [Förster, Th. "Primary photophysical processes" Pure and Applied Chemistry, vol. 34, no. 2, 1973, pp. 225-234. https://doi. org/10.1351/pac197334020225]

As used herein, the expression "comprising an outer optically transmissive enclosure in which the microelectronic device sits" means an enclosure which, among more than one other enclosure, contains a microelectronic device, itself comprising an enclosure, such that a microelectronic device, as herein defined, sits within the outer optically-transmissive enclosure.

BEST MODE FOR CARRYING OUT THE INVENTION

While there are many different types of light-emitting diodes, the best source of primary radiation in the instant invention is a light-emitting diode preferably comprising SiC or GaN.

The present invention is based on the discovery that a highly efficient light emitting device may be simply and economically fabricated with a unique and novel construction and utilizing a first solid state light emitting diode for generating a shorter wavelength primary radiation which is transmitted to, and incident upon, a luminophore (fluorescent and/or phosphorescent material) for Down-Conversion by the luminophore, of the radiation from the first solid state light emitting device, to scatter primary radiation and to separately yield secondary radiation with a chemical potential less than that which is normally available absent the unique and novel construction. The chemical potential of the secondary radiation is reduced by incorporating into the unique and novel construction a second solid state light emitting diode for generating infrared radiation that is incident on the same luminophore exposed to primary radiation such that the Down-Converted luminescence has thermal radiation characteristics.

The general schema of an ANSL is to incorporate the following elements:

The primary radiation source is preferably light-emitting diode that is best described as emitting primary radiation that appears to a human observer as being blue, but which could also emit light that is perceived to be violet or ultraviolet, but which is higher in emission energy than the secondary radiation source.

The secondary radiation source absorbs the primary radiation from the primary radiation source and emits radiation, that is comprised of both luminescence and thermal radiation, and which is called secondary radiation.

The tertiary radiation source is from the p-n junction of a diode and is one that emits radiation that is not perceived by a human observer as being visible, absent a thermal imaging device (e.g., night-vision goggles), and whose radiation is incident upon the secondary radiation source.

The quaternary radiation source is one from a heated source and is one that emits radiation that is not perceived by a human observer as being visible, absent a thermal imaging device (e.g., night-vision goggles), and whose radiation is incident upon the secondary radiation source The primary radiation and the tertiary radiation both of which are incident upon and absorbed and or scattered by the secondary radiation source however in the case of the tertiary radiation is principally absorbed by the source of secondary radiation.

The primary radiation and the quaternary radiation both of which are incident upon and absorbed and or scattered by the secondary radiation source however in the case of the quaternary radiation is principally absorbed by the source of secondary radiation.

The source of secondary radiation normally generates fluorescence including that from triplet: triplet annihilation Preferably, the radiative lifetime of the secondary radiation source is less than 250 nanoseconds if the primary radiation is incoherent, and less than 100 nanoseconds if coherent and less than 25 nanoseconds if fully optically active.

Preferably, if the source of primary radiation is a semiconductor laser, the radiative lifetime of the secondary radiation source is less than 10 nanoseconds.

Preferably, if the primary radiation is one that is emitted in the presence of a magnetic field, the radiative lifetime of the secondary radiation source is less than 70 nanoseconds.

Preferably, the source of secondary radiation is within an environment with a Molar Heat Capacity between 10.0 and 22.5 J $mol^{-1}$ $K^{-1}$.

Preferably, the source of primary radiation and or the source of secondary radiation is within an environment with S° (Standard molar entropy) of between 100 and 200 but even more preferably between 120-175 J $mol^{-1}$ $K^{-1}$.

By way of example, referring to FIG. 1 to illustrate the structure of the instant invention, a light-emitting device (101) is constructed for emitting visible light that is perceived to be achromatic and is visible to a human observer comprising a first light-emitting diode element (102) and a second light-emitting diode element (103) which have mutually different emission wavelengths and where the second element (103) emits the majority of its light not separately visible to a human observer and is bathochromic to the first element (102). The at least two light emitting diode elements (102) and (103) emit light that is incident upon a luminescent material (104) by which radiation at a wavelength bathochromic to the radiation emitted by the first light emitting diode element (102) is produced by the luminescent material (104). In the instant invention, there is no requirement that for each first light emitting diode element (102) that there be an equal amount of a second light emitting diode element (103), but there must be at least one second light emitting diode element (103) within each light-emitting device (101). In one preferred embodiment, the second light-emitting diode element (103) emits infrared radiation at a wavelength that is spectroscopically absorbed by the luminescent material (104) and is at least partially transmitted through the intervening space between the second light-emitting diode element (103) and the luminescent material (104). If not spectroscopically absorbed, the luminescent material (104) at the very least must absorb the thermal radiation with an absorptivity as close to as a blackbody may be able to so do.

In another preferred embodiment, the intervening space is fully transparent to the radiation emitted by the second light-emitting diode element (103), but it may be only partially transparent in other embodiments of the instant invention. In another preferred embodiment, the intervening space between the luminescent material (104) and neither, either or both of the light-emitting diode elements (102 and 103) is in an enclosure filled with a non-cooling gas, including a gas comprised of single atoms or diatomic molecules that do not fully absorb the spectroscopic infrared emission of the second light-emitting diode, using as a guide the publication "Infrared spectra of noble gases (12,000 to 19,000 Angstrom)" as disclosed by Mr. Humphreys and Mr. Kostkowski the United States National Bureau of Standards in the Journal of Research of the National Bureau of Standards. (Humphreys & Kostkowski, 2012) The gas may be a mixture of gases and each and any component may have a thermal effusivity and a thermal diffusivity of no less than and no more than one and twenty-five $Ws^{1/2}/m^2K$ or $J/s^{1/2} m^2K$, and five and one-hundred seventy $mm^2$ per s, respectively. In another embodiment, the gas has these effusivity and diffusivity parameters as measured at 300 K. In another embodiment, the gas is a mixture of no less than 98% Helium and no more than 2% hydrogen and where the mixture of the gases is not uniform within the enclosure, when at least one of the light-emitting diodes is operating and delivering a mixture of radiation. Deuterium gas may replace hydrogen gas, fully or partially, wherever hydrogen gas is used.

In another preferred embodiment, the luminescent material (104) is encapsulated in an envelope or a chamber with a gas, factually not to cool, such as krypton or xenon, but otherwise to protect the luminescent material (104). Reference number (105) is an insulative board having a generally rectangular shape and made of epoxy resin and sometimes including silica or alumina or zeolites, with a pair of connecting electrodes (106a) and (106b) for the infrared light-emitting diode element (103) and a pair of connecting electrodes (107a) and (107b) for the blue light-emitting diode element (103). The connecting electrodes (106a) and (106b) for the infrared LED element and (107a) and (107b) for the blue LED element are patterned on an upper surface of the insulative board (105) and extended to inner surfaces of through-holes (112). A chamber (118) contains a space which comprises either a vacuum region or a gaseous region and which comprises (102) and (103) as previously described.

For the infrared light-emitting diode element (103), the electrical connections to provide power to the diode is through the electrodes (106a), and through (106b) via a wire (111). For the blue light emitting diode element (102), the electrical connections are though the electrodes (107b), and (107a) through the wire (8). The entire device is encapsulated through a transparent or translucent resin polymerized to be a polymeric or encapsulating matrix beginning (109) with a full-body (thickness) shown (199) and supported via a frame (110). The infrared light-emitting diode element (103) may be operated in pulse mode or continuous mode, depending on the reliability of the diode element and the energy that must be expended to power the infrared emitting diode element (103). The part numbers of various infra-red emitting diodes available commercially or in development is presented in Table 9 and referred to as "Infrared Light Sources".

The EVERLIGHT'S Infrared Emitting Diode (IR333-A) can be used as a low-cost infra-red light-emitting diode element (103), the forward voltage is no greater than 4 volts, and the radiant intensity per infra-red light-emitting diode is no more than 750 mW per steradian. In the alternative to semiconductor diodes, one can use semiconductor thermal emitters such as those based on photonic crystals. (O'Regan, Wang, & Krauss, 2015)

In another preferred embodiment, a thermal radiation source, also called a thermal source, is comprised of a grating on SiC.

Among other exemplary embodiments, a Down-Converting material (108), in this embodiment comprises a yellow luminophore $Ce^{3+}$—$Nd^{3+}$co-doped $Y_3Al_5O_{12}$ (YAG) nanoparticles, with an average size of 20-30 nm clusters aggregated by 8-10 nm YAG nanoparticles and synthesized by a solvo-thermal method as described elsewhere. (Wang, et al., 2015) When excited by blue primary radiation, strong and broad yellow luminescence (centred at 526 nm) from $Ce^{3+}$ as well as non-visible near-infrared (NIR) luminescence (890, 1066 and 1335 nm) of $Nd^{3+}$ is observed simultaneously. The NIR luminescence occurs via an effective dipole—dipole energy transfer from $Ce^{3+}$ to $Nd^{3+}$. By decreasing the $Nd^{3+}$ concentration to zero, the NIR luminescence is eliminated and the luminophore only demonstrates secondary radiation that absent mixing with the primary radiation appears to a human observer to be yellow. In this embodiment, the matter that interacts with the primary radiation can be one that includes $Nd^{3+}$ or is absent $Nd^{3+}$ but always contains $Ce^{3+}$ and the entropy of the secondary radiation is impacted by the entropy of the incident primary radiation.

The operating scheme is as follows: 1) the primary radiation from the blue LED excites the $Ce^{3+}$—$Nd^{3+}$phosphor which then emits secondary radiation in the yellow, which when combined with the scattered blue radiation, yields achromatic radiation; 2) the infra-red emission of the $Nd^{3+}$ sites provide no benefit absent the powering of a mid-infrared; 3) with powering of the mid-infrared, the $Nd^{3+}$ sites are heated and the emission at 890 nm is endothermically increased due to the local heating to provide red emission at energy greater than 780 nm; 4) the combination of primary radiation, secondary radiation and the endothermic photoluminescence of the $Nd^{3+}$ sites powering mid-infrared, provide achromatic radiation of increased yields and better colour temperature. The radiative lifetime of the phosphor is 23 nanoseconds at 0.5% $Nd^{3+}$ loading level versus 32 nanoseconds with zero $Nd^{3+}$.

Both gallium nitride and silicon carbide LEDs are appropriate for generating light at appropriate wavelengths and of sufficiently high energy and spectral overlap with absorption curves of the Down-Converting medium. The LED preferably is selected to emit most efficiently in regions where luminescent dyes may be usefully employed to absorb wavelengths compatible with readily commercially available fluorophores and/or phosphors for Down-Conversion to white light.

Further elaboration of the parts shown in the exemplary embodiment FIG. 1 is:

"101"—a light-emitting device

"102"—a first light-emitting diode element

"103"—a second light-emitting diode element

"104"—a luminescent material (usually one that Down-Converts via a Stokes shift but can also be one that does not emit bathochromic to where it absorbs)

"105"—an insulative board having a generally rectangular shape and made of epoxy resin and sometimes including silica or alumina or zeolites "106a" and "106b"—electrodes for infrared light-emitting diode "107a" and "107b"—electrodes for blue light-emitting diode "108"—a Down-Converting material; i.e., a luminescent material that has a Stokes shift "109"—boundary and the beginning of a polymeric or encapsulating matrix that surrounds the device "110"—a supporting frame "111"—a wire providing electricidal current to an infrared light-emitting diode element "112"—a. through-hole through which electrodes are extended to reach into the inside of the device "113"—a wire providing electrical current to a blue light-emitting diode element "118"—a chamber showing a space within it that contains "102" and "103"

"199"—revealing a full-body thickness

In FIG. 2, an illumination/vacuum or gas luminescent element "201" is shown with a cylindrical cavity with a radius "r" or diameter "d" and the length, L, is as shown. The cylindrical cavity is closed on both ends with a flat face such that the interior of the cavity can retain a gas or a mixture of gases. On one face of the cavity is located proximate thereto a thermal radiation source and or light-emitting diode sources that may comprise GaN or SiC, which when powered generate light, especially radiation hypsochromic, fully or partially, to the secondary radiation, and heat including thermal radiation. The source of primary radiation may be a light-emitting diode, or a light-emitting diode laser. The devices may emit coherent radiation or radiation principally one polarization or a majority of one polarization and a minority of the other polarization in terms of handedness. These sources are shown as "210" in FIG. 2. The opposing face of the closed cylindrical cavity is coated with phosphors "220", either internal and in intimate contact with the enclosed gas or mixture of gas, or external to the face. The length of the cylinder is coated with scattering film (230), either internal and in intimate contact with the enclosed gas or mixture of gas, or external to the long walls of the cylinder and in intimate contact with a polymeric or encapsulating matrix (240) whose thickness is shown as (299) but may have any dimensions. In the alternative, (230) may be a graphene coated covering with absorptivity of nearly 0.99. The internal space of the cylindrical cavity is enclosed with gas or a mixture of gas; in the latter case, the mixture does not have a uniform ratio as one gas will preferentially migrate to the colder face and the other to the hotter face. In the case of Helium and isotopes of Hydrogen mixtures, the Helium will separate to the colder surface and isotopes of hydrogen to the hotter surface as described in "The diffusion and thermal diffusion of hydrogen deuterium, with a note on the thermal diffusion of hydrogen-helium", by H. R. Heath, T. L. Ibbs and N. E. Wild. (Heath, Ibbs, & Wild, 1941) Each cylinder has a length, L, and a radium r. The diameter of the cylinder is d.

In this way, the gas will act as a medium to transport unwanted heat from thermal source and light-emitting diode source to the phosphor itself. The phosphor may be kept in an environment whereby heat is transferred to the phosphor to keep it in a hotter environment when the thermal sources and light-emitting diode sources are operated with an electrical current, as opposed to an open circuit. The higher the thermal diffusivity, the faster the phosphor is heated when heat, from the thermal source or light-emitting diode source, is transferred. The higher the thermal effusivity, the longer the distance "length" may be and still engage effective transfer to heat the phosphor. The cylinders may be mounted vertically above the light emitting diode device (101) such that the cylindrical face covers in a planar fashion the entire source or sources (210) and the cylindrical face with the phosphor lies in a planar manner with the secondary radiation, the scattered radiation and any remaining infra-red radiation as emitted from the face as if the face was a point source.

Further elaboration of the parts shown in the exemplary embodiment FIG. 2 is:

"201"—illumination/vacuum or gas luminescent element comprising a chamber that is surrounded by a polymeric or encapsulating matrix "210"—a thermal radiation source or a light-emitting diode source or a light-emitting diode laser source "220"—a phosphor coating "230"—a scattering film or a graphene film "240"—a polymeric or encapsulating matrix "299"—a thickness of the polymeric or encapsulating matrix surrounding chamber FIG. 3-11 do not require additional detailing as they are tables of specific information already discussed within the context of the Specification of the instant invention.

FIG. 9 summarizes the Standard molar entropies of gases relevant to their use in the instant invention. For monoatomic gases, the standard molar entropy can be calculated using the Sackur-Tetrode Equation which itself is dependent on the de Broglie wavelength for the particle of an Argon gas. As used herein, the de Broglie wavelength for Argon gas is 16 picometers and the calculated standard molar entropy for Argon is:

$$S = R\ln\frac{(T)\left(e^{\frac{5}{2}}\right)(k_B)}{(P^0)(\Lambda^3)} = 8314\frac{J}{\text{mol}\cdot\text{K}}\ln\left\{\frac{(298\,\text{K})\left(e^{\frac{5}{2}}\right)(1.38\times 10^{-23})}{\left(10^{-5}\frac{N}{m^2}\right)(16\times 10^{-12}m)^3}\right\} =$$

$$\frac{8.314 J}{\text{mol}\cdot\text{K}}\ln(1.21\times 10^8) = 154.73\frac{J}{\text{mol}\cdot\text{K}}$$

As used herein, according to wave-particle duality, a De Broglie wavelength is a wavelength manifested in all the objects in quantum mechanics which determines the probability density of finding the object at a given point of the configuration space. The de Broglie wavelength of a particle is inversely proportional to its momentum.

As used herein, a thermal de Broglie wavelength is the average de Broglie wavelength of particles in an ideal gas at the specified temperature.

INDUSTRIAL APPLICABILITY

The applicability of the vacuum microelectronic device with a light emitting diode and a thermal radiation source is for the overall improvement of General Illumination, for indoor and outdoor applications, enhancing brightness, to the extent allowed by the conservation of energy law, despite the molecular energy lost due to the ubiquitous Stokes shift employed in Down-Conversion. The entropy generated by increasing the brightness of the achromatic radiation so obtained is offset by the reduction of entropy resulting from not as much tertiary or quaternary radiation being emitted to the external surroundings. The increase in brightness of useful radiation powered by adding thermal radiation from a spectral specific source is a consequence of the vibrational modes of the matter so excited producing additional useful work as opposed to fast radiationless decay (i.e.; anti-Kasha rule). Alternative techniques different than the instant invention—photon recycling in solar cells and hot carrier recombination in solar cells—indicate that work can be produced by absorption of radiation and not just heat and emission.

The invention claimed is:

1. A microelectronic device that comprises:
a solid-state light-emitting device coupled with a solid-state thermal radiation source,
   wherein at least one single-die semiconductor light-emitting diode with a p-n junction is under a vacuum or exposed to a gaseous environment;
   wherein the at least one single-die semiconductor light-emitting diode includes a first light-emitting diode element and a second light-emitting diode element, which emit different frequencies of radiation when powered by an electrical current;
   wherein the first light-emitting diode element has a spectral frequency maximum in the visible region;
   wherein the first light-emitting diode element is configured to emit a primary radiation which is the same for the at least one single-die LED present in the device, said primary radiation being a relatively shorter wavelength radiation;
a luminescent medium;
the solid-state thermal radiation source emits tertiary radiation;
the solid-state thermal radiation source has a spectral entropic maximum in an infrared region;
   comprising a collection or concentration luminophoric medium arranged in receiving relationship to said primary radiation and tertiary radiation, wherein the luminophoric medium responsively emits a secondary, relatively longer wavelength polychromatic radiation when the luminophoric medium is exposed to the primary radiation and tertiary radiation,
   wherein separate wavelengths of said polychromatic radiation mix with primary radiation to produce an achromatic light output emanating from a polymeric or encapsulating matrix that forms an outer shape of the coupled device; and
   comprising a gaseous region that comprises a plurality of gases,
   whereas the at least one chamber is distinct and different from the polymeric or encapsulating matrix.

2. The device of claim 1, wherein a gas of the gaseous region has a Molar heat capacity of no less than 20.0 and no more than 30.0 J mol-1 K-1.

3. A microelectronic device that comprises:
a first light-emitting element that is a light-emitting diode and a source of primary radiation, said primary radiation having a peak wavelength that is visible to humans;
comprising a SiC, GaN, InGaN, AlGaN, or AlInGaN semiconductor, or a semiconductor comprising Si, C, Ga, N, In or Al configured to emit a primary radiation which is the same for the at least one single-die light-emitting diode present in said device, said primary radiation being a relatively shorter wavelength radiation,
a second light-emitting element that is a thermal radiation source that emits quaternary radiation having a maximal emission peak wavelength in an infrared region that is not visible to humans;
a luminescent medium;
at least one light-transmissive chamber having a vacuum region or a gaseous region;
   wherein said primary radiation and said quaternary radiation are transmitted to and incident upon the luminescent material,
   wherein the first light-emitting element, the second light-emitting element, and the luminescent material are under a vacuum or exposed to a gaseous environment;
comprising a collection or concentration luminophoric medium arranged in receiving relationship to said primary radiation and quaternary radiation,
   wherein said luminophoric medium responsively emits a secondary, relatively longer wavelength polychromatic radiation when the luminophoric medium is exposed to said primary radiation and said quaternary radiation,
   wherein separate wavelengths of said polychromatic radiation and primary radiation mix to produce an achromatic light output; and
comprising a gaseous region that comprises hydrogen or deuterium gas or helium or argon, or any combination thereof,
   wherein the at least one chamber is distinct and different from a polymeric or encapsulating matrix that forms an outer shape of the microelectronic device;
   wherein the achromatic light is observed at the exterior surface of the polymeric or encapsulating matrix.

4. The device of claim 3, wherein a gas of the gaseous region has a Molar heat capacity of no less than 20.0 and no more than 30.0 J mol-1 K-1.

5. The device of claim 1, wherein a gas of the gaseous region has a Standard Molar Entropy of between 100 and 200 $J \cdot mol^{-1} K^{-1}$.

6. The device of claim 3, wherein a gas of the gaseous region has a Standard Molar Entropy of between 100 and 200 $J \cdot mol^{-1} K^{-1}$.

7. The device of claim 1, wherein the primary radiation is generated in the presence of a magnetic field.

8. The device of claim 1 wherein said infrared region is one of the mid-infrared, Short-wave IR Type, Long-wave IR Type, or VLWIR Type.

9. The device of claim 3 wherein said infrared region is one of the mid-infrared, Short-wave IR Type, Long wave IR Type, or VLWIR Type.

10. The device of claim 1 wherein said secondary radiation includes radiation in the infrared wherein the radiative lifetime of the source of secondary radiation is between 23 and 32 nanoseconds.

11. The device of claim 3 wherein said secondary radiation includes radiation in the infrared wherein the radiative lifetime of the source of secondary radiation is between 23 and 32 nanoseconds.

12. A microelectronic device comprising:
a solid-state light-emitting diode device coupled with a solid-state thermal radiation source,
   wherein at least one single-die semiconductor light-emitting diode with a p-n junction is under a vacuum or exposed to a gaseous environment,
comprising a luminescent element in a separate second enclosure and within said second enclosure an environment that protects the luminescent element,
   wherein said environment comprises a vacuum or a partial vacuum substantially devoid of oxygen;
   wherein the second enclosure is at least one of permanence or replaceable;
   wherein the at least one single-die semiconductor light-emitting diode includes a first light-emitting diode element and a second light-emitting diode element which emit radiation at different frequencies;

wherein the second light-emitting diode element has a spectral entropic maximum in the infrared, comprising a SiC, GaN, InGaN, AlGaN, or AlInGaN semiconductor, or a semiconductor comprising Si, C, Ga, N, In or Al configured to emit a primary radiation which is the same for the at least one single-die LED present in the device, said primary radiation being a relatively shorter wavelength radiation;

comprising a collection or concentration luminophoric medium arranged in receiving relationship to said primary radiation and tertiary radiation, wherein the luminophoric medium responsively emits a secondary, relatively longer wavelength polychromatic radiation when the luminophoric medium is excited via exposure to the primary radiation and tertiary radiation, wherein separate wavelengths of said polychromatic radiation mix to produce an achromatic light output; and comprising a gaseous region that comprises a mixture of no less than 98% helium and no more than 2% deuterium or hydrogen, whereas the at least one chamber is distinct and different from a polymeric or encapsulating matrix that forms an outer shape of the microelectronic device.

13. The device of claim 12 wherein a gas of the gaseous region has a Molar heat capacity of no less than 20.0 and no more than 30.0 J mol$^{-1}$ K$^{-1}$.

14. The device of claim 13, wherein a gas of the gaseous region has a Standard Molar Entropy of between 100 and 200 J·mol$^{-1}$K$^{-1}$.

15. The device of claim 13, wherein a gas of the gaseous region has a Thermal Effusivity of between 1 and 15 W (S/m$^2$)$^{1/2}$ per K.

16. The device of claim 12, wherein a gas of the gaseous region has a Thermal Diffusivity of between 100 and 165 mm2 per s when measured at 300 K.

17. The device of claim 16, comprising an outer optically transmissive enclosure in which the microelectronic device sits.

18. The device of claim 5, comprising an outer optically transmissive enclosure in which the microelectronic device sits.

19. The device of claim 9, comprising an outer optically transmissive enclosure in which the microelectronic device sits.

20. The device of claim 19, wherein an outer optically transmissive enclosure is devoid of any appearance of color.

* * * * *